US011239204B2

US 11,239,204 B2

(12) United States Patent
Wu et al.

(10) Patent No.: US 11,239,204 B2
(45) Date of Patent: *Feb. 1, 2022

(54) BONDED ASSEMBLY CONTAINING LATERALLY BONDED BONDING PADS AND METHODS OF FORMING THE SAME

(71) Applicant: SANDISK TECHNOLOGIES LLC, Addison, TX (US)

(72) Inventors: Chen Wu, Flemish Brabant (BE); Peter Rabkin, Cupertino, CA (US); Yangyin Chen, Flemish Brabant (BE); Masaaki Higashitani, Cupertino (CA)

(73) Assignee: SANDISK TECHNOLOGIES LLC, Addison, TX (US)

( * ) Notice: Subject to any disclaimer, the term of this patent is extended or adjusted under 35 U.S.C. 154(b) by 141 days.

This patent is subject to a terminal disclaimer.

(21) Appl. No.: 16/694,400

(22) Filed: Nov. 25, 2019

(65) Prior Publication Data
US 2021/0159215 A1   May 27, 2021

(51) Int. Cl.
| | | |
|---|---|---|
| *H01L 25/065* | (2006.01) | |
| *H01L 25/18* | (2006.01) | |
| *H01L 23/00* | (2006.01) | |
| *H01L 25/00* | (2006.01) | |

(52) U.S. Cl.
CPC .......... *H01L 25/0657* (2013.01); *H01L 24/08* (2013.01); *H01L 24/80* (2013.01); *H01L 25/18* (2013.01); *H01L 25/50* (2013.01); *H01L 2224/08148* (2013.01); *H01L 2224/80895* (2013.01); *H01L 2224/80896* (2013.01); *H01L 2225/06524* (2013.01); *H01L 2924/1426* (2013.01); *H01L 2924/1434* (2013.01)

(58) Field of Classification Search
CPC ......... H01L 25/0657; H01L 2924/1434; H01L 24/08; H01L 2224/08148; H01L 25/043; H01L 25/074; H01L 25/0756; H01L 25/117; H01L 2225/06503–06596; H01L 24/80; H01L 2224/80895; H01L 25/18; H01L 2225/06524; H01L 25/50; H01L 2224/80896; H01L 2924/1426
See application file for complete search history.

(56) References Cited

U.S. PATENT DOCUMENTS

| | | | |
|---|---|---|---|
| 10,049,915 B2 * | 8/2018 | Fong | ........................ H01L 25/50 |
| 10,115,681 B1 | 10/2018 | Ariyoshi | |
| 10,283,493 B1 | 5/2019 | Nishida | |
| 10,304,810 B2 | 5/2019 | Gardner et al. | |

(Continued)

FOREIGN PATENT DOCUMENTS

KR   10-2016-0040852 A   4/2016

OTHER PUBLICATIONS

Notification of Transmillal of the International Search Report and Written Opinion of the International Search Authority for International Patent Application No. PCT/US2020/023254, dated Aug. 21, 2020, 10 pages.

(Continued)

*Primary Examiner* — Thanh Y. Tran
(74) *Attorney, Agent, or Firm* — The Marbury Law Group PLLC

(57) ABSTRACT

A bonded assembly includes a first die containing first bonding pads having sidewalls that are laterally bonded to sidewalls of second bonding pads of a second die.

20 Claims, 43 Drawing Sheets

(56) References Cited

U.S. PATENT DOCUMENTS

| | | | |
|---|---|---|---|
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 2009/0224371 | A1 | 9/2009 | Yu et al. |
| 2012/0241216 | A1 | 9/2012 | Coppeta et al. |
| 2013/0020704 | A1 | 1/2013 | Sadaka |
| 2016/0093591 | A1* | 3/2016 | Lan .................. H01L 21/6835 257/506 |
| 2016/0211248 | A1* | 7/2016 | Yaung ............... H01L 23/5226 |
| 2018/0277517 | A1* | 9/2018 | Kim ..................... H01L 43/08 |
| 2019/0221557 | A1 | 7/2019 | Kim et al. |
| 2019/0252361 | A1 | 8/2019 | Nishida |
| 2019/0371780 | A1* | 12/2019 | Yaung ................ H01L 23/585 |
| 2020/0266146 | A1* | 8/2020 | Nishida ........... H01L 27/11573 |
| 2020/0286905 | A1* | 9/2020 | Kai .................... H01L 25/0657 |
| 2021/0159216 | A1* | 5/2021 | Wu .................. H01L 21/76898 |

OTHER PUBLICATIONS

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,438, filed Nov. 25, 2019, SanDisk Technologies LLC.

* cited by examiner

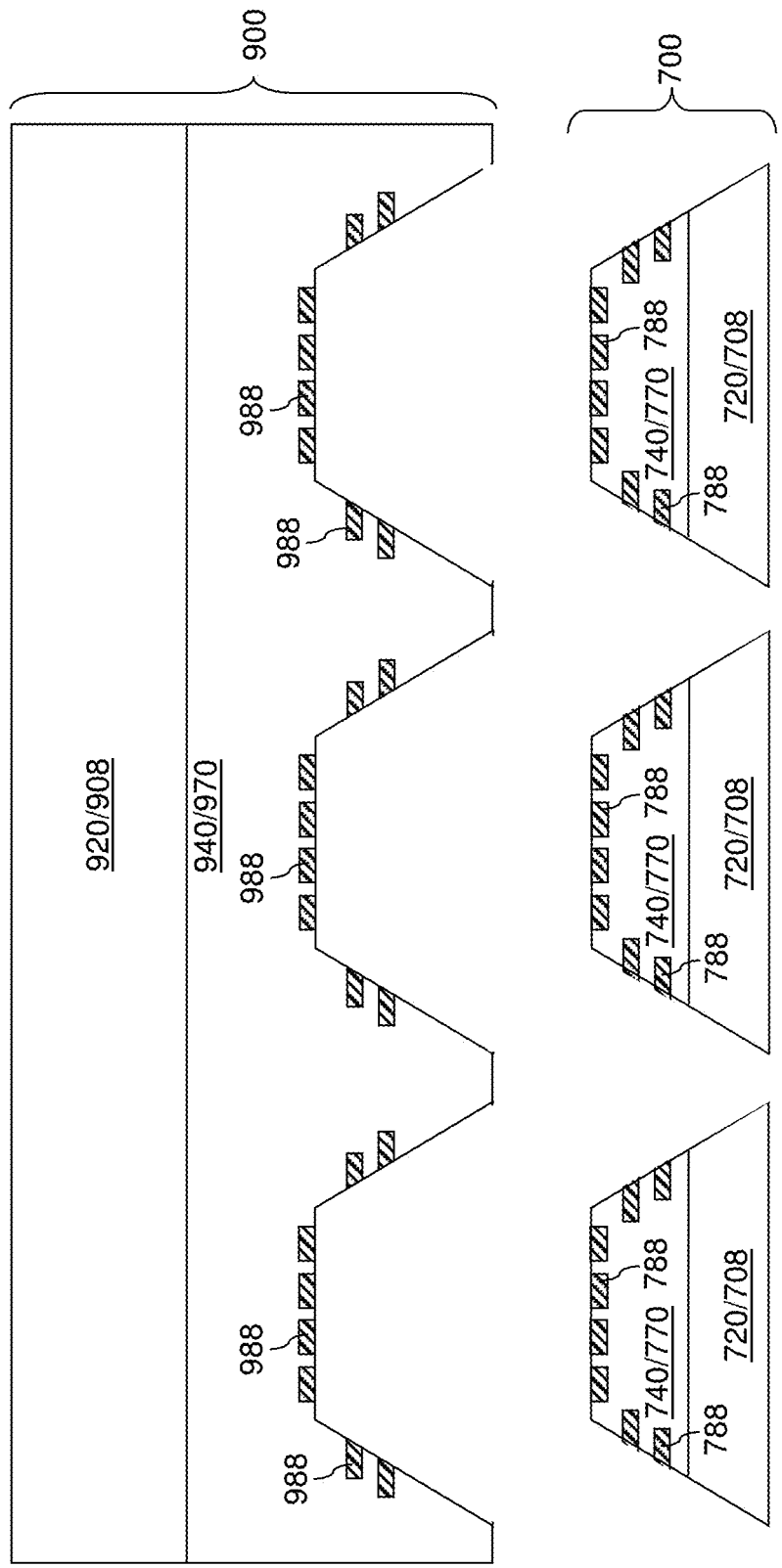

BONDED ASSEMBLY CONTAINING LATERALLY BONDED BONDING PADS AND METHODS OF FORMING THE SAME

FIELD

The present disclosure relates generally to the field of semiconductor devices, and particularly to a bonded assembly containing laterally bonded bonding pads and methods for forming the same.

BACKGROUND

Wafer bonding or die bonding can be employed to provide a bonded assembly of multiple semiconductor dies. For example, two semiconductor dies providing different functionalities can be bonded to provide a semiconductor chip having combined functionalities. Metal wiring inside each semiconductor die provides metal interconnection between components within a respective semiconductor die.

SUMMARY

According to an embodiment of the present disclosure, a bonded assembly comprises a first semiconductor die comprising first semiconductor devices and first bonding pads having a top surface facing away from the first semiconductor devices, a bottom surface facing the first semiconductor devices and at least one sidewall between the top surface and the bottom surface, and a second semiconductor die comprising second semiconductor devices and second bonding pads having a top surface facing away from the second semiconductor devices, a bottom surface facing the second semiconductor devices and at least one sidewall between the top surface and the bottom surface. The sidewalls of the second bonding pads are bonded to the respective sidewalls of the first bonding pads.

According to another embodiment of the present disclosure, a method of forming a bonded assembly comprises providing a first semiconductor die comprising first semiconductor devices and first bonding pads having a top surface facing away from the first semiconductor devices, a bottom surface facing the first semiconductor devices and at least one exposed sidewall between the top surface and the bottom surface, a second semiconductor die comprising second semiconductor devices and second bonding pads having a top surface facing away from the second semiconductor devices, a bottom surface facing the second semiconductor devices and at least one exposed sidewall between the top surface and the bottom surface, and bonding the exposed sidewalls of the second bonding pads to the respective exposed sidewalls of the first bonding pads.

BRIEF DESCRIPTION OF THE DRAWINGS

FIGS. 11A and 11B are sequential schematic vertical cross-sectional view of a fifth exemplary structure during formation of a bonded assembly according to a fifth embodiment of the present disclosure.

DETAILED DESCRIPTION

Figure 1A:
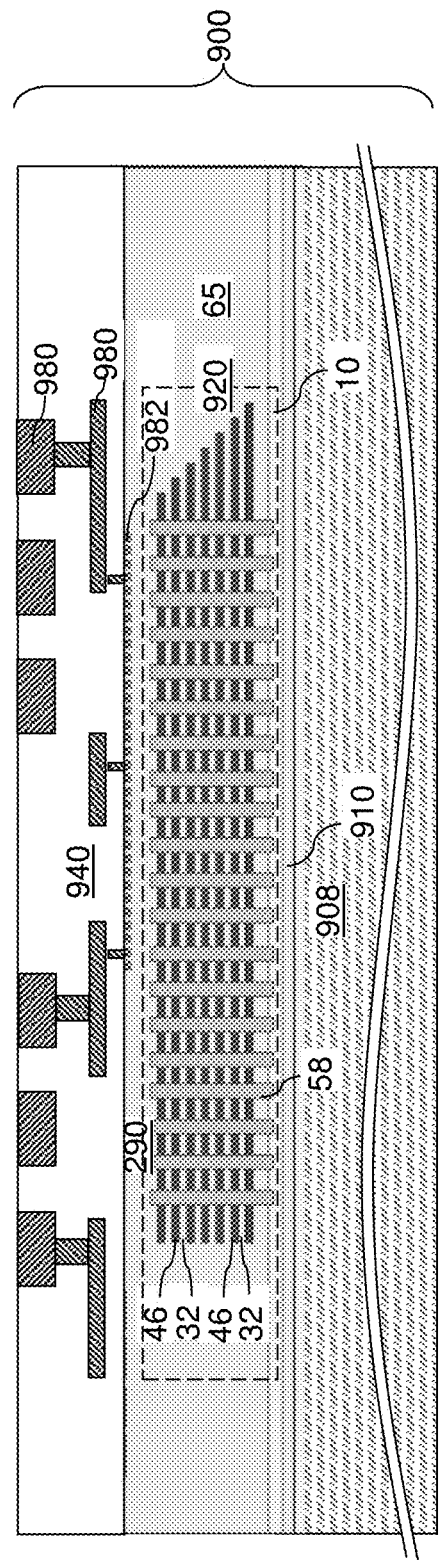
FIGS. 1A-1I are sequential schematic vertical cross-sectional views of a first semiconductor die prior to bonding according to a first embodiment of the present disclosure.

Bonding pads that are bonded to each other using their top surfaces provide only vertical connections between two semiconductor dies with horizontal bonding interfaces that are parallel to a gap between the two semiconductor dies. This limits the number of bonding locations that may be provided between the two dies. As discussed above, the embodiments of the present disclosure are directed to a bonded assembly containing lateral bonding between bonding pads and methods for forming the same, the various aspects of which are described herein in detail. The lateral bonding increases the number and density of bonding locations between bonded dies.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process"

structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Referring to FIG. 1A, a first semiconductor die 900 according to a first embodiment of the present disclosure is illustrated. The first semiconductor die 900 includes a first substrate 908, first semiconductor devices 920 overlying the first substrate 908, first dielectric material layers (290, 940) overlying the first semiconductor devices 920, and first metal interconnect structures 980 embedded in the first dielectric material layers (290, 940). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

The first dielectric material layers (290, 940) may include first contact-level dielectric layers 290 embedding contact via structures and bit lines 982, and first interconnect-level dielectric layers 940 that embed a subset of the first metal interconnect structures 980 located above the first contact-level dielectric layers 290. The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980, may be embedded in the first interconnect-level dielectric layers 940. The first metal interconnect structures 980 may be located within the first interconnect-level dielectric layers 940. Each of the first contact-level dielectric layers 290 and the first interconnect-level dielectric layers 940 may include a dielectric material such as undoped silicate glass, a doped silicate glass, organosilicate glass, silicon nitride, a dielectric metal oxide, or a combination thereof.

Figure 1B:
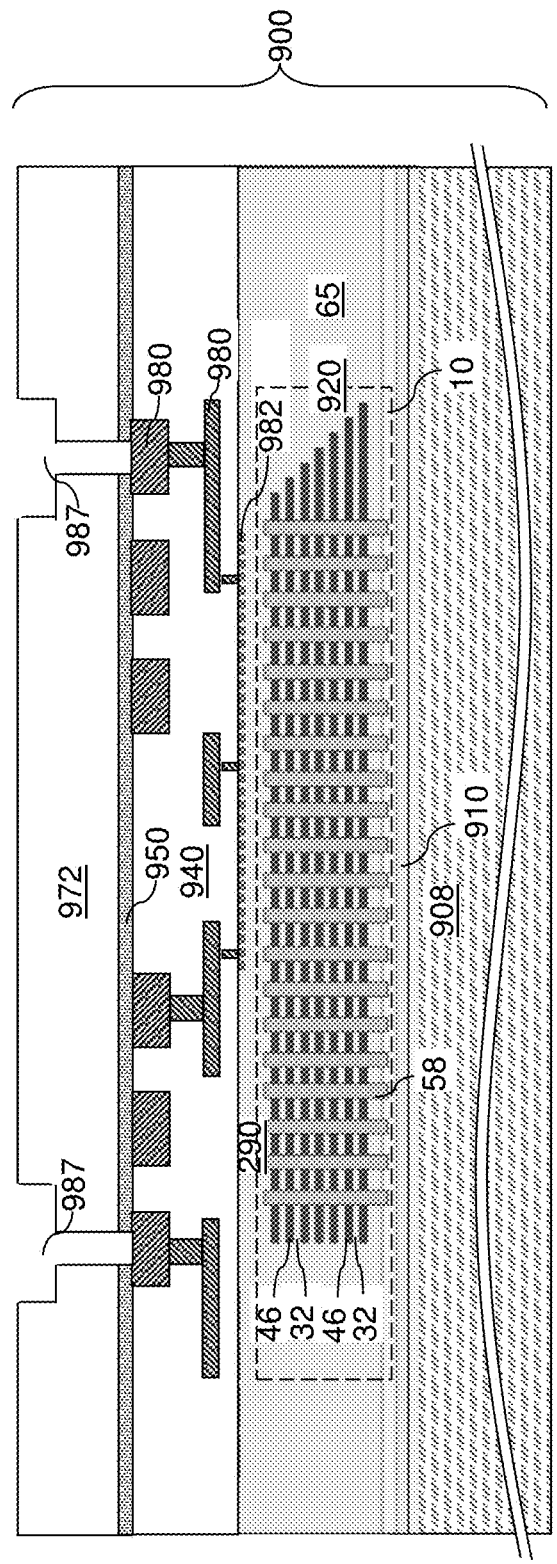

Referring to FIG. 1B, an optional first passivation dielectric layer 950 can be formed over the first interconnect-level dielectric layers 940. The first passivation dielectric layer 950 can include a dielectric diffusion barrier material such as silicon nitride. The thickness of the first passivation dielectric layer 950 can be in a range from 5 nm to 100 nm, although lesser and greater thicknesses can also be employed.

A dielectric material layer in which a subset of bonding pads are to be subsequently embedded can be formed over the first passivation dielectric layer 950. The dielectric material layer is herein referred to as a first proximal bonding dielectric layer 972, which is one of the dielectric material layers to be provided in bonding levels of the first semiconductor die 900. The first proximal bonding dielectric layer 972 is most proximal to the first substrate 908 of all the dielectric material layers to be provided in bonding levels of the first semiconductor die 900. The first proximal bonding dielectric layer 972 includes a dielectric material that can embed first bonding pads and additional first metal interconnect structures such as interconnection metal via structures. For example, the first proximal bonding dielectric layer 972 can include silicon oxide, and can have a thickness in a range from 300 nm to 1,000 nm, although lesser and greater thicknesses can also be employed.

Pad-level cavities 987 can be formed in the first proximal bonding dielectric layer 972 by performing at least one combination of a lithographic patterning process that applies and patterns a photoresist layer to form openings therethrough and an anisotropic etch process that transfers the pattern of the openings at least partially through the first proximal bonding dielectric layer 972. The pad-level cavities 987 may include pad and via cavities in which via cavities vertically extending to a top surface of a respective underlying on the first metal interconnect structures 980 are adjoined to an overlying pad cavity having the shape of pad, which may have a polygonal shape, a rounded polygonal shape, or a generally curvilinear two-dimensional shape.

Figure 1C:
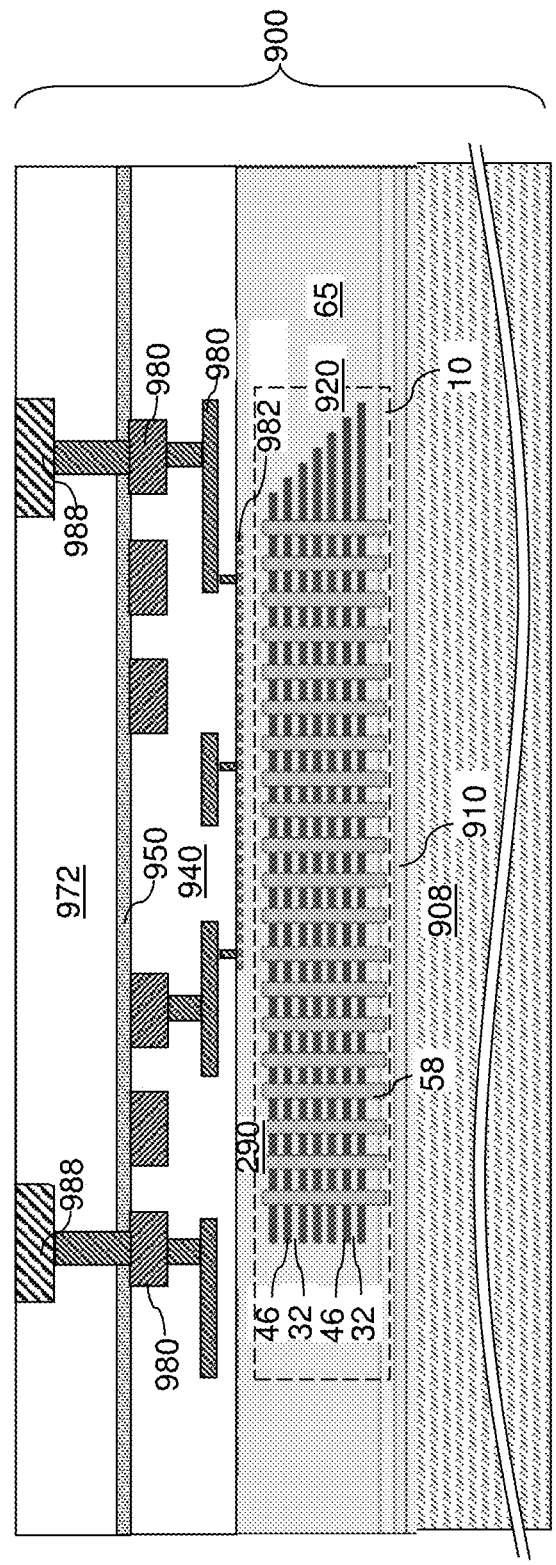

Referring to FIG. 1C, at least one conductive material such as a conductive metallic liner material (e.g., TiN, TaN, and/or WN) and a conductive metallic fill material that enables metal-to-metal bonding (such as copper) can be deposited in the pad-level cavities 987. Excess portions of the at least one conductive material can be removed from above the horizontal plane including the top surface of the first proximal bonding dielectric layer 972 by a planarization process such as chemical mechanical planarization (CMP). Each remaining portion of the at least one conductive material that fills a respective pad-level cavity 987 constitutes an integrated pad and via structure that includes a first bonding pad 988 and a metal via structure, which is an additional first metal interconnect structure 980.

While the present disclosure is described employing an embodiment in which the first bonding pads 988 are formed as a component of a respective one of the integrated pad and via structures, embodiments are expressly contemplated herein in which the metal via structures and the first bonding pads 988 are formed separately, and the first bonding pads 988 are formed after formation of the metal via structure that extend through a lower portion of the first proximal bonding dielectric layer 972. In this case, a lower sub-layer of the first proximal bonding dielectric layer 972 is formed first, and the metal via structures are formed therethrough. An upper sub-layer of the first proximal bonding dielectric layer 972 is subsequently formed, and the first bonding pads 988 are formed thereafter. Additional first bonding pads 988 are subsequently formed in additional first boding dielectric layers to be subsequently formed. The first bonding pads 988 that are embedded in the first proximal bonding dielectric layer 972 are hereafter referred to as first proximal bonding pads, i.e., first bonding pads 988 that are proximal to the first substrate 908.

Figure 1D:
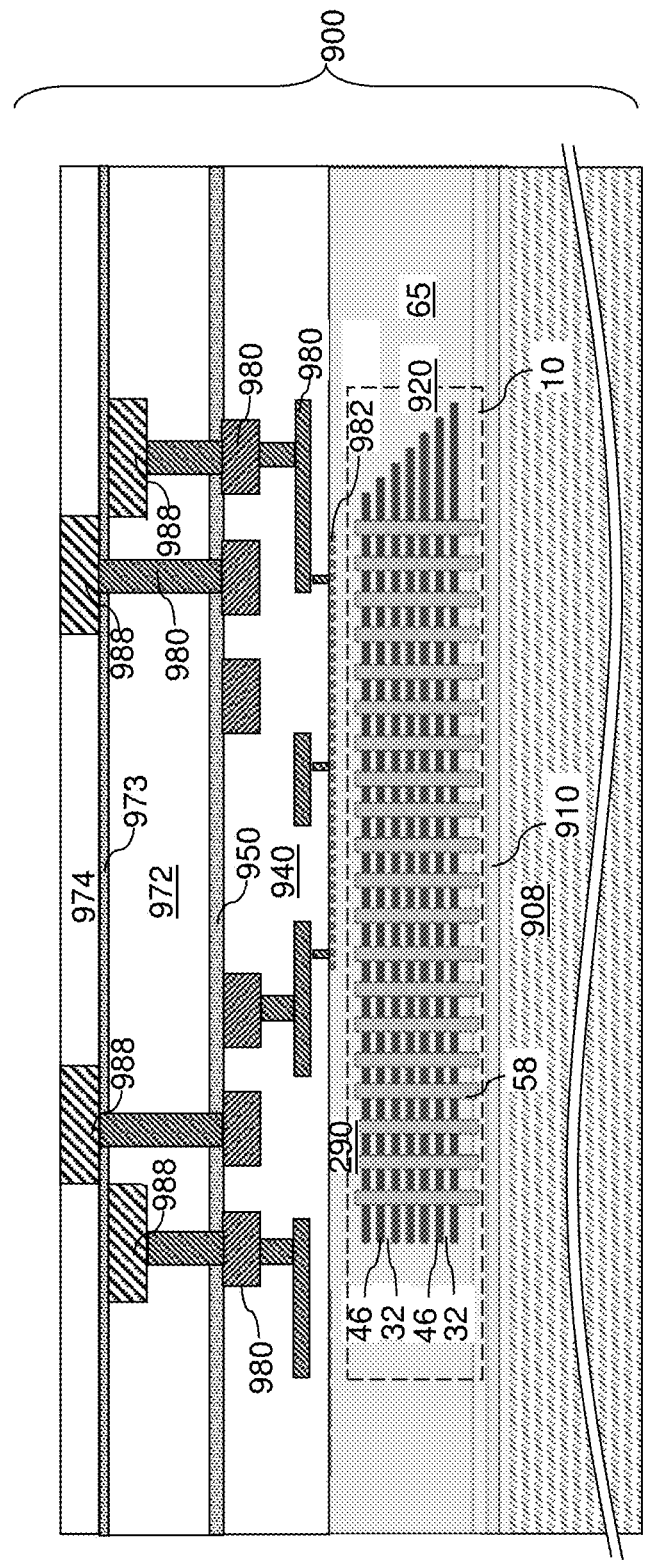

Referring to FIG. 1D, a first proximal dielectric cover liner 973 can be formed over the first proximal bonding dielectric layer 972. The first proximal dielectric cover liner 973 includes a dielectric material that can provide vertical insulation for the first proximal bonding pads after bonding the semiconductor die 900 to a second semiconductor die. For example, the first proximal dielectric cover liner 973 can include silicon nitride, and can have a thickness in a range from 5 nm to 50 nm, although lesser and greater thicknesses can also be employed.

Via cavities can be formed through the first proximal dielectric cover liner 973, the first proximal bonding dielectric layer 972, and the first passivation dielectric layer 950. A top surface of a first metal interconnect structure 980 embedded in the first interconnect-level dielectric layers 940 can be physically exposed at the bottom of each via cavity. The via cavities are filled with at least one conductive material to form metal via structures, which are a subset of the first metal interconnect structures 980.

A first middle bonding dielectric layer 974 can be formed over the first proximal dielectric cover liner 973. The first middle bonding dielectric layer 974 includes a dielectric material that can embed first bonding pads and additional first metal interconnect structures such as interconnection metal via structures. For example, the first middle bonding dielectric layer 974 can include silicon oxide, and can have a thickness in a range from 200 nm to 500 nm, although lesser and greater thicknesses can also be employed.

Pad cavities are formed through the first middle bonding dielectric layer 974 over a respective one of the metal via structures extending through the first proximal dielectric cover liner 973 and the first proximal bonding dielectric layer 972. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the first middle bonding dielectric layer 974 by a planarization process such as chemical mechanical planarization (CMP). Each remaining portion of the at least one conductive material that fills a respective pad cavity constitutes an additional first bonding pad 988, which is herein referred to as a first middle bonding pad. Each first middle bonding pad 988 embedded in the first proximal bonding dielectric layer 972 is a first proximal bonding pad, and each first bonding pad 988 embedded in the first middle bonding dielectric layer 974 is a first middle bonding pad. Alternatively, an integrated pad and via structure may be formed instead as described above with respect to FIG. 1C.

Figure 1E:
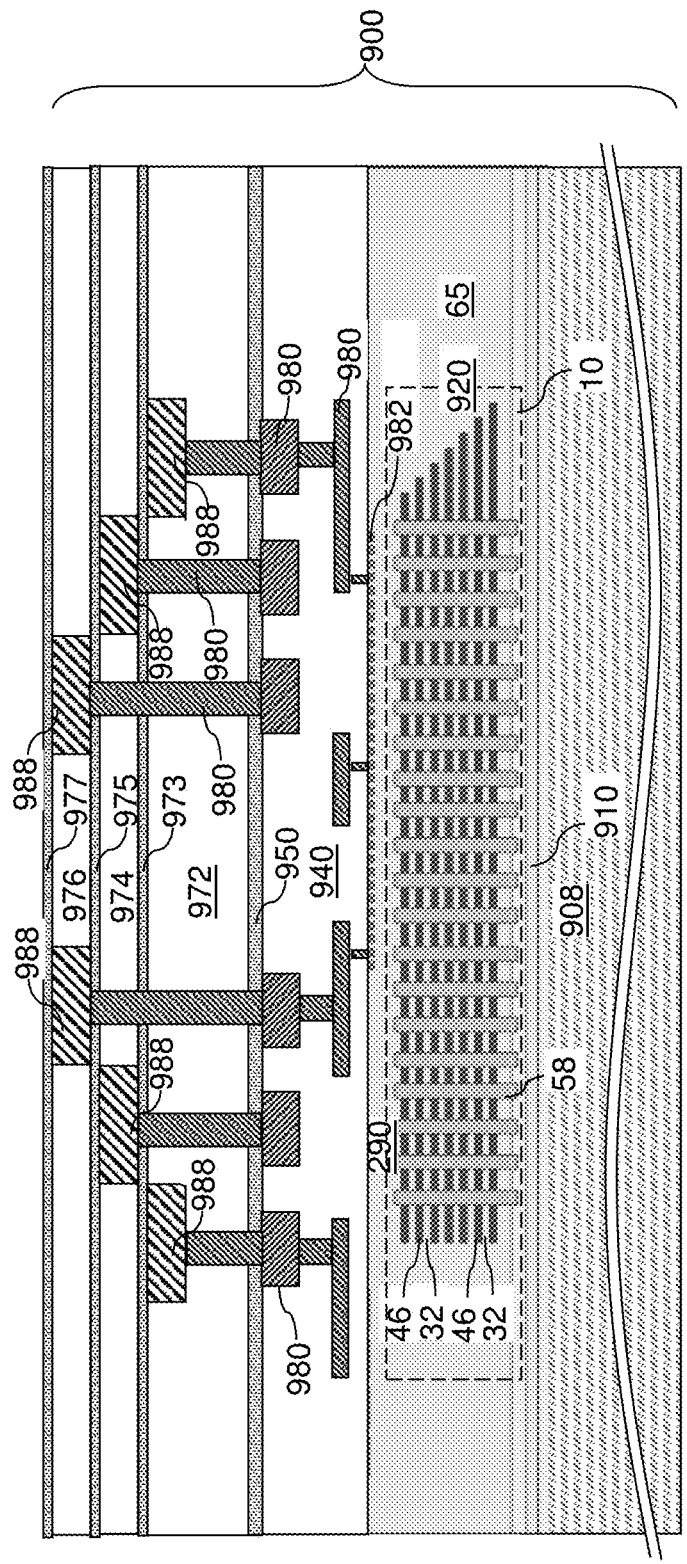

Referring to FIG. 1E, a first middle dielectric cover liner 975 can be formed over the first middle bonding dielectric layer 974. The first middle dielectric cover liner 975 can include any material that can be employed for the first proximal dielectric cover liner 973. For example, the first middle dielectric cover liner 975 can include silicon nitride, and can have a thickness in a range from 5 nm to 50 nm, although lesser and greater thicknesses can also be employed.

Via cavities can be formed through the first middle dielectric cover liner 975, the first middle bonding dielectric layer 974, the first proximal dielectric cover liner 973, the first proximal bonding dielectric layer 972, and the second passivation dielectric layer 750. A top surface of a first metal interconnect structure 980 embedded in the first interconnect-level dielectric layers 940 can be physically exposed at the bottom of each via cavity. The via cavities are filled with at least one conductive material to form metal via structures, which are a subset of the first metal interconnect structures 980.

A first distal bonding dielectric layer 976 can be formed over the first middle dielectric cover liner 975. The first distal bonding dielectric layer 976 includes a dielectric material that can embed first bonding pads and additional first metal interconnect structures such as interconnection metal via structures. For example, the first distal bonding dielectric layer 976 can include silicon oxide, and can have a thickness in a range from 200 nm to 500 nm, although lesser and greater thicknesses can also be employed.

Pad cavities are formed through the first distal bonding dielectric layer 976 over a respective one of the metal via structures extending through the first middle dielectric cover liner 975 and the first middle bonding dielectric layer 974. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the first distal bonding dielectric layer 976 by a planarization process such as chemical mechanical planarization (CMP). Each remaining portion of the at least one conductive material that fills a respective pad cavity constitutes an additional first bonding pad 988, which is herein referred to as a first distal bonding pad. Each first bonding pad 988 embedded in the first middle bonding dielectric layer 974 is a first middle bonding pad, and each first bonding pad 988 embedded in the first distal bonding dielectric layer 976 is a first distal bonding pad.

A first distal dielectric cover liner 977 can be formed over the first distal bonding dielectric layer 976. The first distal dielectric cover liner 977 can include any material that can be employed for the first proximal dielectric cover liner 973 and/or for the first middle dielectric cover liner 975. For example, the first distal dielectric cover liner 977 can include silicon nitride, and can have a thickness in a range from 5 nm to 50 nm, although lesser and greater thicknesses can also be employed.

Figure 1F:
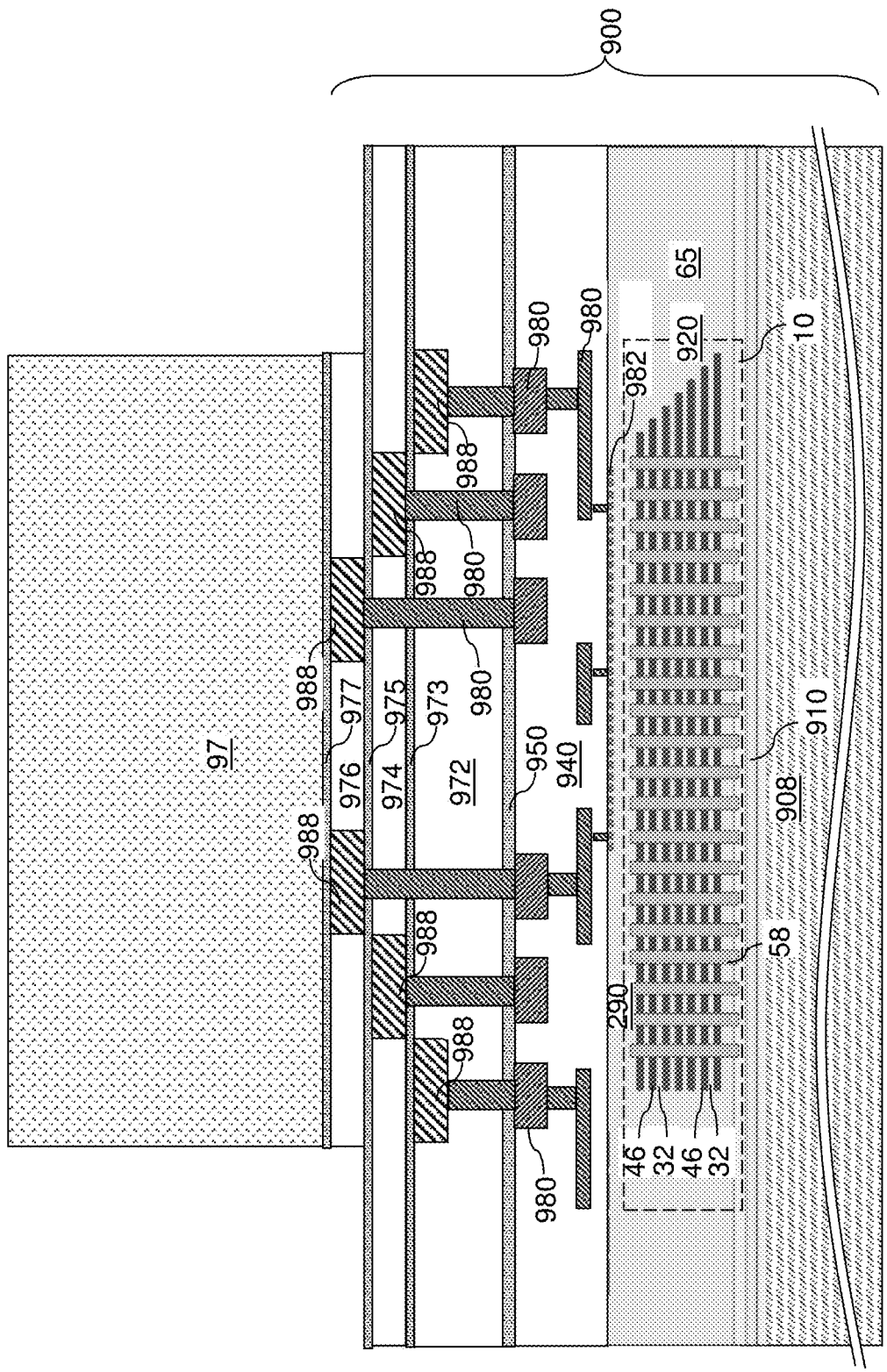

Referring to FIG. 1F, dielectric material layers that overlie the first passivation dielectric layer 950 can be patterned such that sidewalls of the first bonding pads 988 embedded in the various first bonding dielectric layers (972, 974, 976) are physically exposed. For example, a photoresist layer 97 can be applied over the first distal dielectric cover liner 977, and can be lithographically patterned to cover regions that include a respective group of first bonding pads 988 located at various levels. In one embodiment, a group of first bonding pads 988 located at various levels of the first bonding dielectric layers (972, 974, 976) can be arranged such that overlying first bonding pads 988 are laterally offset inward from underlying first bonding pads 988 within the area occupied by the group of first bonding pads 988. The edges of each patterned portion of the photoresist layer 97 can overlie peripheral regions or outer sidewalls of the first proximal bonding pads. An anisotropic etch process can be performed to transfer the pattern of the photoresist layer 97 through the first distal dielectric cover liner 977 and the first distal dielectric bonding layer 976. In this case, the first middle dielectric cover liner 975 can be employed as an etch stop layer for the anisotropic etch process.

Figure 1G:
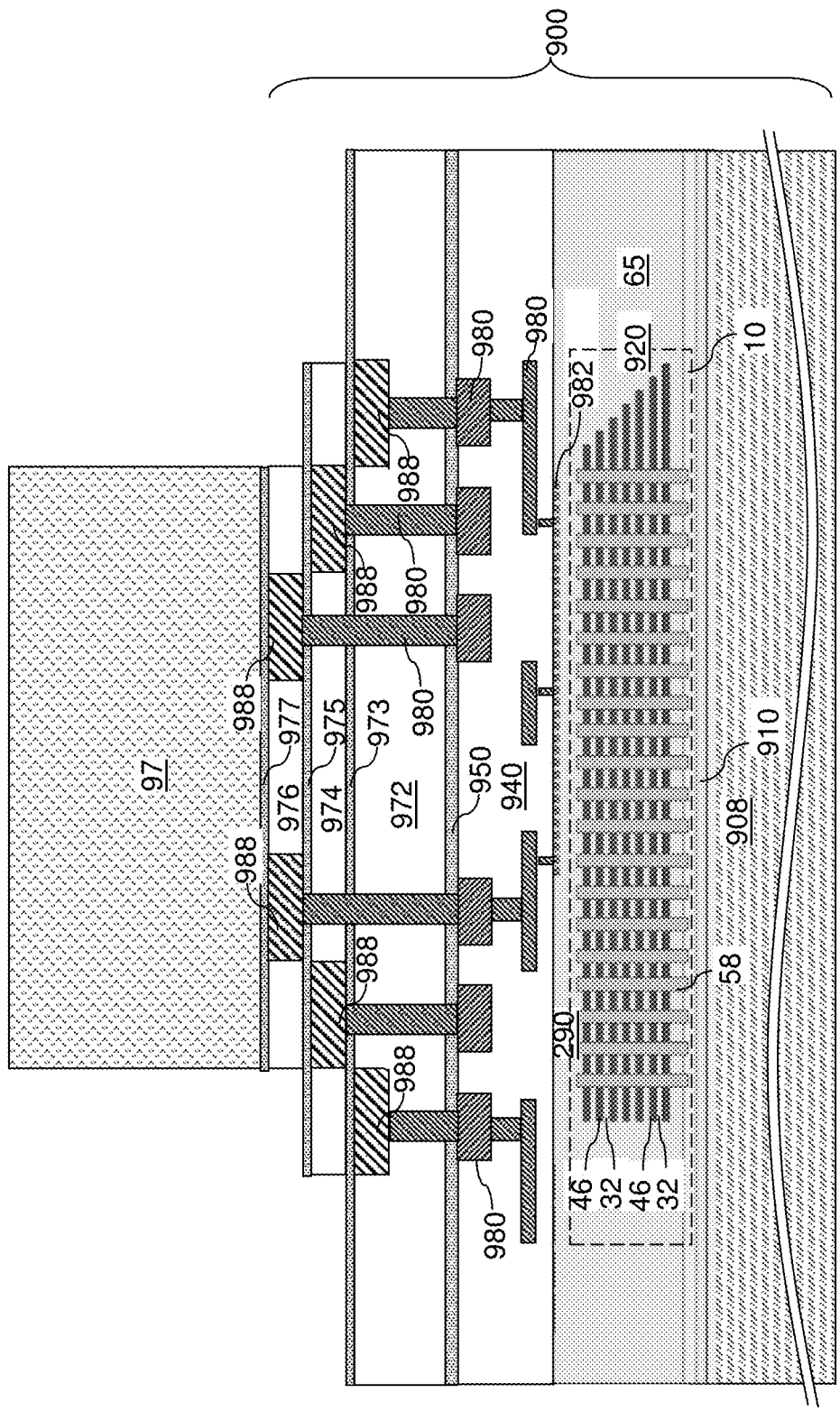

Referring to FIG. 1G, another etch mask layer can be formed over the first semiconductor die 900. In one embodiment, the photoresist layer 97 can include a trimmable photoresist material that can be isotropically trimmed by performing a controlled etch process (such as a controlled ashing process). In this case, the photoresist layer 97 can be isotropically trimmed, and the sidewalls of each patterned portion of the photoresist layer can shift inward so that the shifted sidewalls of each portion of the photoresist layer overlie peripheral regions or outer sidewalls of the first middle bonding pads. Alternatively, the photoresist layer 97 employed at the processing steps of FIG. 1F can be removed, and a new photoresist layer can be applied over the first semiconductor die 900 and can be lithographically patterned to provide an etch mask layer. An anisotropic etch process can be performed to transfer the pattern of the photoresist layer 97 through each physically exposed portion of the dielectric cover liners (such as unmasked portions of the first distal dielectric cover liner 977 or the first middle dielectric cover liner 975) and underlying unmasked portions of a first dielectric bonding layer (such as unmasked portions of the first distal dielectric bonding layer 976 or the first middle dielectric bonding layer 974). In this case, underlying portions of the first proximal dielectric cover liner 973 and the first middle dielectric cover liner 975 can be employed as an etch stop layer for the anisotropic etch process.

Figure 1H:
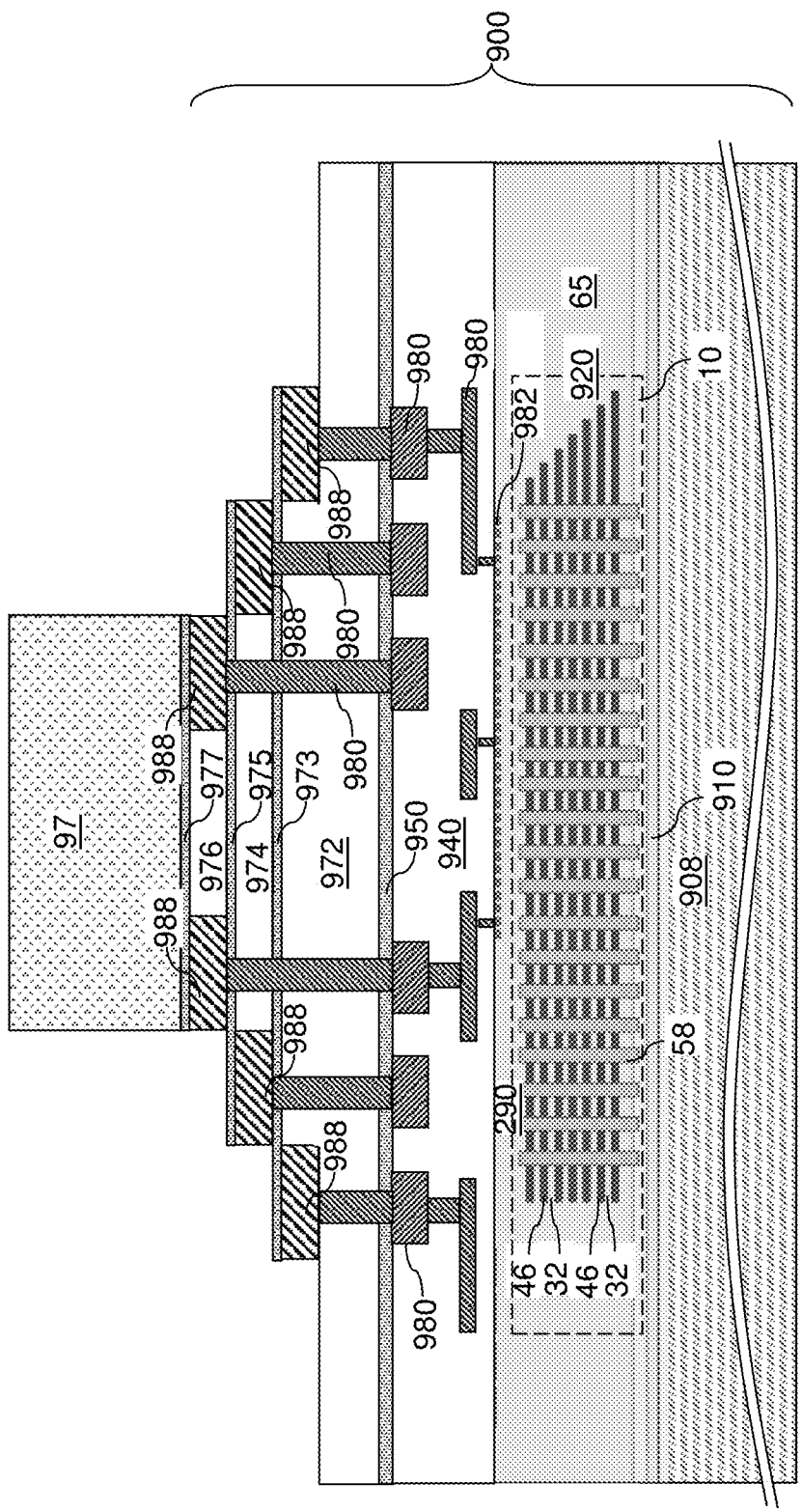

Referring to FIG. 1H, yet another etch mask layer can be formed over the first semiconductor die 900. If the photoresist layer 97 can include a trimmable photoresist material, the photoresist layer 97 can be isotropically trimmed, and the sidewalls of each patterned portion of the photoresist layer can shift inward so that the shifted sidewalls of each portion of the photoresist layer overlie peripheral regions or outer sidewalls of the first distal bonding pads. Alternatively, the photoresist layer 97 employed at the processing steps of FIG. 1G can be removed, and a new photoresist layer can be applied over the first semiconductor die 900 and can be lithographically patterned to provide an etch mask layer. An anisotropic etch process can be performed to transfer the pattern of the photoresist layer 97 through each physically exposed portion of the dielectric cover liners (such as unmasked portions of the first distal dielectric cover liner 977, the first middle dielectric cover liner 975, or the first proximal dielectric cover liner 973) and underlying unmasked portions of a first dielectric bonding layer (such as unmasked portions of the first distal bonding dielectric layer 976, the first middle bonding dielectric layer 974, or the first proximal dielectric bonding layer 972). In this case, underlying portions of the first proximal dielectric cover liner 973 and the first middle dielectric cover liner 975 can be employed as an etch stop layer for the anisotropic etch process.

Figure 1I:
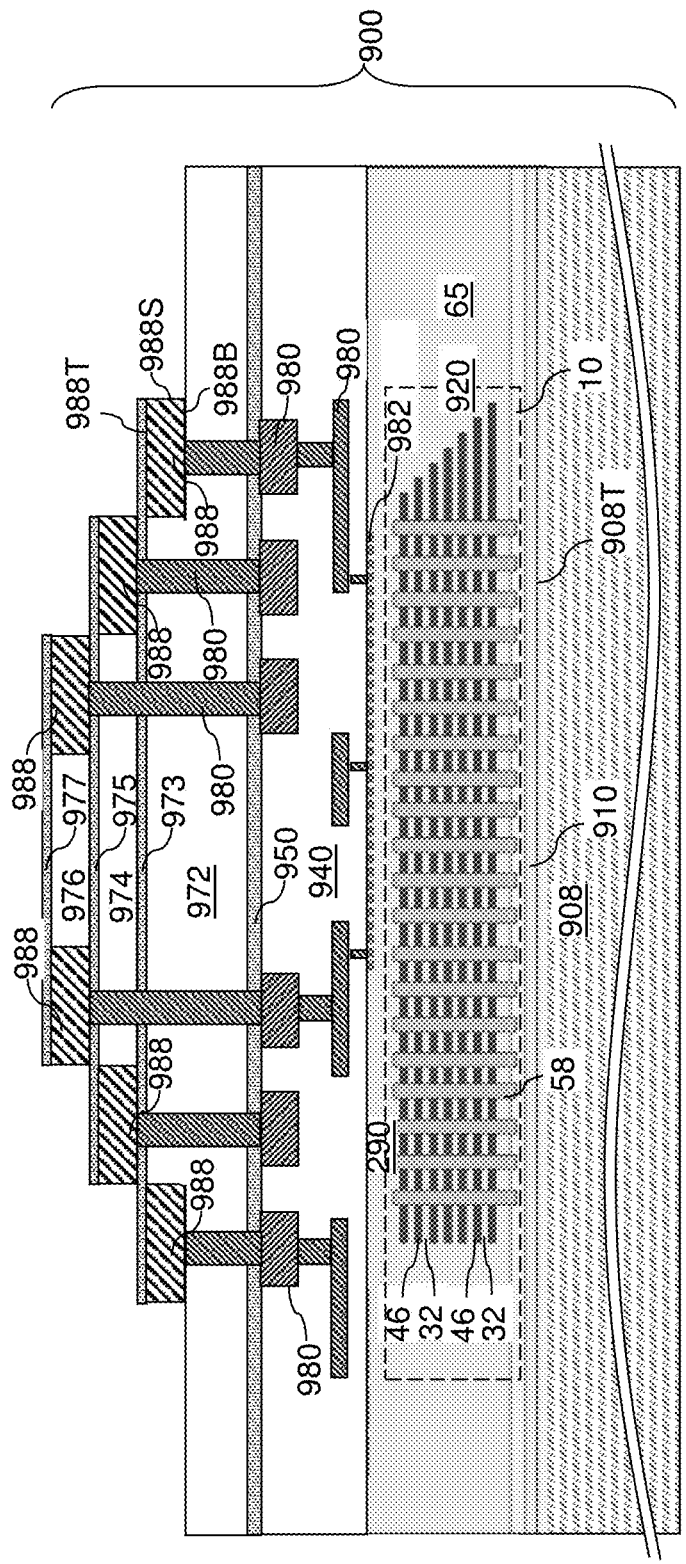

Referring to FIG. 1I, the photoresist layer 97 can be removed, for example, by ashing.

Generally, the first bonding pads 988 are electrically connected to a respective node of the first semiconductor devices 920 through a respective subset of the first metal interconnect structures 980, and have a respective physically exposed first sidewall. The first proximal bonding pads are embedded in the first proximal bonding dielectric layer 972, which is located over the first dielectric material layers 940. The first proximal dielectric cover liner 973 can be formed on a top surface of the first proximal bonding dielectric layer 972 and on the first proximal bonding pads. The first intermediate bonding dielectric layer 974 can be formed over the first proximal dielectric cover liner 973. The first distal bonding dielectric layer 976 and the first distal bonding pads are formed over the first proximal cover layer 973 and over the first intermediate bonding dielectric layer 974. The first distal bonding pads are embedded in the first distal bonding dielectric layer 976 (which overlies the first proximal bonding dielectric layer 972 and the first proximal bonding pads). The first bonding pads 988 comprise the first proximal bonding pads, the first middle bonding pads, and the first distal bonding pads. The first distal dielectric cover liner 977 can be formed on a top surface of the first distal bonding dielectric layer 976 and on the first distal bonding pads.

Sidewalls of the first distal bonding pads can be physically exposed by patterning the first distal bonding dielectric layer 976. Sidewalls of the first middle bonding pads can be physically exposed by patterning the first middle bonding dielectric layer 974. Sidewalls of the first proximal bonding pads can be physically exposed by patterning the first proximal bonding dielectric layer 972. The first bonding pads 988 can be formed at multiple levels having different vertical separation distances from the first substrate 908. Sidewalls of the first bonding pads can 988 can be physically exposed. Optionally, an isotropic etch process can be performed to remove physically exposed portions of the metallic liners in the first bonding pads 988. A metallic material that can be employed for metal-to-metal bonding, such as copper, can be physically exposed at each physically exposed sidewall of the first bonding pads 988. Optionally, at least one anisotropic etch process may be employed to pattern the sidewalls of the first bonding pads 988. In this case, the physically exposed sidewalls of the first bonding pads 988 may be vertical, or may be tapered. Generally, the physically exposed sidewalls of the first bonding pads 988 are non-horizontal, and have an angle greater than zero with respect to any horizontal plane including a first major surface (such as a top surface) 908T of the first substrate 908, as shown in FIG. 1I. A major surface refers to a surface of an object that occupies more than 25% of the entire area of the object. In case the first substrate 908 comprises a commercially available silicon wafer, the top surface of the first substrate 908 can have an area of about 49% to 50% of the entire area of the first substrate 908. The first semiconductor die 900 includes first bonding pads 988 having a top surface 988T facing away from the first semiconductor devices 920, a bottom surface 988B facing the first semiconductor devices 920, and at least one sidewall 988S extending between the top surface and the bottom surface.

Figure 2A:
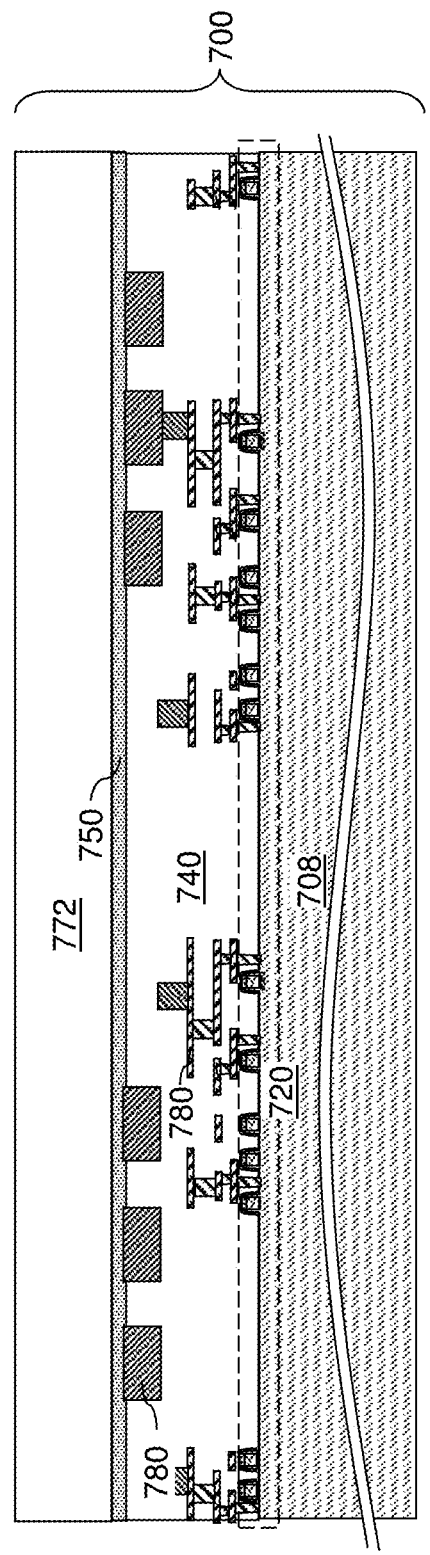
FIGS. 2A-2F are sequential schematic vertical cross-sectional views of a second semiconductor die prior to bonding according to the first embodiment of the present disclosure.

Referring to FIG. 2A, a second semiconductor die 700 is illustrated. The second semiconductor die 700 includes a second substrate 708, second semiconductor devices 720 overlying the second substrate 708, second dielectric material layers 740 overlying the second semiconductor devices 720, and second metal interconnect structures 780 embedded in the second dielectric material layers 740. In one embodiment, the second semiconductor devices 720 may include field effect transistors in a complementary metal oxide semiconductor (CMOS) configuration. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a driver or peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

An optional second passivation dielectric layer 750 can be formed over the second interconnect-level dielectric layers 740. The second passivation dielectric layer 750 can include a dielectric diffusion barrier material such as silicon nitride. The thickness of the second passivation dielectric layer 750 can be in a range from 5 nm to 100 nm, although lesser and greater thicknesses can also be employed.

A dielectric material layer in which a subset of bonding pads are to be subsequently embedded can be formed over the second passivation dielectric layer 750. The dielectric material layer is herein referred to as a second proximal bonding dielectric layer 772, which is one of the dielectric material layers to be provided in bonding levels of the second semiconductor die 700. The second proximal bonding dielectric layer 772 is most proximal to the second substrate 708 of all the dielectric material layers to be provided in bonding levels of the second semiconductor die 700. The second proximal bonding dielectric layer 772 includes a dielectric material that can embed second bonding pads and additional second metal interconnect structures such as interconnection metal via structures. For example, the second proximal bonding dielectric layer 772 can include silicon oxide, and can have a thickness in a range from 300 nm to 1,000 nm, although lesser and greater thicknesses can also be employed.

Figure 2B:
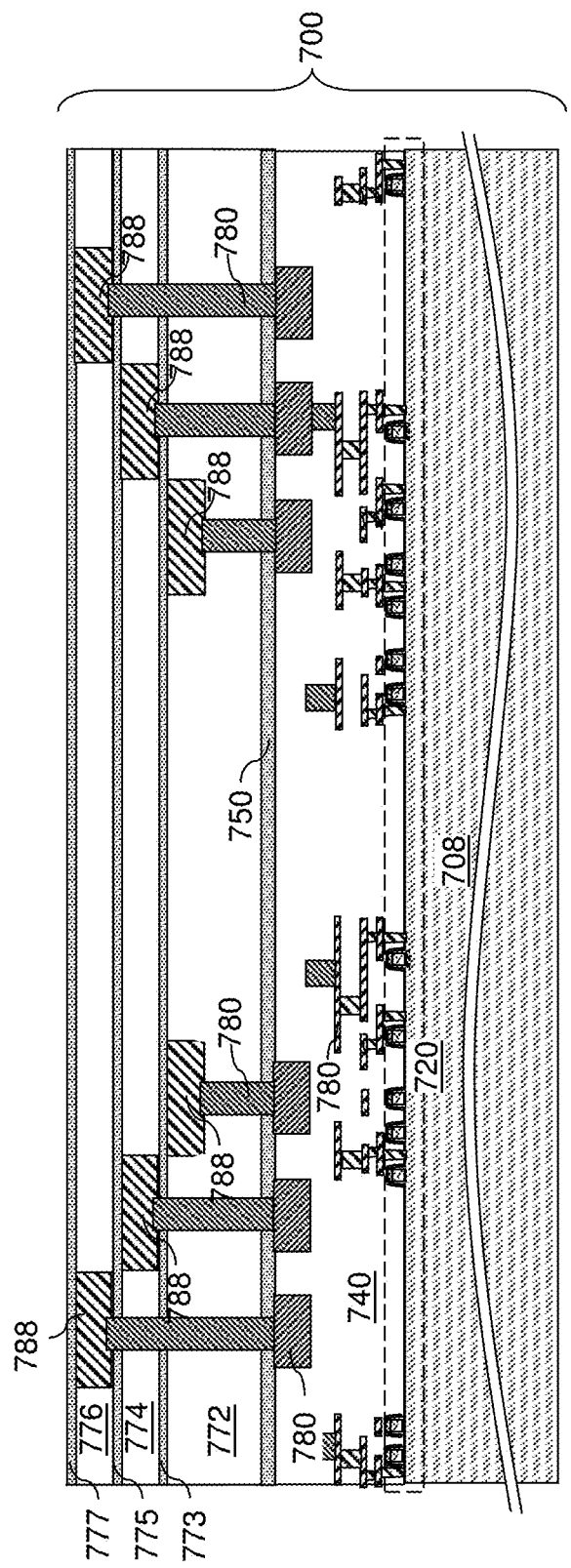

Referring to FIG. 2B, pad-level cavities can be formed in the second proximal bonding dielectric layer 772 by performing at least one combination of a lithographic patterning process that applies and patterns a photoresist layer to form openings therethrough and an anisotropic etch process that transfers the pattern of the openings at least partially through the second proximal bonding dielectric layer 772. The pad-level cavities may include pad and via cavities in which via cavities vertically extending to a top surface of a respective underlying on the second metal interconnect structures 780 are adjoined to an overlying pad cavity having the shape of pad, which may have a polygonal shape, a rounded polygonal shape, or a generally curvilinear two-dimensional shape. At least one conductive material such as a conductive metallic liner material (e.g., TiN, TaN, and/or WN) and a conductive metallic fill material that enables metal-to-metal bonding (such as copper) can be deposited in the pad-level cavities. Excess portions of the at least one conductive material can be removed from above the horizontal plane including the top surface of the second proximal bonding dielectric layer 772 by a planarization process such as chemical mechanical planarization (CMP). Each remaining portion of the at least one conductive material that fills a respective pad-level cavity constitutes an integrated pad and via structure that includes a second bonding pad 788 and a metal via structure, which is an additional second metal interconnect structure 780.

A second proximal dielectric cover liner 773 can be formed over the second proximal bonding dielectric layer 772. The second proximal dielectric cover liner 773 includes a dielectric material that can provide vertical insulation for the second proximal bonding pads after bonding the semiconductor die 700 to a second semiconductor die. For example, the second proximal dielectric cover liner 773 can include silicon nitride, and can have a thickness in a range from 5 nm to 50 nm, although lesser and greater thicknesses can also be employed. Via cavities can be formed through the second proximal dielectric cover liner 773, the second proximal bonding dielectric layer 772, and the second passivation dielectric layer 750. A top surface of a second metal interconnect structure 780 embedded in the second interconnect-level dielectric layers 740 can be physically exposed at the bottom of each via cavity. The via cavities are filled with at least one conductive material to form metal via structures, which are a subset of the second metal interconnect structures 780.

A second middle bonding dielectric layer 774 can be formed over the second proximal dielectric cover liner 773. The second middle bonding dielectric layer 774 includes a dielectric material that can embed second bonding pads and additional second metal interconnect structures such as interconnection metal via structures. For example, the second middle bonding dielectric layer 774 can include silicon oxide, and can have a thickness in a range from 200 nm to 500 nm, although lesser and greater thicknesses can also be employed. Pad cavities are formed through the second middle bonding dielectric layer 774 over a respective one of the metal via structures extending through the second proximal dielectric cover liner 773 and the second proximal bonding dielectric layer 772. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the second middle bonding dielectric layer 774 by a planarization process such as chemical mechanical planarization (CMP). Each remaining portion of the at least one conductive material that fills a respective pad cavity constitutes an additional second bonding pad 788, which is herein referred to as a second middle bonding pad. Each second bonding pad 788 embedded in the second proximal bonding dielectric layer 772 is a second proximal bonding pad, and each second bonding pad 788 embedded in the second middle bonding dielectric layer 774 is a second middle bonding pad.

A second middle dielectric cover liner 775 can be formed over the second middle bonding dielectric layer 774. The second middle dielectric cover liner 775 can include any material that can be employed for the second proximal dielectric cover liner 773. For example, the second middle dielectric cover liner 775 can include silicon nitride, and can have a thickness in a range from 5 nm to 50 nm, although lesser and greater thicknesses can also be employed. Via cavities can be formed through the second middle dielectric cover liner 775, the second middle bonding dielectric layer 774, the second proximal dielectric cover liner 773, the second proximal bonding dielectric layer 772, and the second passivation dielectric layer 750. A top surface of a second metal interconnect structure 780 embedded in the second interconnect-level dielectric layers 740 can be physically exposed at the bottom of each via cavity. The via cavities are filled with at least one conductive material to form metal via structures, which are a subset of the second metal interconnect structures 780.

A second distal bonding dielectric layer 776 can be formed over the second middle dielectric cover liner 775. The second distal bonding dielectric layer 776 includes a dielectric material that can embed second bonding pads and additional second metal interconnect structures such as interconnection metal via structures. For example, the second distal bonding dielectric layer 776 can include silicon oxide, and can have a thickness in a range from 200 nm to 500 nm, although lesser and greater thicknesses can also be employed. Pad cavities are formed through the second distal bonding dielectric layer 776 over a respective one of the metal via structures extending through the second middle dielectric cover liner 775 and the second middle bonding dielectric layer 774. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the second distal bonding dielectric layer 776 by a planarization process such as chemical mechanical planarization (CMP). Each remaining portion of the at least one conductive material that fills a respective pad cavity constitutes an additional second bonding pad 788, which is herein referred to as a second distal bonding pad. Each second bonding pad 788 embedded in the second middle bonding dielectric layer 774 is a second middle bonding pad, and each second bonding pad 788 embedded in the second distal bonding dielectric layer 774 is a second distal bonding pad.

A second distal dielectric cover liner 777 can be formed over the second distal bonding dielectric layer 776. The second distal dielectric cover liner 777 can include any material that can be employed for the second proximal dielectric cover liner 773 and/or for the second middle dielectric cover liner 775. For example, the second distal dielectric cover liner 777 can include silicon nitride, and can have a thickness in a range from 5 nm to 50 nm, although lesser and greater thicknesses can also be employed.

Figure 2C:
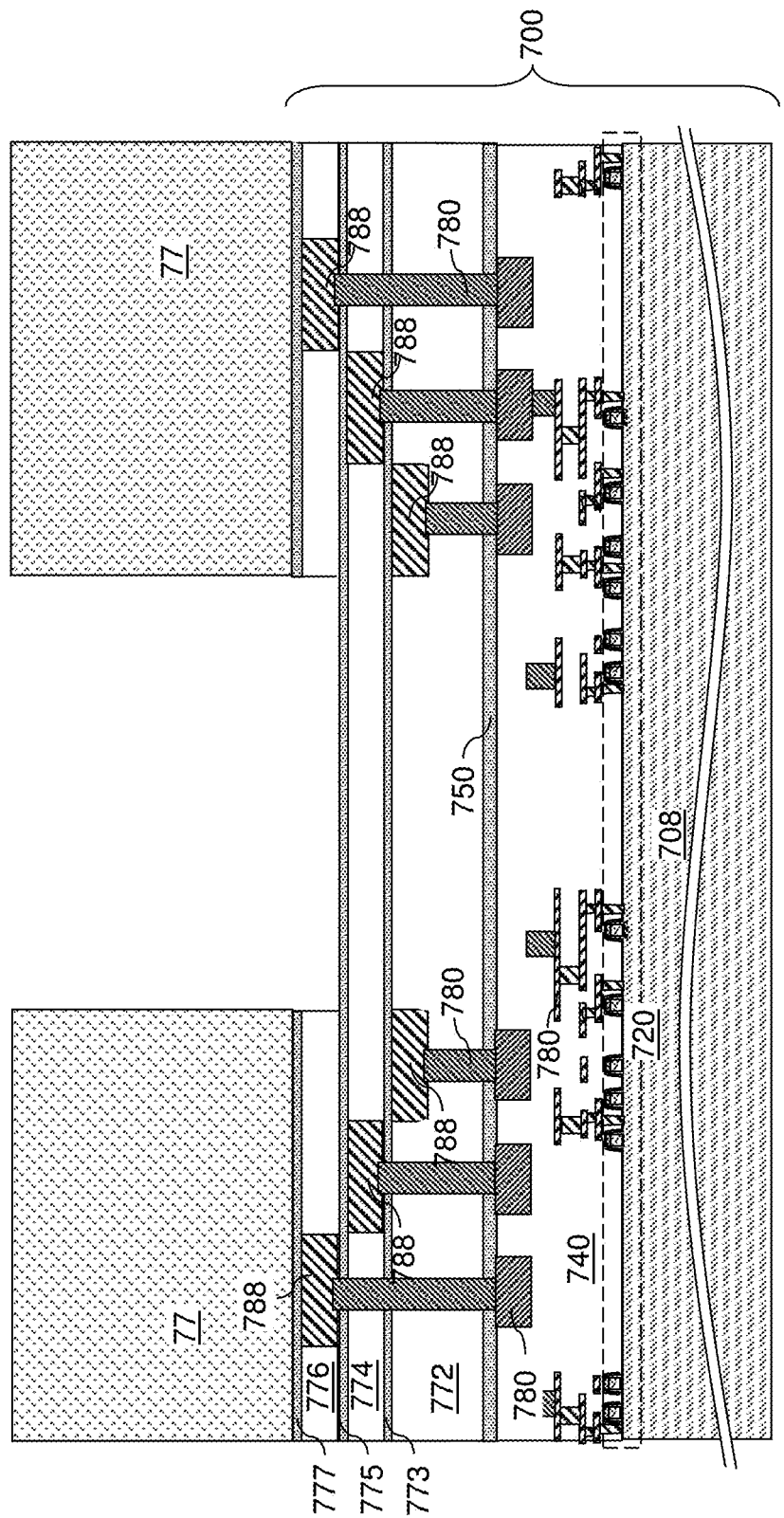

Referring to FIG. 2C, dielectric material layers that overlie the second passivation dielectric layer 750 can be patterned such that sidewalls of the second bonding pads 788 embedded in the various second bonding dielectric layers (772, 774, 776) are physically exposed. For example, a photoresist layer 77 can be applied over the second distal dielectric cover liner 777, and can be lithographically patterned to cover regions that include a respective group of second bonding pads 788 located at various levels. In one embodiment, a group of second bonding pads 788 located at various levels of the second bonding dielectric layers (772, 774, 776) can be arranged such that overlying second bonding pads 788 are laterally offset inward from underlying second bonding pads 788 within the area occupied by the group of second bonding pads 788. The edges of each patterned portion of the photoresist layer 77 can overlie peripheral regions or outer sidewalls of the second proximal bonding pads. An anisotropic etch process can be performed to transfer the pattern of the photoresist layer 77 through the second distal dielectric cover liner 777 and the second distal dielectric bonding layer 776. In this case, the second middle dielectric cover liner 775 can be employed as an etch stop layer for the anisotropic etch process.

Figure 2D:
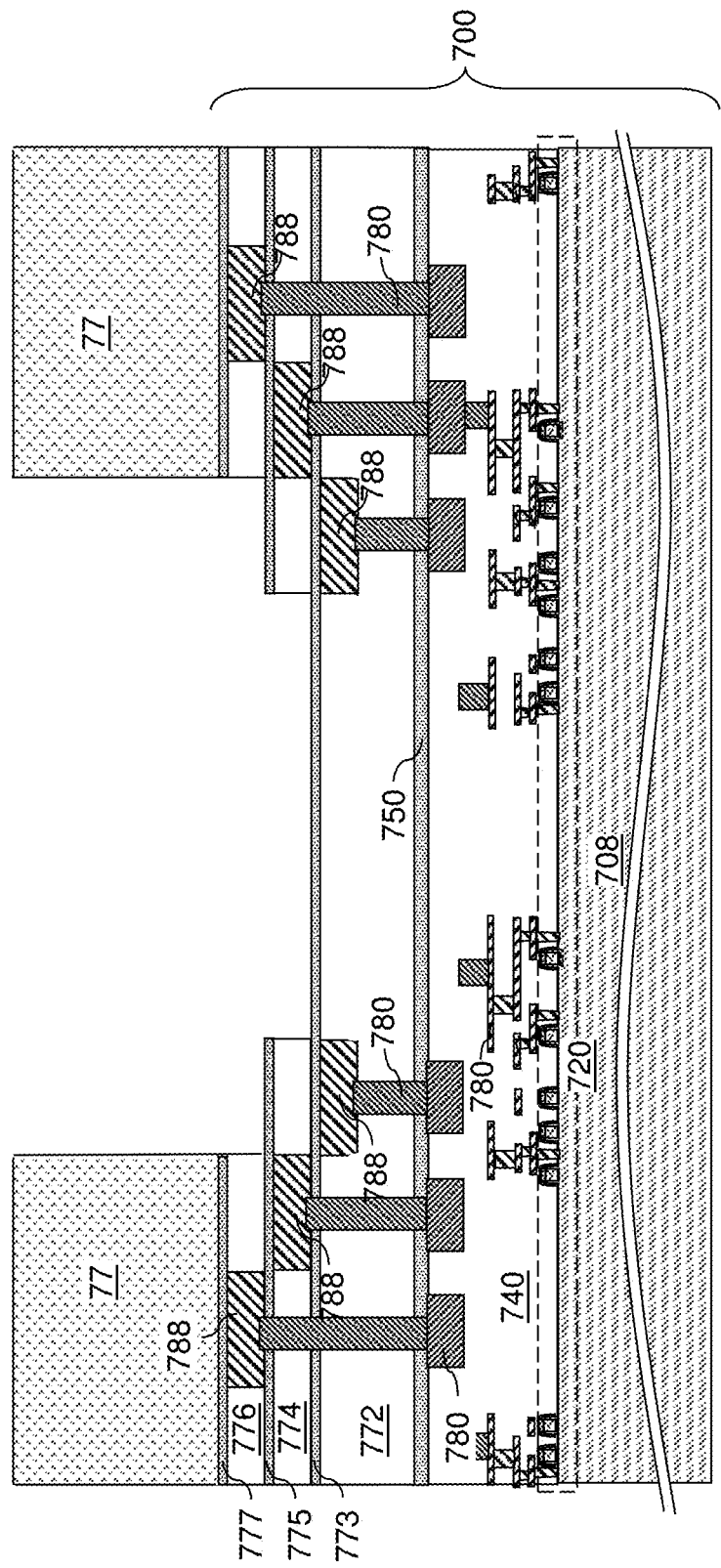

Referring to FIG. 2D, another etch mask layer can be formed over the second semiconductor die 700. In one embodiment, the photoresist layer 77 can include a trimmable photoresist material that can be isotropically trimmed by performing a controlled etch process (such as a controlled ashing process). In this case, the photoresist layer 77 can be isotropically trimmed, and the sidewalls of each patterned portion of the photoresist layer can shift inward so that the shifted sidewalls of each portion of the photoresist layer overlie peripheral regions or outer sidewalls of the second middle bonding pads. Alternatively, the photoresist layer 77 employed at the processing steps of FIG. 2C can be removed, and a new photoresist layer can be applied over the second semiconductor die 700 and can be lithographically patterned to provide an etch mask layer. An anisotropic etch process can be performed to transfer the pattern of the photoresist layer 77 through each physically exposed portion of the dielectric cover liners (such as unmasked portions of the second distal dielectric cover liner 777 or the second middle dielectric cover liner 775) and underlying unmasked portions of a second dielectric bonding layer (such as unmasked portions of the second distal dielectric bonding layer 776 or the second middle dielectric bonding layer 774). In this case, underlying portions of the second proximal dielectric cover liner 773 and the second middle dielectric cover liner 775 can be employed as an etch stop layer for the anisotropic etch process.

Figure 2E:
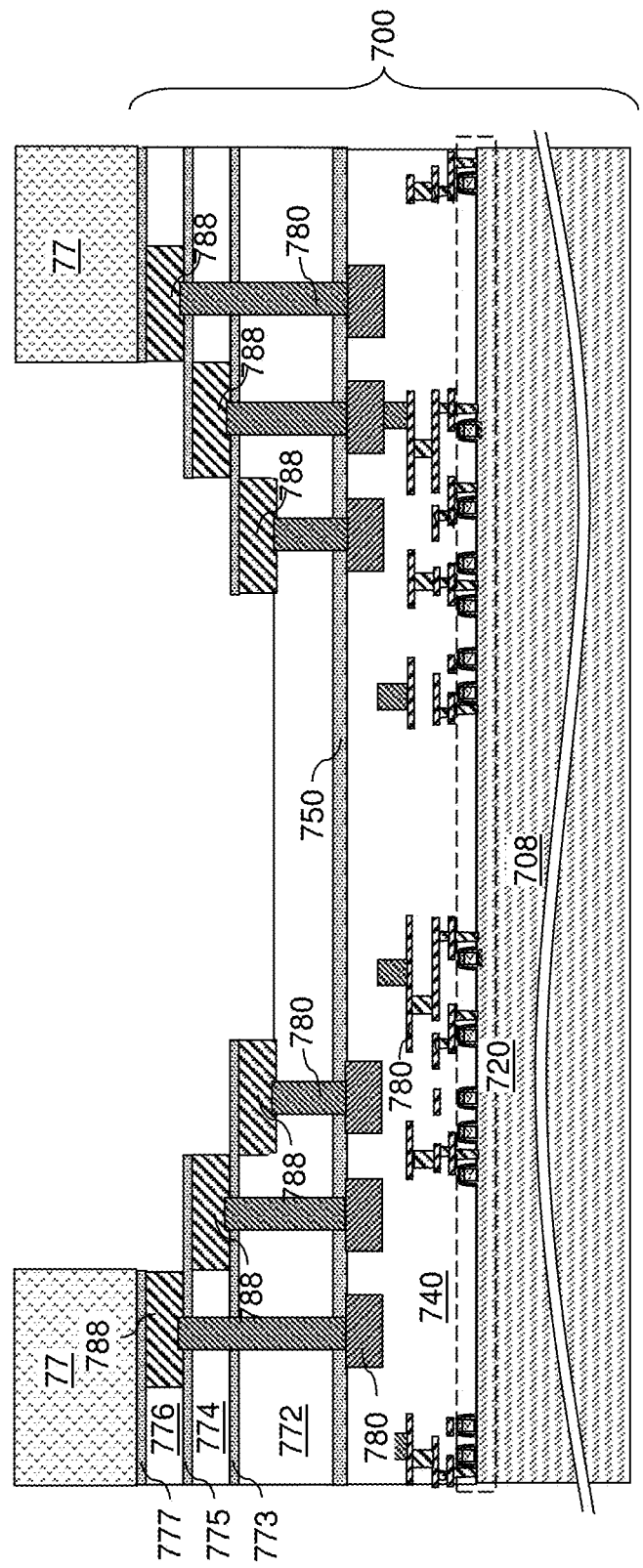

Referring to FIG. 2E, yet another etch mask layer can be formed over the second semiconductor die 700. If the photoresist layer 77 can include a trimmable photoresist material, the photoresist layer 77 can be isotropically trimmed, and the sidewalls of each patterned portion of the photoresist layer can shift inward so that the shifted sidewalls of each portion of the photoresist layer overlie peripheral regions or outer sidewalls of the second distal bonding pads. Alternatively, the photoresist layer 77 employed at the processing steps of FIG. 2D can be removed, and a new photoresist layer can be applied over the second semiconductor die 700 and can be lithographically patterned to provide an etch mask layer. An anisotropic etch process can be performed to transfer the pattern of the photoresist layer 77 through each physically exposed portion of the dielectric cover liners (such as unmasked portions of the second distal dielectric cover liner 777, the second middle dielectric cover liner 775, or the second proximal dielectric cover liner 773) and underlying unmasked portions of a second dielectric bonding layer (such as unmasked portions of the second distal dielectric bonding layer 776, the second middle dielectric bonding layer 774, or the second proximal dielectric bonding layer 772). In this case, underlying portions of the second proximal dielectric cover liner 773 and the second middle dielectric cover liner 775 can be employed as an etch stop layer for the anisotropic etch process.

Figure 2F:
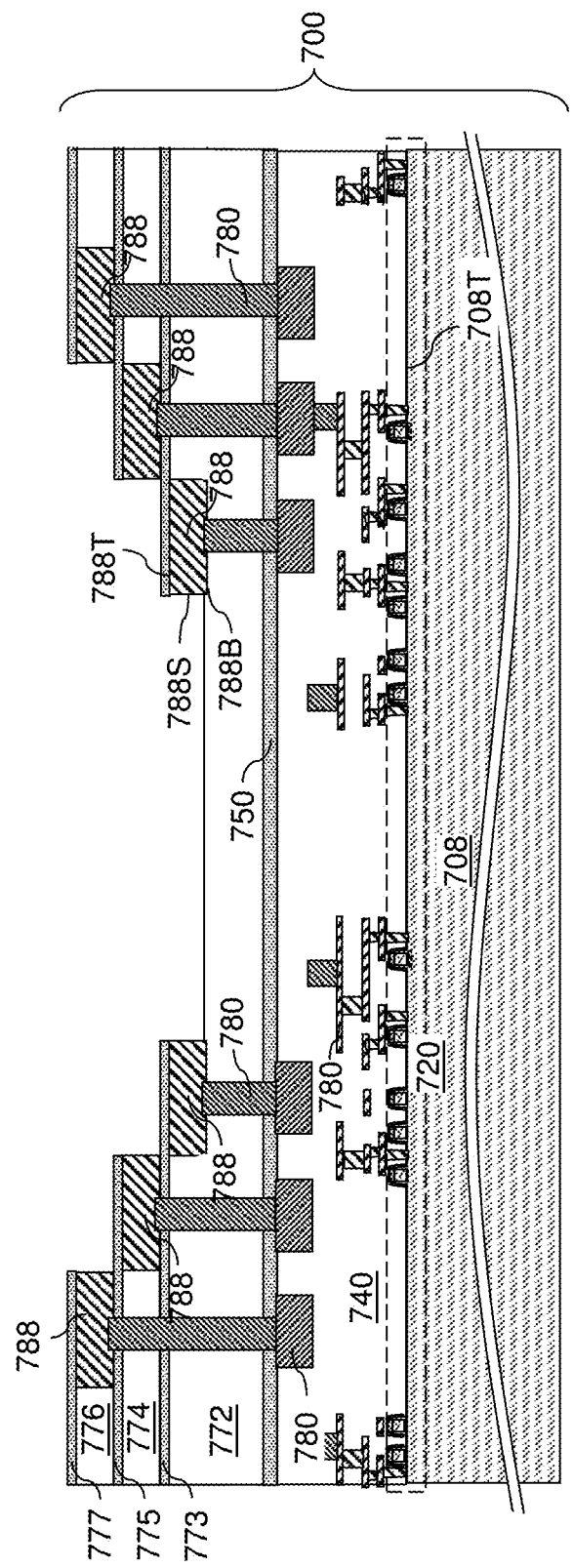

Referring to FIG. 2F, the photoresist layer 77 can be removed, for example, by ashing.

Generally, the second bonding pads 788 are electrically connected to a respective node of the second semiconductor devices 720 through a respective subset of the second metal interconnect structures 780, and have a respective physically exposed second sidewall. The second proximal bonding pads are embedded in the second proximal bonding dielectric layer 772, which is located over the second dielectric material layers 740. The second proximal dielectric cover liner 773 can be formed on a top surface of the second proximal bonding dielectric layer 772 and on the second proximal bonding pads. The second intermediate bonding dielectric layer 774 can be formed over the second proximal dielectric cover liner 773. The second distal dielectric layer 776 and the second distal bonding pads are formed over the second proximal cover layer 773 and over the second intermediate bonding dielectric layer 774. The second distal bonding pads are embedded in the second distal bonding dielectric layer 776 (which overlies the second proximal bonding dielectric layer 772 and the second proximal bonding pads). The second bonding pads 788 comprise the second proximal bonding pads, the second middle bonding pads, and the second distal bonding pads. The second distal dielectric cover liner 777 can be formed on a top surface of the second distal bonding dielectric layer 776 and on the second distal bonding pads. The second bonding pads 788 have a top surface 788T facing away from the second semiconductor devices 720, a bottom surface 788B facing the second semiconductor devices 720 and at least one sidewall 788S between the top surface and the bottom surface.

Sidewalls of the second distal bonding pads can be physically exposed by patterning the second distal bonding dielectric layer 776. Sidewalls of the second middle bonding pads can be physically exposed by patterning the second middle bonding dielectric layer 774. Sidewalls of the second proximal bonding pads can be physically exposed by patterning the second proximal bonding dielectric layer 772. The second bonding pads 788 can be formed at multiple levels having different vertical separation distances from the second substrate 708. Sidewalls of the second bonding pads can 788 can be physically exposed. Optionally, an isotropic etch process can be performed to remove physically exposed portions of the metallic liners in the second bonding pads 788. A metallic material that can be employed for metal-to-metal bonding, such as copper, can be physically exposed at each physically exposed sidewall of the second bonding pads 788. Optionally, at least one anisotropic etch process may be employed to pattern the sidewalls of the second bonding pads 788. In this case, the physically exposed sidewalls of the second bonding pads 788 may be vertical, or may be tapered. Generally, the physically exposed sidewalls of the second bonding pads 788 are non-horizontal, and has an angle greater than zero with respective to any horizontal plane including a second major surface (such as a top surface) 708T of the second substrate 708, as shown in FIG. 2F. A major surface refers to a surface of an object that occupies more than 25% of the entire area of the object. In case the second substrate 708 comprises a commercially available semiconductor wafer, the top surface of the second substrate 708 can have an area of about 49% to 50% of the entire area of the second substrate 708.

Figure 3A:
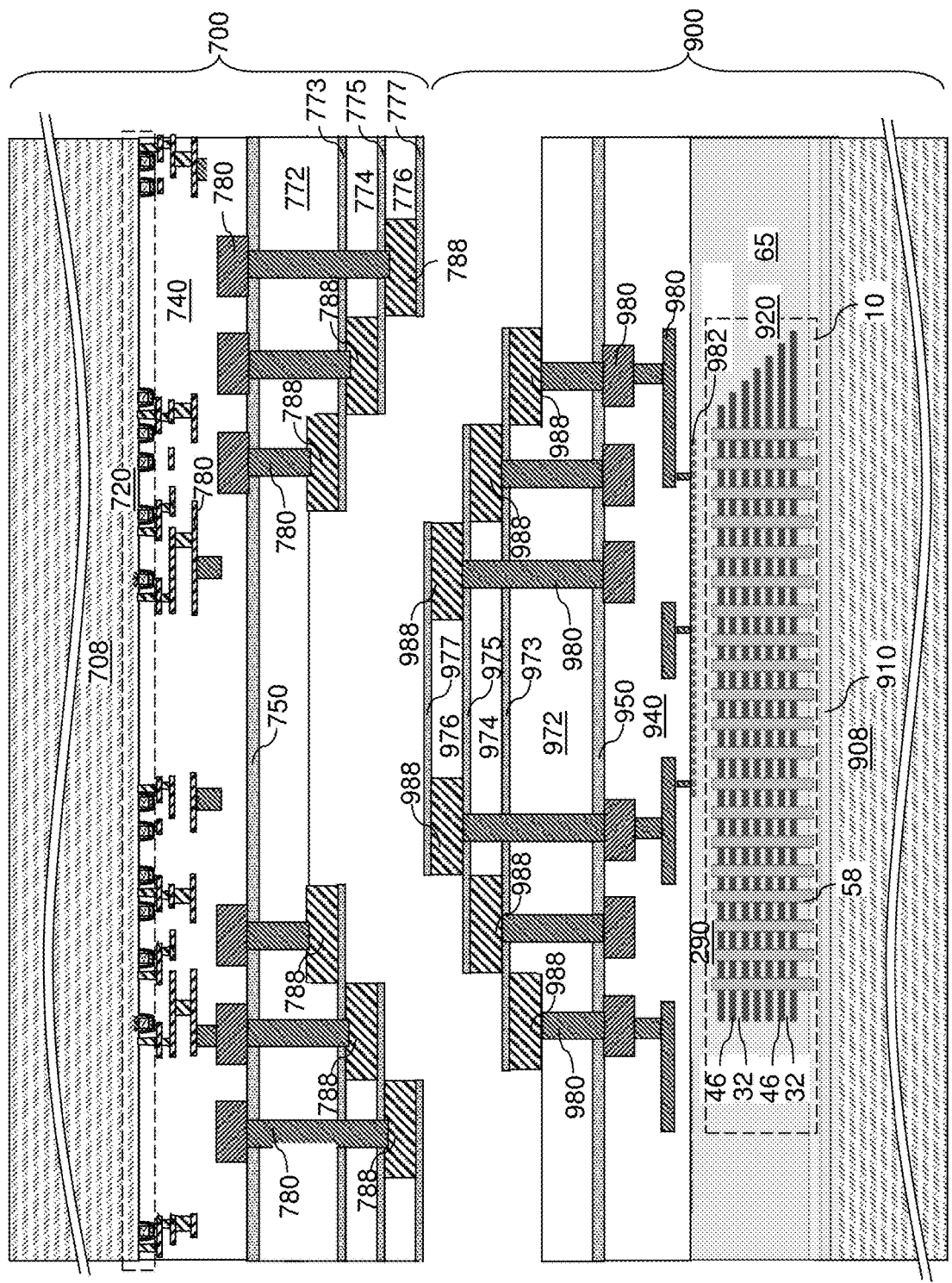
FIGS. 3A-3C are sequential schematic vertical cross-sectional view of a first exemplary structure during formation of a bonded assembly according to the first embodiment of the present disclosure.

Referring to FIG. 3A, the first semiconductor die 900 and the second semiconductor die 700 are oriented such that the first bonding dielectric layers (972, 974, 976) face the second bonding dielectric layers (772, 774, 776). The pattern of the first bonding pads 988 and the pattern of the second bonding pads 788, and the thicknesses of the various dielectric material layers (972, 973, 974, 975, 976, 977) in the first semiconductor die 900 and the thicknesses of the various dielectric material layers (772, 773, 774, 775, 776, 777) in the second semiconductor die 700 can be selected such that each protruding structure of the first semiconductor die 900 can protrude into a respective recessed region of the second semiconductor die 700, and vice versa.

Figure 3B:
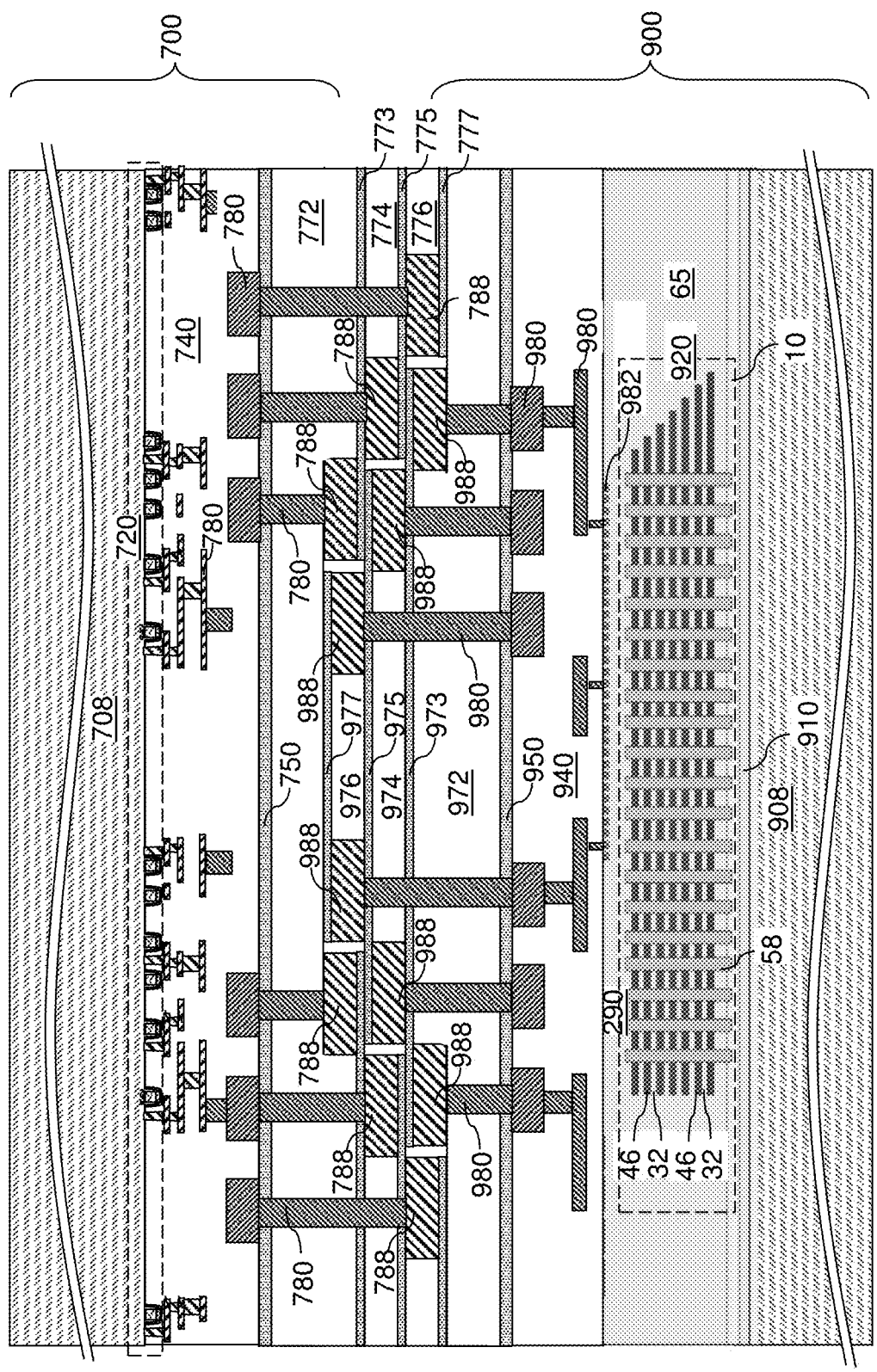

Referring to FIG. 3B, the second semiconductor die 700 and the first semiconductor die 900 are brought into contact such that the dielectric material layers (e.g., cover liners 973, 975, 977) in the first semiconductor die 900 contact the dielectric material layers (e.g., cover liners 773, 775, 777) in the second semiconductor die 700. The first semiconductor die 900 and the second semiconductor die 700 may be laterally aligned such that each second bonding pad 788 has a sidewall that faces a sidewall of a respective one of the first bonding pads 988. The sidewalls of the first bonding pads 988 and the sidewalls of the second bonding pads 788 are positioned such that each pair of a sidewall of a first bonding pad 988 and a sidewall of a second bonding pad 788 to be bonded are laterally spaced from each other by a lateral spacing that is not greater than the sum of the lateral expansion distance of the sidewall of the first bonding pad 988 and the lateral expansion distance of the sidewall of the second bonding pad 788 during a subsequent anneal process to be employed for bonding the first bonding pads 988 to the second bonding pads 788. The lateral expansion distances of sidewalls of the bonding pads (988, 788), i.e., the lateral distance by which the sidewalls of the bonding pads (988, 788) move during an anneal process due to thermal expansion of the metallic material therein, are dependent on the material of the bonding pads (988, 788), and on the geometry and the dimensions of the bonding pads (988, 788). For example, if the lateral expansion distance of the sidewalls of the each bonding pad (988, 788) is in a range from 25 nm to 100 nm, the lateral spacing between each facing pair of a sidewall of a first bonding pad 988 and a sidewall of a second bonding pad 788 can be in a range from 5 nm to 200 nm, such as from 10 nm to 100 nm, and/or from 20 nm to 60 nm.

Figure 3C:
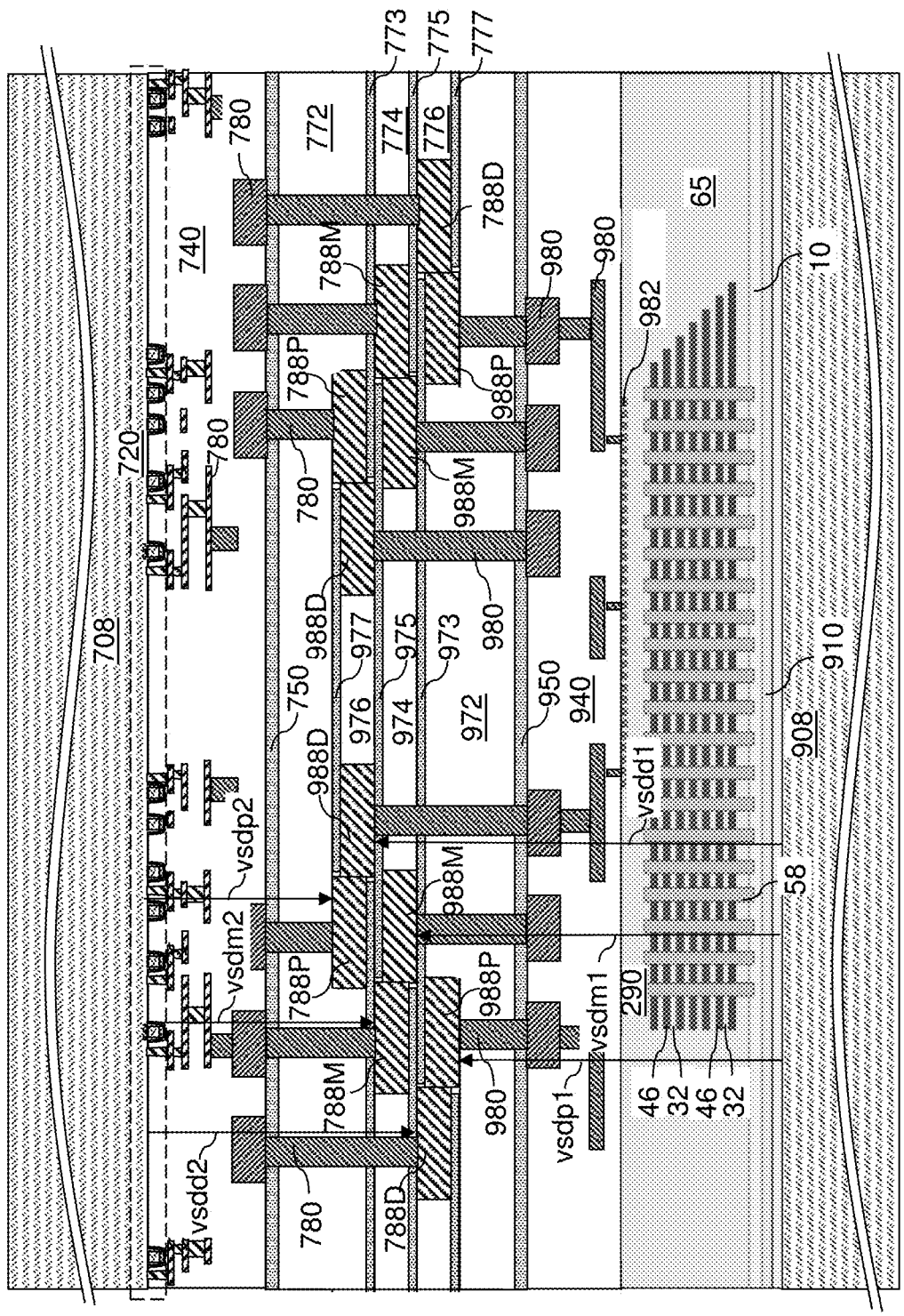

Referring to FIG. 3C, at least one anneal process is performed to induce bonding between the first and the second semiconductor dies. Optionally, dielectric-to-dielectric bonding between the respective cover liners may be performed by annealing the dies at a relatively low temperature, such as 200 degrees Celsius to 300 degrees Celsius. Alternatively, this step may be omitted. Then, an elevated (i.e., higher) temperature anneal is performed to generate metal-to-metal bonding between each mating pair of a first bonding pad 988 and a second bonding pad 788. If the first bonding pads 988 and the second bonding pads 788 include copper, the elevated temperature may be in a range from 300 degrees Celsius to 400 degrees Celsius. The sidewalls of the first bonding pads 988 and the second bonding pads 788 laterally shift outward to contact a respective sidewall of another bonding pad (988, 788). Metal-to-metal bonding is formed between each mating pair of a first bonding pad 988 and a second bonding pad 788 with a bonding interface that is not located within a horizontal plane. In one embodiment, the bonding interfaces between each mating pair of a first bonding pad 988 and a second bonding pad 788 can be vertical. In another embodiment, the bonding interfaces between each mating pair of a first bonding pad 988 and a second bonding pad 788 can have a non-zero taper angle as measured from a vertical direction. The taper angle may be in a range from 0 degrees to 45 degrees, such as from 0 degrees to 10 degrees. Accordingly, the angle between a bonding interface and any horizontal plane parallel to one or both of the major surfaces 908T, 708T of the first and second substrates (908, 708) can be in a range from 45 degrees to 90 degrees, such as from 80 degrees to 90 degrees. In one embodiment, the metal-to-metal bonding can be copper-to-copper bonding. Each mating pair of a first bonding pad 988 and a second bonding pad 788 remain bonded after the bonding process, i.e., after the anneal process.

In one embodiment, the first proximal bonding pads 988P of the first bonding pads 988 can be embedded in the first proximal bonding dielectric layer 972, and can be vertically spaced from the first substrate 908 by a first proximal vertical separation distance vsdp1. The first middle bonding pads 988M of the first bonding pads 988 can be embedded in the first middle bonding dielectric layer 974, and can be vertically spaced from the first substrate 908 by a first middle vertical separation distance vsdm1. The first distal bonding pads 988D of the first bonding pads 988 can be embedded in the first distal bonding dielectric layer 976, and can be vertically spaced from the first substrate 908 by a first distal vertical separation distance vsdd1. The first distal vertical separation distance vsdd1 is greater than the first middle vertical separation distance vsdm1, which is greater than the first proximal vertical separation distance vddp1. In one embodiment, the second proximal bonding pads 788P of the second bonding pads 788 can be embedded in the second proximal bonding dielectric layer 772, and can be vertically spaced from the second substrate 708 by a second proximal vertical separation distance vsdp2. The second middle bonding pads 788M of the second bonding pads 788 can be embedded in the second middle bonding dielectric layer 774, and can be vertically spaced from the second substrate 708 by a second middle vertical separation distance vsdm2. The second distal bonding pads 788D of the second bonding pads 788 can be embedded in the second distal bonding dielectric layer 776, and can be vertically spaced from the second substrate 708 by a second distal vertical separation distance vsdd2. The second distal vertical separation distance vsdd2 is greater than the second middle vertical separation distance vsdm2, which is greater than the second proximal vertical separation distance vddp2.

Generally, the second bonding pads 788 can be bonded to a respective one of the first bonding pads 988 at non-horizontal bonding interfaces at which the first sidewalls of the first bonding pads 988 are bonded to a respective one of the second sidewalls of the second bonding pads 788. In one embodiment, the first proximal bonding pads 988P can be bonded to a respective one of the second distal bonding pads 788D, the first middle bonding pads 988M can be bonded to a respective one of the second middle bonding pads 788M, and the first distal bonding pads 988D can be bonded to a respective one of the second proximal bonding pads 788P. The first proximal bonding pads 988P can be vertically spaced from the second substrate 708 by the first proximal dielectric cover liner 973, and the first distal bonding pads 988D can be vertically spaced from the second substrate 708 by the first distal dielectric cover liner 977.

Figure 4A:
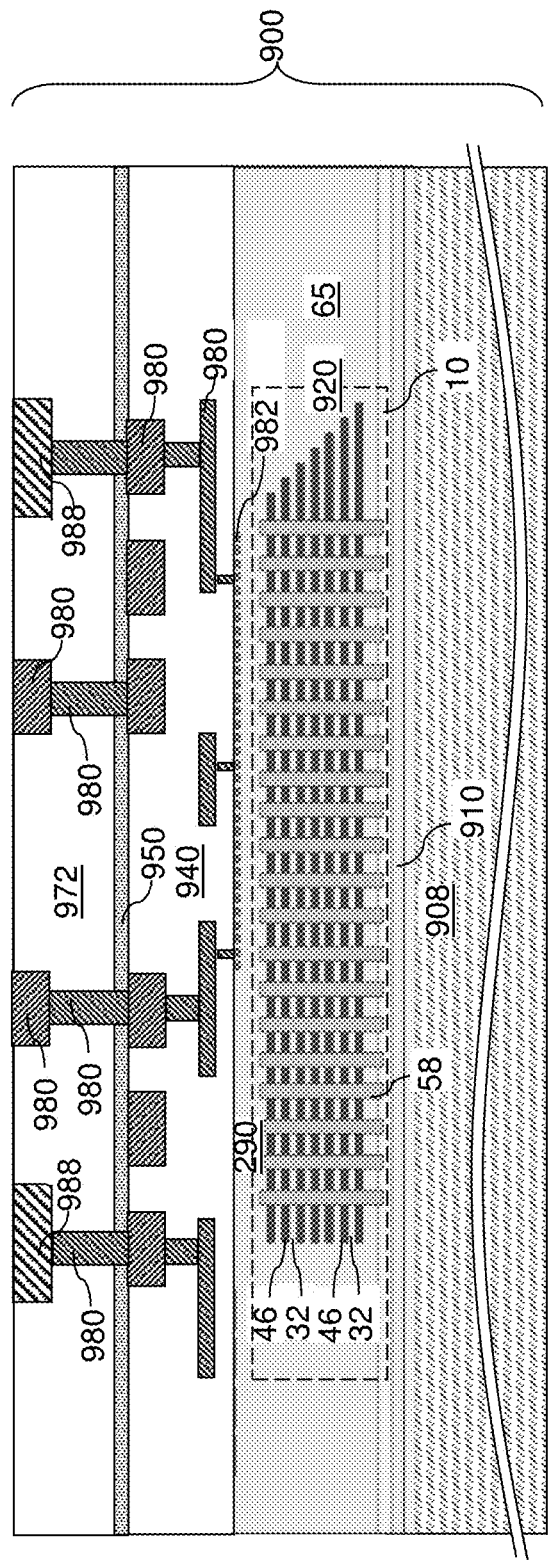
FIGS. 4A-4D are sequential schematic vertical cross-sectional views of a first semiconductor die prior to bonding according to a second embodiment of the present disclosure.

Referring to FIG. 4A, a first semiconductor die 900 according to a second embodiment of the present disclosure is illustrated. The second embodiment differs from the first embodiment in that the middle bonding dielectric layer 974 in the first semiconductor die 900 lacks the middle bonding pads 988M, and is used to vertically separate the proximal and distal bonding pads (988P, 988D). The second semiconductor die 700 has the same configuration. The first semiconductor die 900 according to the second embodiment can be derived from the first semiconductor die 900 of FIG. 1C by forming metal lines as a subset of the additional first metal interconnect structures 980 in the first proximal bonding dielectric layer 972. The metal lines may be formed concurrently with the first proximal bonding pads, which are a subset of the first bonding pads 988 formed in the first proximal bonding dielectric layer 972.

Figure 4B:
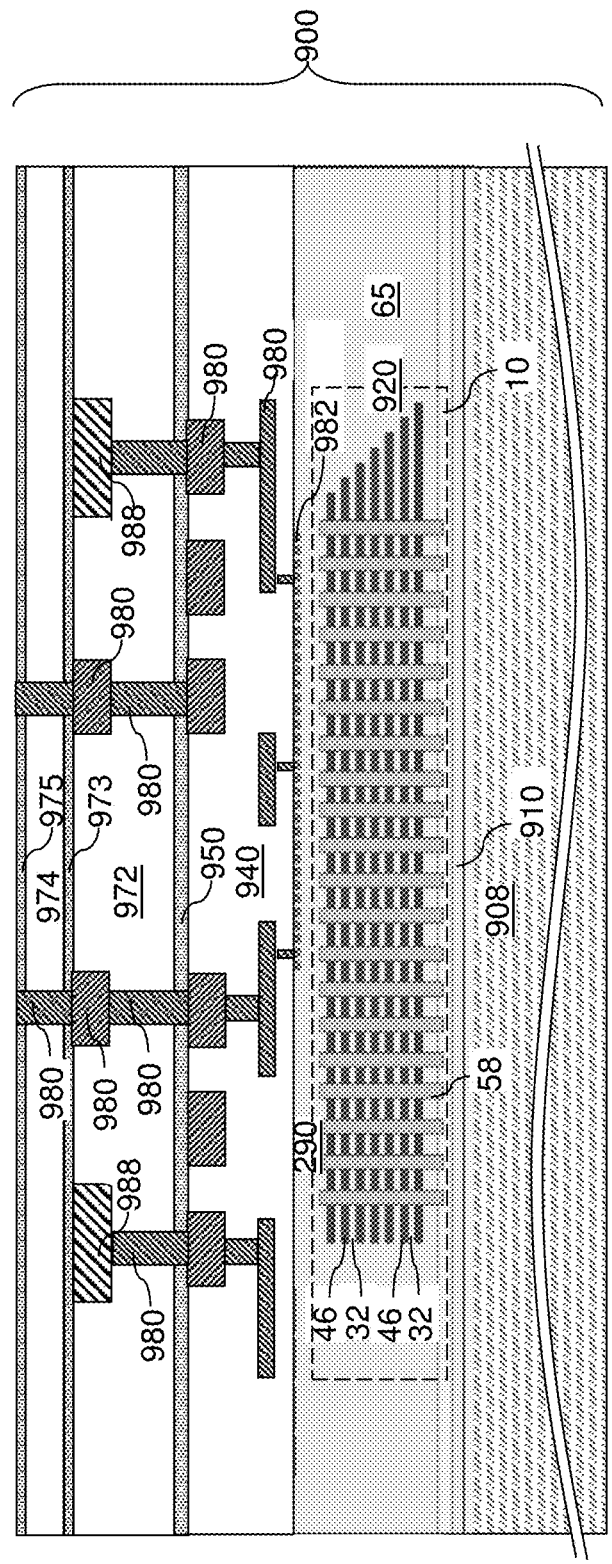

Referring to FIG. 4B, a first proximal dielectric cover liner 973, a first middle bonding dielectric layer 974, and a first middle dielectric cover liner 975 can be sequentially formed over the first proximal bonding dielectric layer 972. The first proximal dielectric cover liner 973 includes a dielectric material that can provide vertical insulation for the first proximal bonding pads after bonding the semiconductor die 900 to a second semiconductor die. For example, the first proximal dielectric cover liner 973 can include silicon nitride, and can have a thickness in a range from 5 nm to 50 nm, although lesser and greater thicknesses can also be employed.

The first middle bonding dielectric layer 974 includes a dielectric material that can embed first bonding pads and additional first metal interconnect structures such as interconnection metal via structures. Further, the first middle bonding dielectric layer 974 can include a dielectric material that can provide dielectric-to-dielectric bonding such as oxide-to-oxide bonding. For example, the first middle bonding dielectric layer 974 can include silicon oxide, and can have a thickness in a range from 200 nm to 500 nm, although lesser and greater thicknesses can also be employed.

The first middle dielectric cover liner 975 can include any material that can be employed for the first proximal dielectric cover liner 973. For example, the first middle dielectric cover liner 975 can include silicon nitride, and can have a thickness in a range from 5 nm to 50 nm, although lesser and greater thicknesses can also be employed.

Via cavities can be formed through the first middle dielectric cover layer 975, the first middle bonding dielectric layer 974, and the first proximal dielectric cover liner 973. A top surface of a first metal interconnect structure 980 embedded in the first proximal bonding dielectric layer 972 can be physically exposed at the bottom of each via cavity. The via cavities are filled with at least one conductive material to form metal via structures, which are a subset of the first metal interconnect structures 980.

Figure 4C:
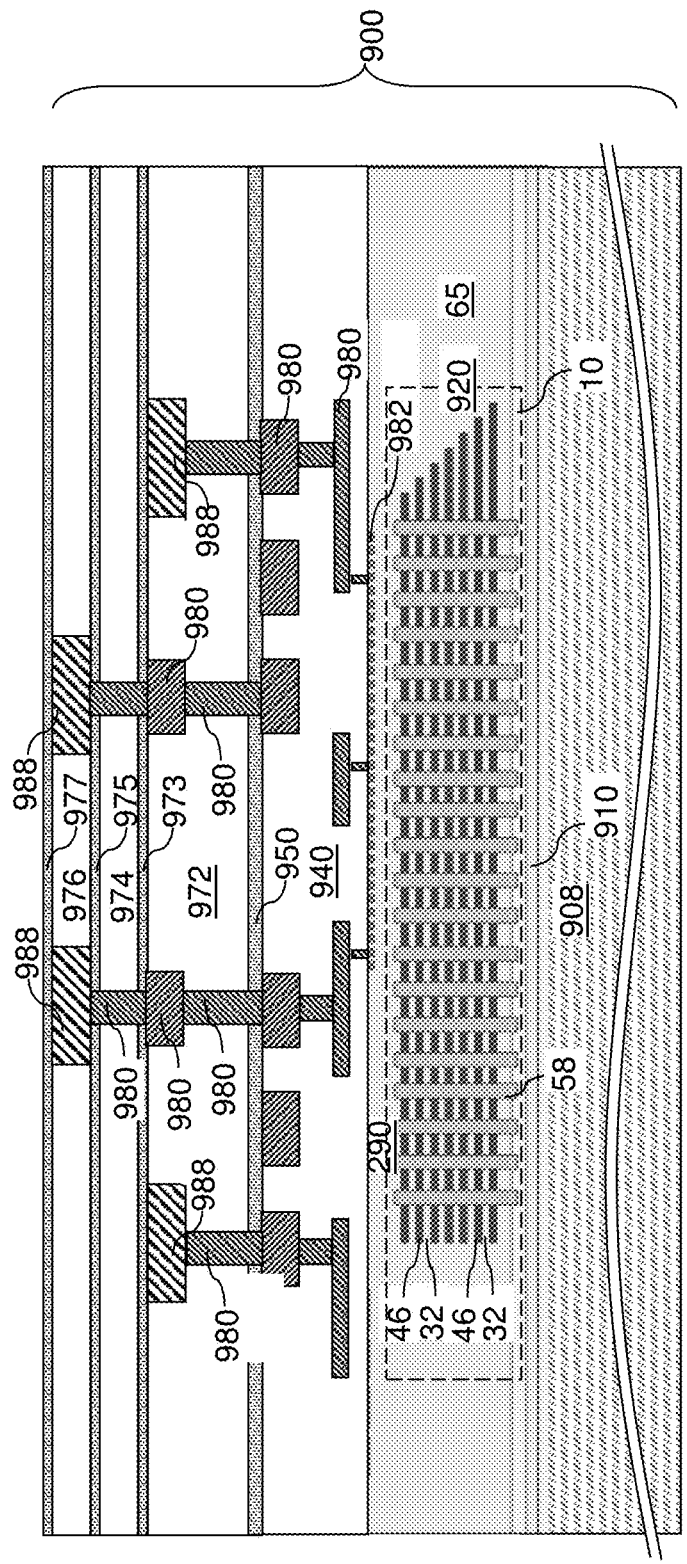

Referring to FIG. 4C, a first distal bonding dielectric layer 976 can be formed over the first middle dielectric cover liner 975. The first distal bonding dielectric layer 976 includes a dielectric material that can embed first bonding pads and additional first metal interconnect structures such as interconnection metal via structures. For example, the first distal bonding dielectric layer 976 can include silicon oxide, and can have a thickness in a range from 200 nm to 500 nm, although lesser and greater thicknesses can also be employed.

Pad cavities are formed through the first distal bonding dielectric layer 976 over a respective one of the metal via structures extending through the first middle dielectric cover liner 975 and the first middle bonding dielectric layer 974. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the first distal bonding dielectric layer 976 by a planarization process such as chemical mechanical planarization (CMP). Each remaining portion of the at least one conductive material that fills a respective pad cavity constitutes an additional first bonding pad 988, which is herein referred to as a first distal bonding pad. Each first bonding pad 988 embedded in the first middle bonding dielectric layer 974 is a first middle bonding pad, and each first bonding pad 988 embedded in the first distal bonding dielectric layer 974 is a first distal bonding pad.

A first distal dielectric cover liner 977 can be formed over the first distal bonding dielectric layer 976. The first distal dielectric cover liner 977 can include any material that can be employed for the first proximal dielectric cover liner 973 and/or for the first middle dielectric cover liner 975. For example, the first distal dielectric cover liner 977 can include silicon nitride, and can have a thickness in a range from 5 nm to 50 nm, although lesser and greater thicknesses can also be employed.

Figure 4D:
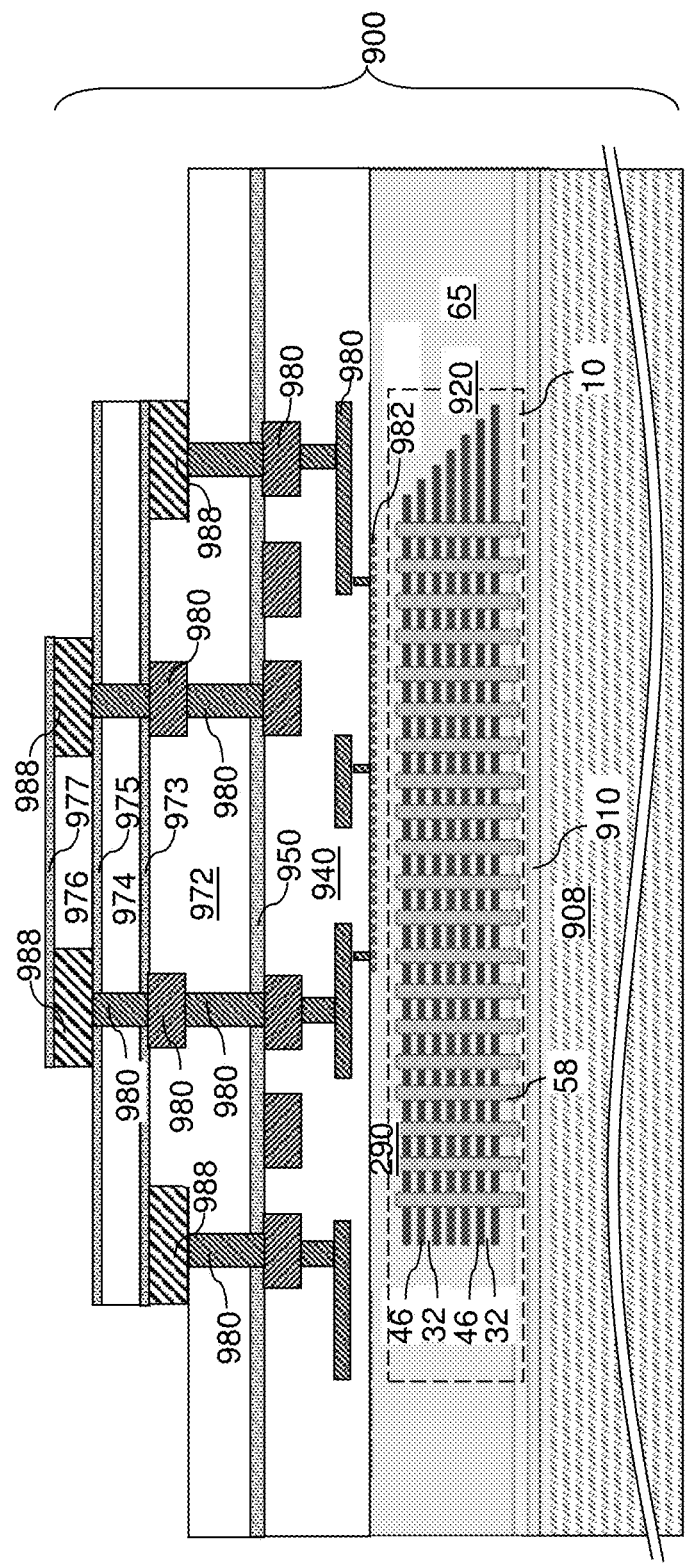

Referring to FIG. 4D, the first distal dielectric cover liner 977, the first distal bonding dielectric layer 976, the first middle dielectric cover layer 975, the first middle bonding dielectric layer 974, the first proximal dielectric cover layer 973, and the proximal bonding dielectric layer 972 can be patterned employing lithographic patterning processes and anisotropic etch processes. Sidewalls of the first bonding pads 988 embedded in the various first bonding dielectric layers (972, 976) are physically exposed.

For example, a first photoresist layer can be applied over the first distal dielectric cover liner 977, and can be lithographically patterned to cover regions including a respective subset of the first distal bonding pads. The edges of each patterned portion of the first photoresist layer can overlie peripheral regions or outer sidewalls of the first distal bonding pads embedded in the first distal bonding dielectric layer 976. A first anisotropic etch process can be performed to transfer the pattern of the first photoresist layer through the first distal dielectric cover liner 977 and the first distal bonding dielectric layer 976. The first middle dielectric cover layer 975 can be employed as an etch stop layer. Sidewalls of the first distal bonding pads can be physically exposed after the first anisotropic etch process. The first photoresist layer can be subsequently removed, for example, by ashing.

A second photoresist layer can be applied over the first distal dielectric cover liner 977 and the first middle dielectric cover liner 975, and can be lithographically patterned to cover regions that include a respective group of first bonding pads 988 located at various levels. The edges of each patterned portion of the second photoresist layer can overlie peripheral regions or outer sidewalls of the first proximal bonding pads embedded in the first proximal bonding dielectric layer 972. A second anisotropic etch process can be performed to transfer the pattern of the second photoresist layer through the first middle dielectric cover layer 975, the first middle bonding dielectric layer 974, the first proximal dielectric cover layer 973, and the proximal bonding dielectric layer 972. Sidewalls of the first proximal bonding pads can be physically exposed after the second anisotropic etch process. The second photoresist layer can be subsequently removed, for example, by ashing.

Different masking and etching schemes may be employed to physically expose sidewalls of each first bonding pad 988. Generally, the first intermediate bonding dielectric layer 974 can be patterned such that each of the first proximal bonding pads underlies a respective remaining patterned portion of the first intermediate bonding dielectric layer 974 and a respective remaining patterned portion of the first proximal dielectric cover line 973.

Figure 5A:
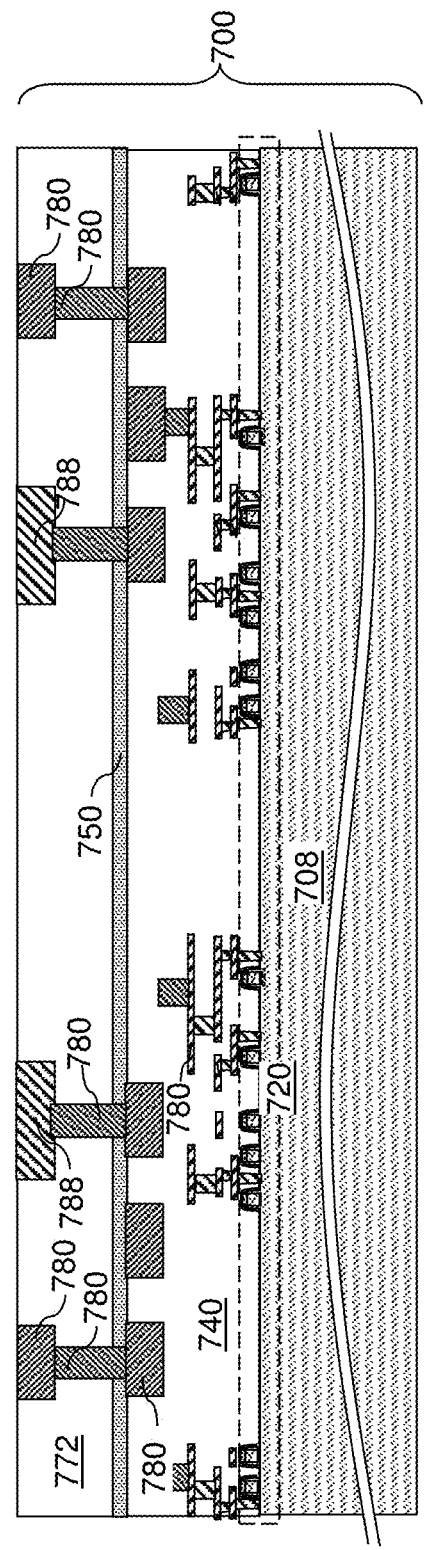
FIGS. 5A-5D are sequential schematic vertical cross-sectional views of a second semiconductor die prior to bonding according to the second embodiment of the present disclosure.

Referring to FIG. 5A, a second semiconductor die 700 according to the second embodiment of the present disclosure is illustrated, which can be derived from the second semiconductor die 700 of FIG. 2A by forming metal via structures and metal lines as a subset of the additional second metal interconnect structures 780 in the second proximal bonding dielectric layer 772 in addition to the second proximal bonding pads. The metal lines may be formed concurrently with the second proximal bonding pads, which are a subset of the second bonding pads 788 formed in the second proximal bonding dielectric layer 772.

Figure 5B:
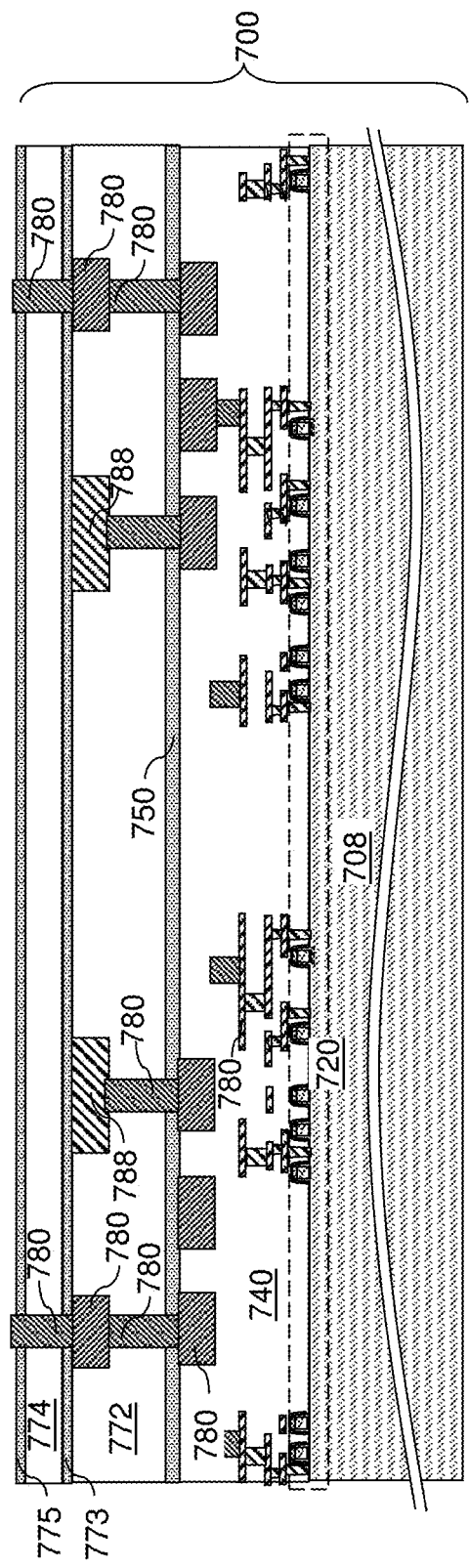

Referring to FIG. 5B, a second proximal dielectric cover liner 773, a second middle bonding dielectric layer 774, and a second middle dielectric cover liner 775 can be sequentially formed over the second proximal bonding dielectric layer 772. The second proximal dielectric cover liner 773 includes a dielectric material that can provide vertical insulation for the second proximal bonding pads after bonding the semiconductor die 700 to a second semiconductor die. For example, the second proximal dielectric cover liner 773 can include silicon nitride, and can have a thickness in a range from 5 nm to 50 nm, although lesser and greater thicknesses can also be employed.

The second middle bonding dielectric layer 774 includes a dielectric material that can embed second bonding pads and additional second metal interconnect structures such as interconnection metal via structures. Further, the second middle bonding dielectric layer 774 can include a dielectric material that can provide dielectric-to-dielectric bonding such as oxide-to-oxide bonding. For example, the second middle bonding dielectric layer 774 can include silicon oxide, and can have a thickness in a range from 200 nm to 500 nm, although lesser and greater thicknesses can also be employed.

The second middle dielectric cover liner 775 can include any material that can be employed for the second proximal dielectric cover liner 773. For example, the second middle dielectric cover liner 775 can include silicon nitride, and can have a thickness in a range from 5 nm to 50 nm, although lesser and greater thicknesses can also be employed.

Via cavities can be formed through the second middle dielectric cover layer 775, the second middle bonding dielectric layer 774, and the second proximal dielectric cover liner 773. A top surface of a second metal interconnect structure 780 embedded in the second proximal bonding dielectric layer 772 can be physically exposed at the bottom of each via cavity. The via cavities are filled with at least one conductive material to form metal via structures, which are a subset of the second metal interconnect structures 780.

Figure 5C:
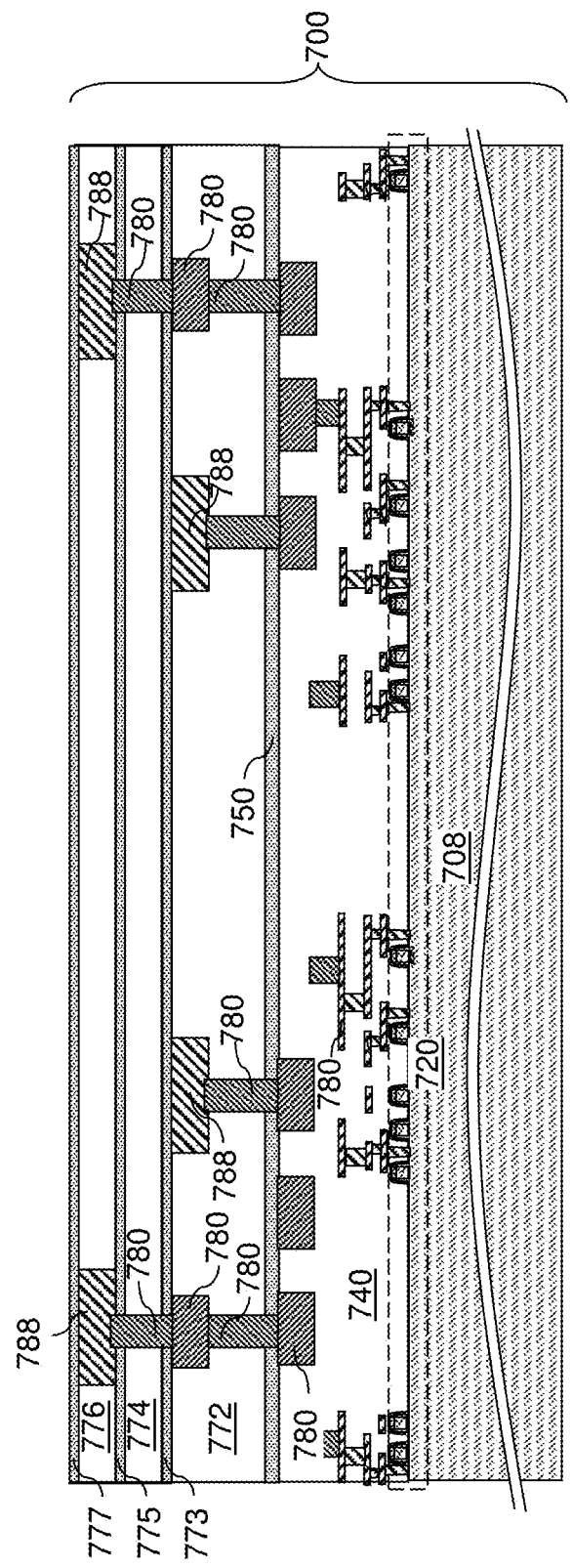

Referring to FIG. 5C, a second distal bonding dielectric layer 776 can be formed over the second middle dielectric cover liner 775. The second distal bonding dielectric layer 776 includes a dielectric material that can embed second bonding pads and additional second metal interconnect structures such as interconnection metal via structures. For example, the second distal bonding dielectric layer 776 can include silicon oxide, and can have a thickness in a range from 200 nm to 500 nm, although lesser and greater thicknesses can also be employed.

Pad cavities are formed through the second distal bonding dielectric layer 776 over a respective one of the metal via structures extending through the second middle dielectric cover liner 775 and the second middle bonding dielectric layer 774. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the second distal bonding dielectric layer 776 by a planarization process such as chemical mechanical planarization (CMP). Each remaining portion of the at least one conductive material that fills a respective pad cavity constitutes an additional second bonding pad 788, which is herein referred to as a second distal bonding pad. Each second bonding pad 788 embedded in the second middle bonding dielectric layer 774 is a second middle bonding pad, and each second bonding pad 788 embedded in the second distal bonding dielectric layer 774 is a second distal bonding pad.

A second distal dielectric cover liner 777 can be formed over the second distal bonding dielectric layer 776. The second distal dielectric cover liner 777 can include any material that can be employed for the second proximal dielectric cover liner 773 and/or for the second middle dielectric cover liner 775. For example, the second distal dielectric cover liner 777 can include silicon nitride, and can have a thickness in a range from 5 nm to 50 nm, although lesser and greater thicknesses can also be employed.

Figure 5D:
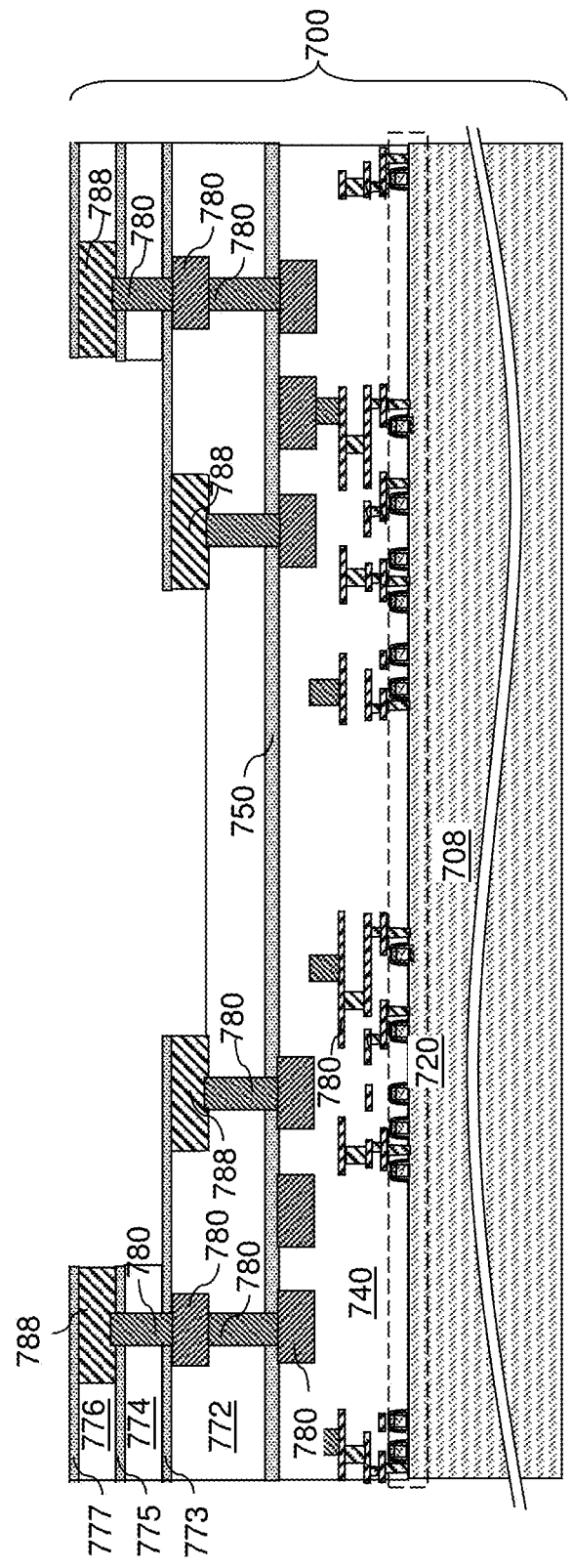

Referring to FIG. 5D, the second distal dielectric cover liner 777, the second distal bonding dielectric layer 776, the second middle dielectric cover layer 775, the second middle bonding dielectric layer 774, the second proximal dielectric cover layer 773, and the second proximal bonding dielectric layer 772 can be patterned employing lithographic patterning processes and anisotropic etch processes. Sidewalls of the second bonding pads 788 embedded in the various second bonding dielectric layers (772, 776) are physically exposed.

For example, a first photoresist layer can be applied over the second distal dielectric cover liner 777, and can be lithographically patterned to cover regions including a respective subset of the second distal bonding pads. The edges of each patterned portion of the first photoresist layer can overlie peripheral regions or outer sidewalls of the second distal bonding pads embedded in the second distal bonding dielectric layer 776. A first anisotropic etch process can be performed to transfer the pattern of the first photoresist layer through the second distal dielectric cover liner 777 and the second distal bonding dielectric layer 776. The second middle dielectric cover layer 775 can be employed as an etch stop layer. Sidewalls of the second distal bonding pads can be physically exposed after the second anisotropic etch process. The second photoresist layer can be subsequently removed, for example, by ashing.

A second photoresist layer can be applied over the second distal dielectric cover liner 777 and the second middle dielectric cover liner 775, and can be lithographically patterned to cover regions that include a respective group of second bonding pads 788 located at various levels. The edges of each patterned portion of the second photoresist layer can overlie peripheral regions or outer sidewalls of the second proximal bonding pads embedded in the second proximal bonding dielectric layer 772. A second anisotropic etch process can be performed to transfer the pattern of the second photoresist layer through the second middle dielectric cover layer 775, the second middle bonding dielectric layer 774, the second proximal dielectric cover layer 773, and the second proximal bonding dielectric layer 772. Sidewalls of the second proximal bonding pads can be physically exposed after the second anisotropic etch process. The second photoresist layer can be subsequently removed, for example, by ashing.

Different masking and etching schemes may be employed to physically expose sidewalls of each second bonding pad 788. Generally, the second intermediate bonding dielectric layer 774 can be patterned such that each of the second proximal bonding pads underlies a respective remaining patterned portion of the second intermediate bonding dielectric layer 774 and a respective remaining patterned portion of the second proximal dielectric cover line 773.

Figure 6A:
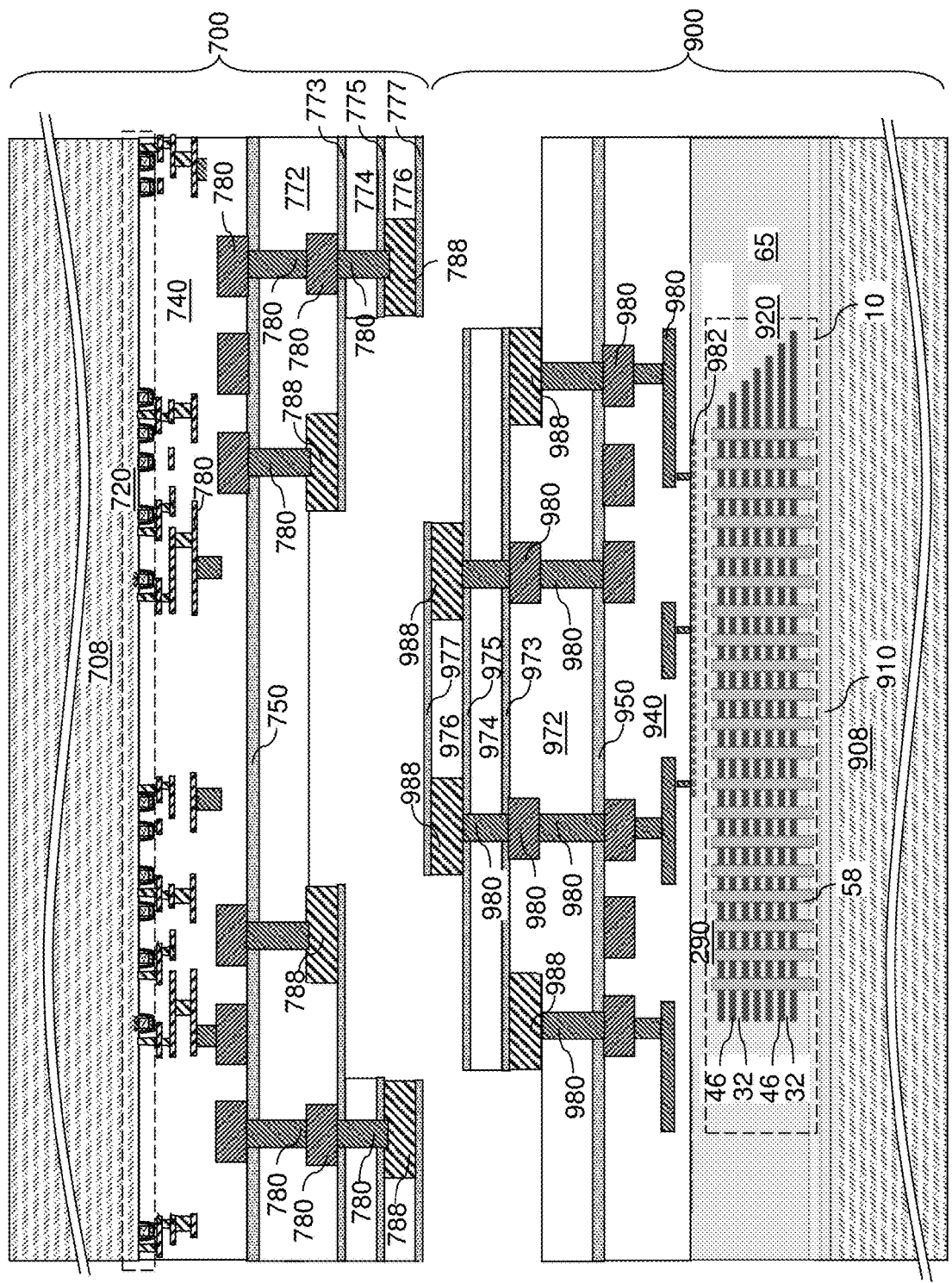
FIGS. 6A-6C are sequential schematic vertical cross-sectional view of a second exemplary structure during formation of a bonded assembly according to the second embodiment of the present disclosure.

Referring to FIG. 6A, the first semiconductor die 900 and the second semiconductor die 700 are oriented such that the first bonding dielectric layers (972, 974, 976) face the second bonding dielectric layers (772, 774, 776). The pattern of the first bonding pads 988 and the pattern of the second bonding pads 788, and the thicknesses of the various dielectric material layers (972, 973, 974, 975, 976, 977) in the first semiconductor die 900 and the thicknesses of the various dielectric material layers (772, 773, 774, 775, 776, 777) in the second semiconductor die 700 can be selected such that each protruding structure of the first semiconductor die 900 can protrude into a respective recessed region of the second semiconductor die 700, and vice versa.

Figure 6B:
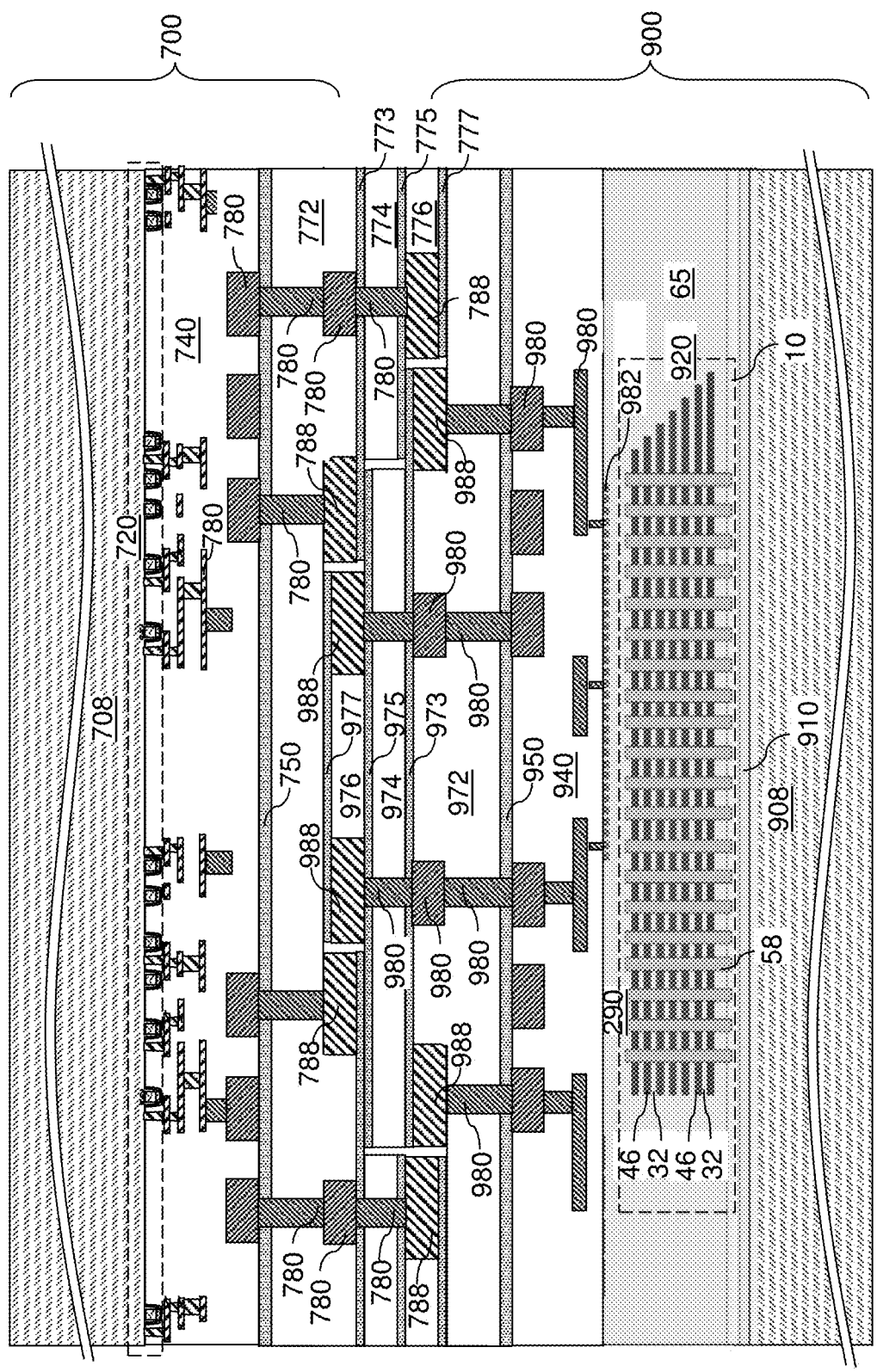

Referring to FIG. 6B, the second semiconductor die 700 and the first semiconductor die 900 are brought into contact such that the dielectric material layers (972, 973, 974, 975, 976, 977) in the first semiconductor die 900 contact the dielectric material layers (772, 773, 774, 775, 776, 777) in the second semiconductor die 700. The first semiconductor die 900 and the second semiconductor die 700 may be laterally aligned such that each second bonding pad 788 has a sidewall that faces a sidewall of a respective one of the first bonding pads 988. The sidewalls of the first bonding pads 988 and the sidewalls of the second bonding pads 788 are positioned such that each pair of a sidewall of a first bonding pad 988 and a sidewall of a second bonding pad 788 to be bonded are laterally spaced from each other by a lateral spacing that is not greater than the sum of the lateral expansion distance of the sidewall of the first bonding pad 988 and the lateral expansion distance of the sidewall of the second bonding pad 788 during a subsequent anneal process to be employed for bonding the first bonding pads 988 to the second bonding pads 788. The lateral expansion distances of sidewalls of the bonding pads (988, 788), i.e., the lateral distance by which the sidewalls of the bonding pads (988, 788) move during an anneal process due to thermal expansion of the metallic material therein, are dependent on the material of the bonding pads (988, 788), and on the geometry and the dimensions of the bonding pads (988, 788). For example, if the lateral expansion distance of the sidewalls of the each bonding pad (988, 788) is in a range from 25 nm to 100 nm, the lateral spacing between each facing pair of a sidewall of a first bonding pad 988 and a sidewall of a second bonding pad 788 can be in a range from 5 nm to 200 nm, such as from 10 nm to 100 nm, and/or from 20 nm to 60 nm.

Figure 6C:
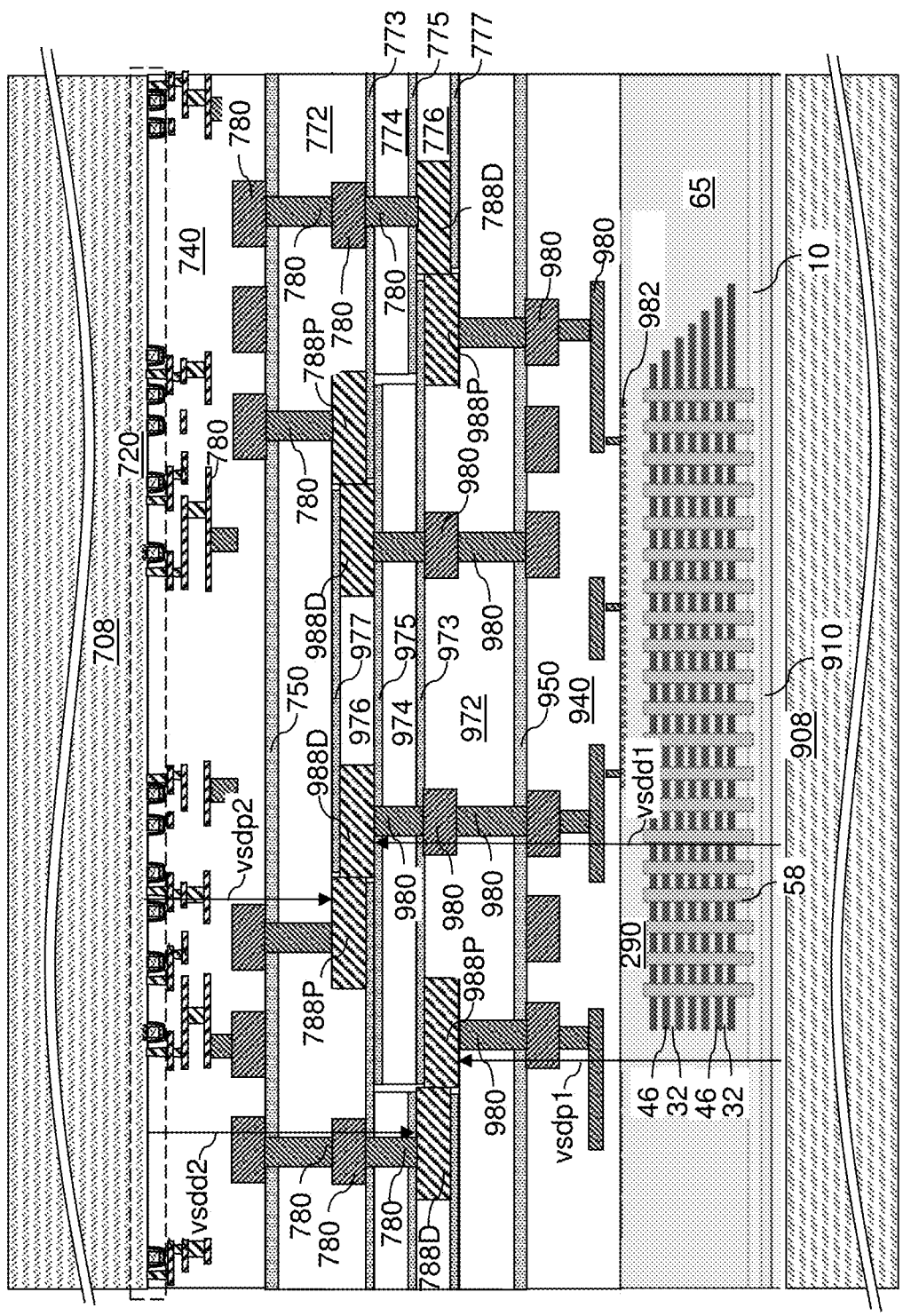

Referring to FIG. 6C, an anneal process at an elevated temperature to induce metal-to-metal bonding between each mating pair of a first bonding pads 988 and a second bonding pad 788. If the first bonding pads 988 and the second bonding pads 788 include copper, the elevated temperature may be in a range from 300 degrees Celsius to 400 degrees Celsius. The sidewalls of the first bonding pads 988 and the second bonding pads 788 laterally shift outward to contact a respective sidewall of another bonding pad (988, 788). Metal-to-metal bonding is formed between each mating pair of a first bonding pad 988 and a second bonding pad 788 with a bonding interface that is not located within a horizontal plane. In one embodiment, the bonding interfaces between each mating pair of a first bonding pad 988 and a second bonding pad 788 can be vertical. In another embodiment, the bonding interfaces between each mating pair of a first bonding pad 988 and a second bonding pad 788 can have a non-zero taper angle as measured from a vertical direction. The taper angle may be in a range from 0 degrees to 45 degrees, such as from 0 degrees to 10 degrees. Accordingly, the angle between a bonding interface and any horizontal plane can be in a range from 45 degrees to 90 degrees, such as from 80 degrees to 90 degrees. In one embodiment, the metal-to-metal bonding can be copper-to-copper bonding. Each mating pair of a first bonding pad 988 and a second bonding pad 788 remain bonded after the bonding process, i.e., after the anneal process.

In one embodiment, the first proximal bonding pads 988P of the first bonding pads 988 can be embedded in the first proximal bonding dielectric layer 972, and can be vertically spaced from the first substrate 908 by a first proximal vertical separation distance vsdp1. The first distal bonding pads 988D of the first bonding pads 988 can be embedded in the first distal bonding dielectric layer 976, and can be vertically spaced from the first substrate 908 by a first distal vertical separation distance vsdd1. The first distal vertical separation distance vsdd1 is greater than the first proximal vertical separation distance vddp1. In one embodiment, the second proximal bonding pads 788P of the second bonding pads 788 can be embedded in the second proximal bonding dielectric layer 772, and can be vertically spaced from the second substrate 708 by a second proximal vertical separation distance vsdp2. The second distal bonding pads 788D of the second bonding pads 788 can be embedded in the second distal bonding dielectric layer 776, and can be vertically spaced from the second substrate 708 by a second distal vertical separation distance vsdd2. The second distal vertical separation distance vsdd2 is greater than the second proximal vertical separation distance vddp2.

Generally, the second bonding pads 788 can be bonded to a respective one of the first bonding pads 988 at non-horizontal bonding interfaces at which the first sidewalls of the first bonding pads 988 are bonded to a respective one of the second sidewalls of the second bonding pads 788. In one embodiment, the first proximal bonding pads 988P can be bonded to a respective one of the second distal bonding pads 788D, and the first distal bonding pads 988D can be bonded to a respective one of the second proximal bonding pads 788P. The first proximal bonding pads 988P can be vertically spaced from the second substrate 708 by the first proximal dielectric cover liner 973, the first middle bonding dielectric layer 974, and the first middle dielectric cover liner 975. The first distal bonding pads 988D can be vertically spaced from the second substrate 708 by the first distal dielectric cover liner 977.

Figure 7A:
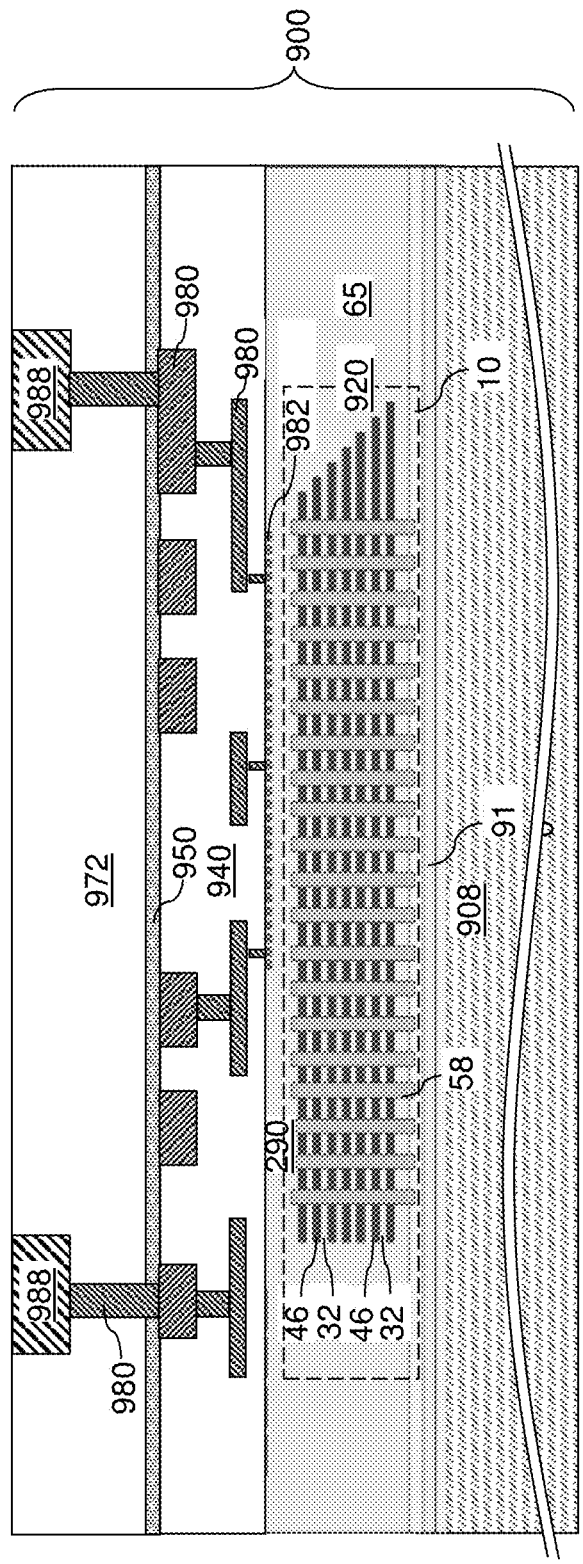
FIGS. 7A-7C are sequential schematic vertical cross-sectional views of a first semiconductor die prior to bonding according to a third embodiment of the present disclosure.

Referring to FIG. 7A, a first semiconductor die 900 according to a third embodiment of the present disclosure is illustrated. The third embodiment differs from the first and second embodiment in that the dielectric liners are omitted in one or both semiconductor dies. The first semiconductor die 900 of the third embodiment may be the same as the first semiconductor die 900 illustrated in FIG. 1C. In one embodiment, the first proximal bonding dielectric layer 972 can include a dielectric material that can provide dielectric-to-dielectric bonding such as oxide-to-oxide bonding. For example, the first proximal bonding dielectric layer 972 can include silicon oxide.

Figure 7B:
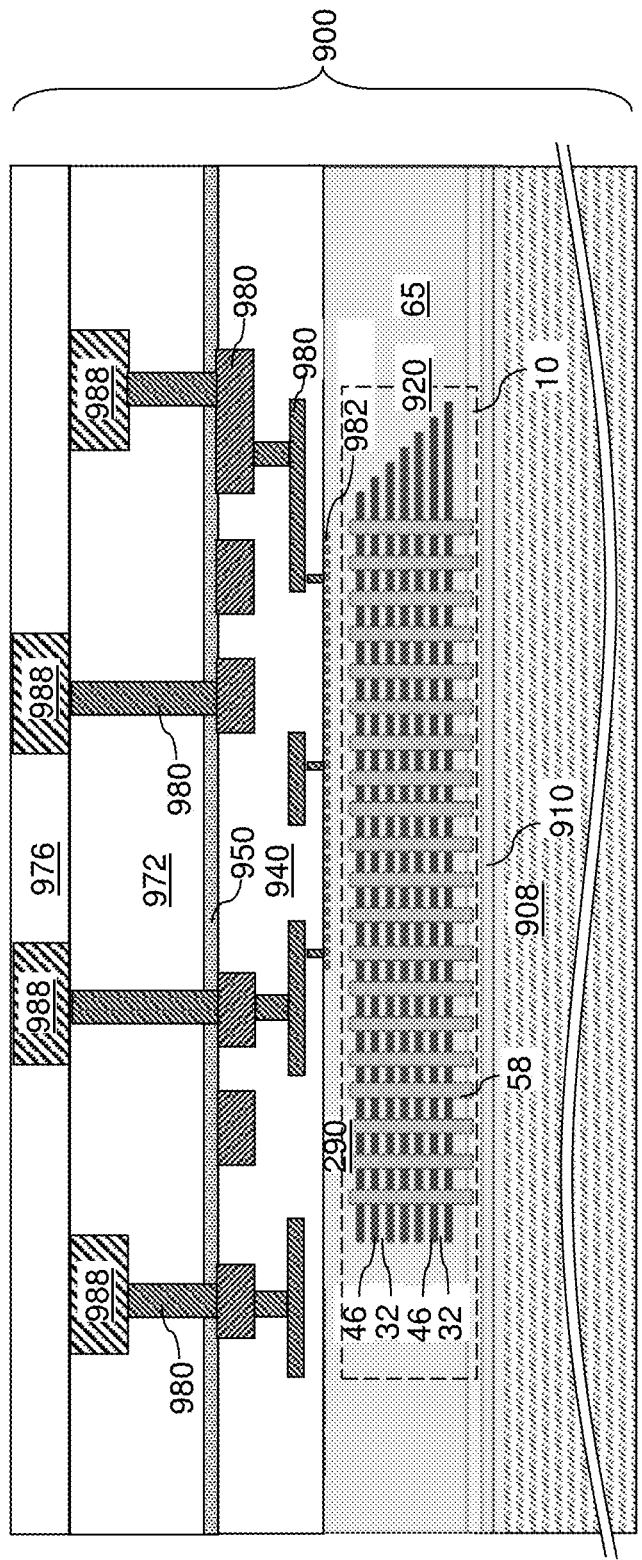

Referring to FIG. 7B, via cavities can be formed through the first proximal bonding dielectric layer 972 and the second passivation dielectric layer 750. A top surface of a first metal interconnect structure 980 embedded in the first interconnect-level dielectric layers 940 can be physically exposed at the bottom of each via cavity. The via cavities are filled with at least one conductive material to form metal via structures, which are a subset of the first metal interconnect structures 980.

A first distal bonding dielectric layer 976 can be formed over the first proximal bonding dielectric layer 972. The first distal bonding dielectric layer 976 includes a dielectric material that can embed first bonding pads and additional first metal interconnect structures such as interconnection metal via structures. Further, the first distal bonding dielectric layer 976 can include a dielectric material that can provide dielectric-to-dielectric bonding such as oxide-to-oxide bonding. For example, the first distal bonding dielectric layer 976 can include silicon oxide, and can have a thickness in a range from 200 nm to 500 nm, although lesser and greater thicknesses can also be employed.

Pad cavities are formed through the first distal bonding dielectric layer 976 over a respective one of the metal via structures extending through the first proximal bonding dielectric layer 972. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the first distal bonding dielectric layer 976 by a planarization process such as chemical mechanical planarization (CMP). Each remaining portion of the at least one conductive material that fills a respective pad cavity constitutes an additional first bonding pad 988, which is herein referred to as a first distal bonding pad. Each first bonding pad 988 embedded in the first proximal bonding dielectric layer 972 is a first proximal bonding pad, and each first bonding pad 988 embedded in the first distal bonding dielectric layer 974 is a first distal bonding pad.

Figure 7C:
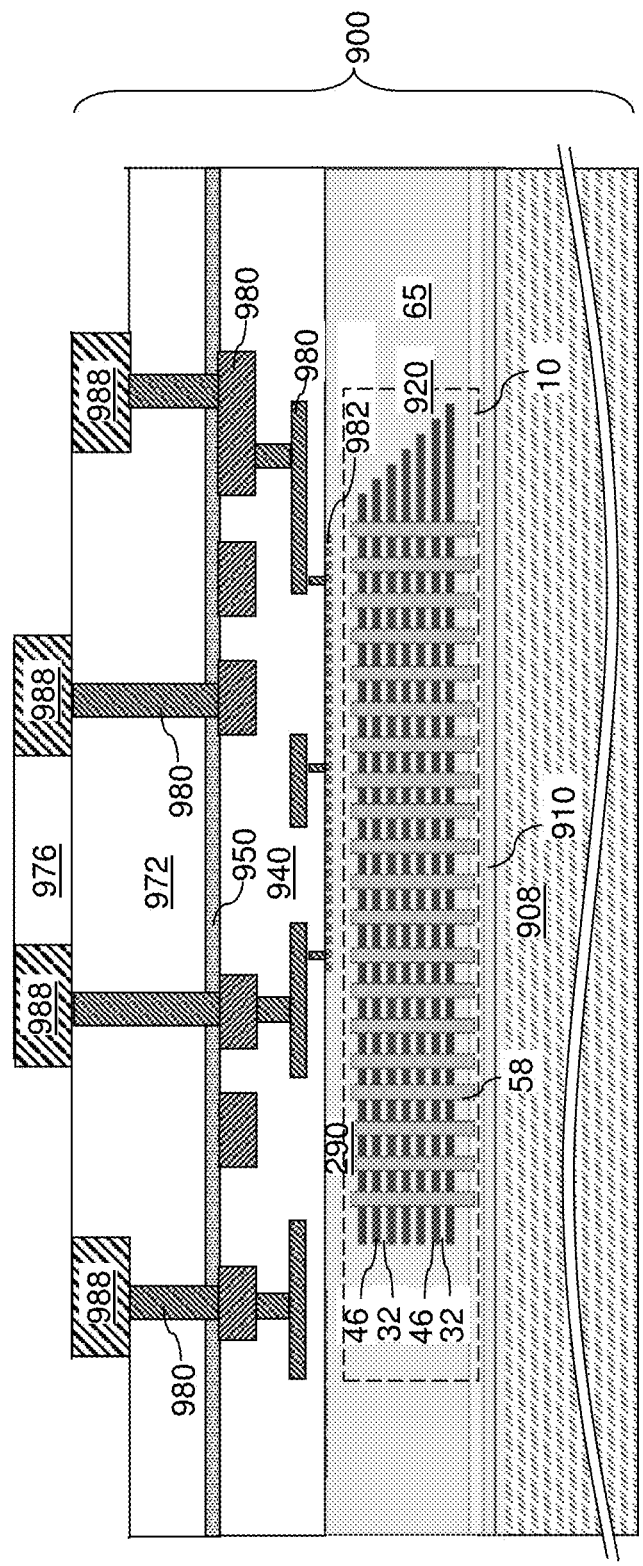

Referring to FIG. 7C, the first distal bonding dielectric layer 976 and the first proximal bonding dielectric layer 972 can be patterned employing lithographic patterning processes and anisotropic etch processes. Sidewalls of the first bonding pads 988 embedded in the various first bonding dielectric layers (972, 976) are physically exposed.

For example, a first photoresist layer can be applied over the first distal bonding dielectric layer 976, and can be lithographically patterned to cover regions including a respective subset of the first distal bonding pads. The edges of each patterned portion of the first photoresist layer can overlie peripheral regions or outer sidewalls of the first distal bonding pads embedded in the first distal bonding dielectric layer 976. A first anisotropic etch process can be performed to transfer the pattern of the first photoresist layer through the first distal bonding dielectric layer 976. Sidewalls of the first distal bonding pads can be physically exposed after the first anisotropic etch process. The first photoresist layer can be subsequently removed, for example, by ashing.

A second photoresist layer can be applied over the first distal bonding dielectric layer 976 and the first proximal bonding dielectric layer 972, and can be lithographically patterned to cover regions that include a respective group of first bonding pads 988 located at various levels. The edges of each patterned portion of the second photoresist layer can overlie peripheral regions or outer sidewalls of the first proximal bonding pads embedded in the first proximal bonding dielectric layer 972. A second anisotropic etch process can be performed to transfer the pattern of the second photoresist layer through an upper portion of the first proximal bonding dielectric layer 972. Sidewalls of the first proximal bonding pads can be physically exposed after the second anisotropic etch process. The second photoresist layer can be subsequently removed, for example, by ashing.

Different masking and etching schemes may be employed to physically expose sidewalls of each first bonding pad 988. First bonding pads 988 located at different levels are laterally offset from each other to prevent electrical shorts between them.

Figure 8A:
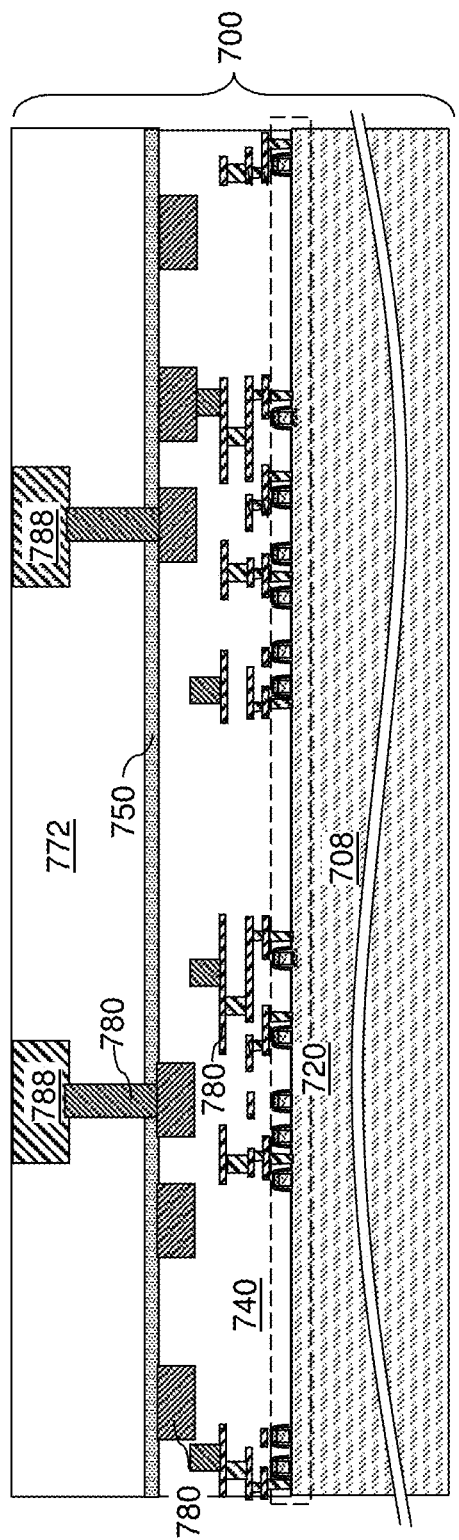
FIGS. 8A-8C are sequential schematic vertical cross-sectional views of a second semiconductor die prior to bonding according to the third embodiment of the present disclosure.

Referring to FIG. 8A, a second semiconductor die 700 according to the third embodiment of the present disclosure is illustrated, which may be derived from the second semiconductor die 700 of FIG. 2A by forming additional second metal interconnect structure 780 and second proximal bonding pads in the second proximal bonding dielectric layer 772. For example, pad-level cavities can be formed in the second proximal bonding dielectric layer 772 by performing at least one combination of a lithographic patterning process that applies and patterns a photoresist layer to form openings therethrough and an anisotropic etch process that transfers the pattern of the openings at least partially through the second proximal bonding dielectric layer 772. The pad-level cavities may include pad and via cavities in which via cavities vertically extending to a top surface of a respective underlying on the second metal interconnect structures 780 are adjoined to an overlying pad cavity having the shape of pad, which may have a polygonal shape, a rounded polygonal shape, or a generally curvilinear two-dimensional shape. At least one conductive material such as a conductive metallic liner material (e.g., TiN, TaN, and/or WN) and a conductive metallic fill material that enables metal-to-metal bonding (such as copper) can be deposited in the pad-level cavities. Excess portions of the at least one conductive material can be removed from above the horizontal plane including the top surface of the second proximal bonding dielectric layer 772 by a planarization process such as chemical mechanical planarization (CMP). Each remaining portion of the at least one conductive material that fills a respective pad-level cavity constitutes an integrated pad and via structure that includes a second bonding pad 788 and a metal via structure, which is an additional second metal interconnect structure 780.

Figure 8B:
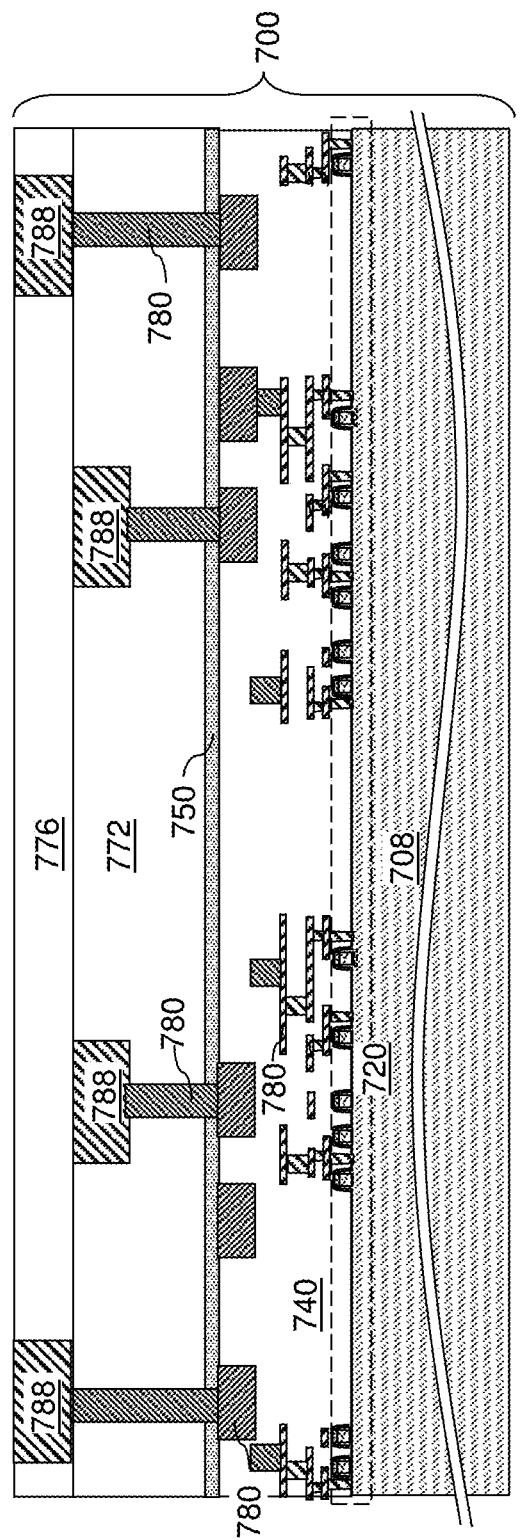

Referring to FIG. 8B, via cavities can be formed through the second proximal bonding dielectric layer 772 and the second passivation dielectric layer 750. A top surface of a second metal interconnect structure 780 embedded in the second interconnect-level dielectric layers 740 can be physically exposed at the bottom of each via cavity. The via cavities are filled with at least one conductive material to form metal via structures, which are a subset of the second metal interconnect structures 780.

A second distal bonding dielectric layer 776 can be formed over the second proximal bonding dielectric layer 772. The second distal bonding dielectric layer 776 includes a dielectric material that can embed second bonding pads and additional second metal interconnect structures such as interconnection metal via structures. Further, the second distal bonding dielectric layer 776 can include a dielectric material that can provide dielectric-to-dielectric bonding such as oxide-to-oxide bonding. For example, the second distal bonding dielectric layer 776 can include silicon oxide, and can have a thickness in a range from 200 nm to 500 nm, although lesser and greater thicknesses can also be employed.

Pad cavities are formed through the second distal bonding dielectric layer 776 over a respective one of the metal via structures extending through the second proximal bonding dielectric layer 772. The pad cavities are filled with at least one conductive material such as a conductive metallic liner material (e.g., TiN, TaN, and/or WN) and a conductive metallic fill material that enables metal-to-metal bonding (such as copper). Excess portions of the at least one conductive material can be removed from above the horizontal plane including the top surface of the second distal bonding dielectric layer 776 by a planarization process such as chemical mechanical planarization (CMP). Each remaining portion of the at least one conductive material that fills a respective pad cavity constitutes an additional second bonding pad 788, which is herein referred to as a second distal bonding pad. Each second bonding pad 788 embedded in the second proximal bonding dielectric layer 772 is a second proximal bonding pad, and each second bonding pad 788 embedded in the second distal bonding dielectric layer 774 is a second distal bonding pad.

Figure 8C:
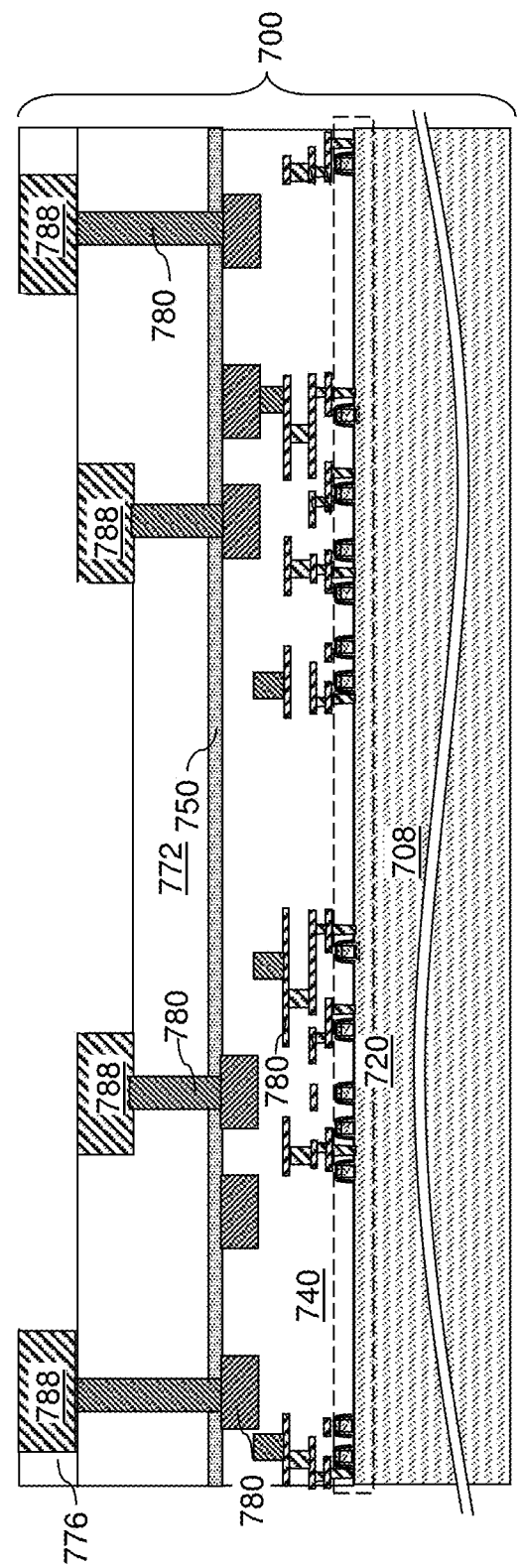

Referring to FIG. 8C, the second distal bonding dielectric layer 776 and the second proximal bonding dielectric layer 772 can be patterned employing lithographic patterning processes and anisotropic etch processes. Sidewalls of the second bonding pads 788 embedded in the various second bonding dielectric layers (772, 776) are physically exposed.

For example, a first photoresist layer can be applied over the second distal bonding dielectric layer 776, and can be lithographically patterned to cover regions including a respective subset of the second distal bonding pads. The edges of each patterned portion of the first photoresist layer can overlie peripheral regions or outer sidewalls of the second distal bonding pads embedded in the second distal bonding dielectric layer 776. A first anisotropic etch process can be performed to transfer the pattern of the first photoresist layer through the second distal bonding dielectric layer 776. Sidewalls of the second distal bonding pads can be physically exposed after the first anisotropic etch process. The first photoresist layer can be subsequently removed, for example, by ashing.

A second photoresist layer can be applied over the second distal bonding dielectric layer 776 and the second proximal bonding dielectric layer 772, and can be lithographically patterned to cover regions that include a respective group of second bonding pads 788 located at various levels. The edges of each patterned portion of the second photoresist layer can overlie peripheral regions or outer sidewalls of the second proximal bonding pads embedded in the second proximal bonding dielectric layer 772. A second anisotropic etch process can be performed to transfer the pattern of the second photoresist layer through an upper portion of the second proximal bonding dielectric layer 772. Sidewalls of the second proximal bonding pads can be physically exposed after the second anisotropic etch process. The second photoresist layer can be subsequently removed, for example, by ashing.

Different masking and etching schemes may be employed to physically expose sidewalls of each second bonding pad 788. Second bonding pads 788 located at different levels are laterally offset from each other to prevent electrical shorts between them.

Figure 9A:
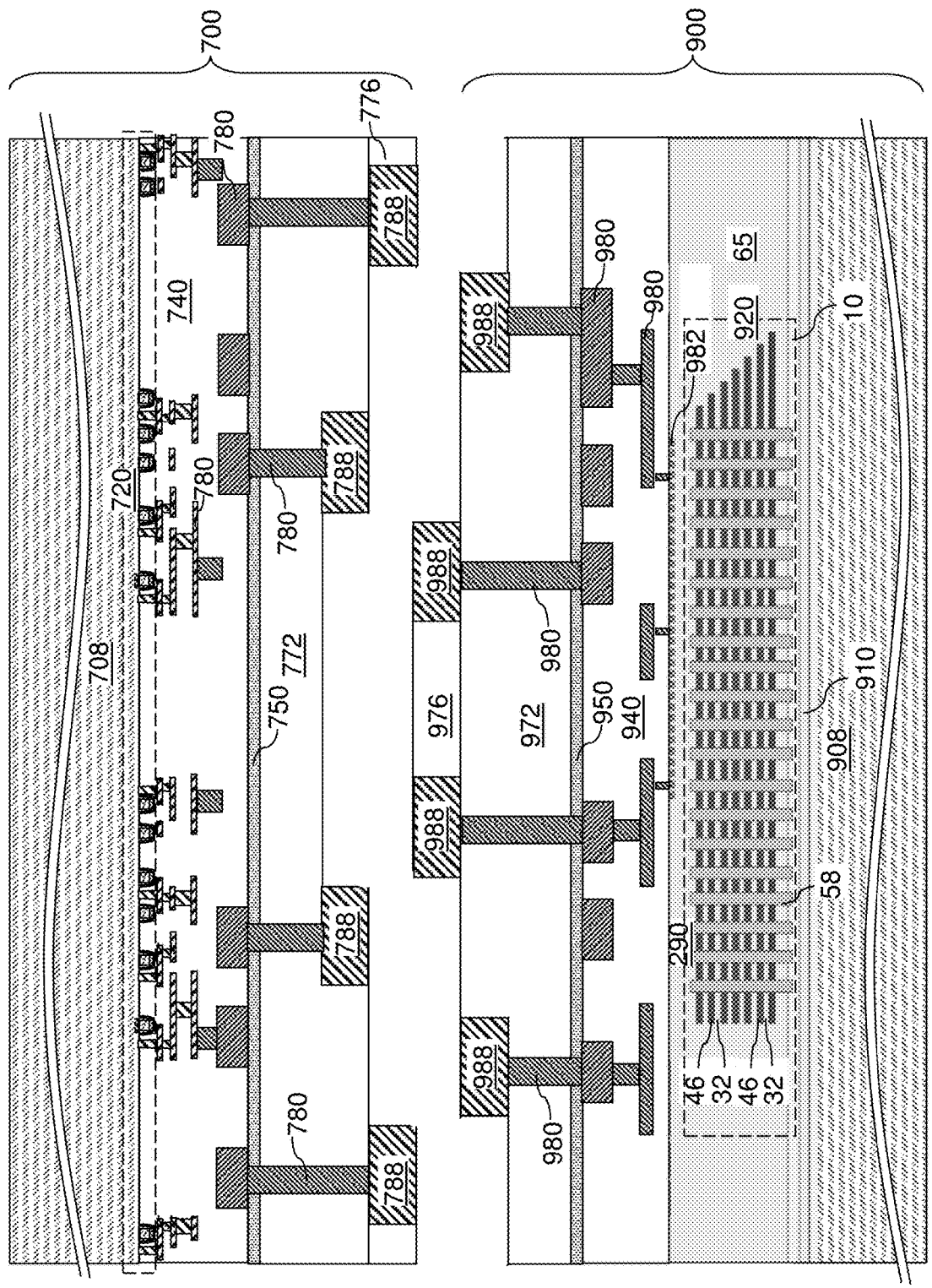
FIGS. 9A-9C are sequential schematic vertical cross-sectional view of a third exemplary structure during formation of a bonded assembly according to the third embodiment of the present disclosure.

Referring to FIG. 9A, the first semiconductor die 900 and the second semiconductor die 700 are oriented such that the first bonding dielectric layers (972, 976) face the second bonding dielectric layers (772, 776). The pattern of the first bonding pads 988 and the pattern of the second bonding pads 788, and the thicknesses of the first bonding dielectric layers (972, 976) in the first semiconductor die 900 and the thicknesses of the second bonding dielectric layers (772, 776) in the second semiconductor die 700 can be selected such that each protruding structure of the first semiconductor die 900 can protrude into a respective recessed region of the second semiconductor die 700, and vice versa.

Figure 9B:
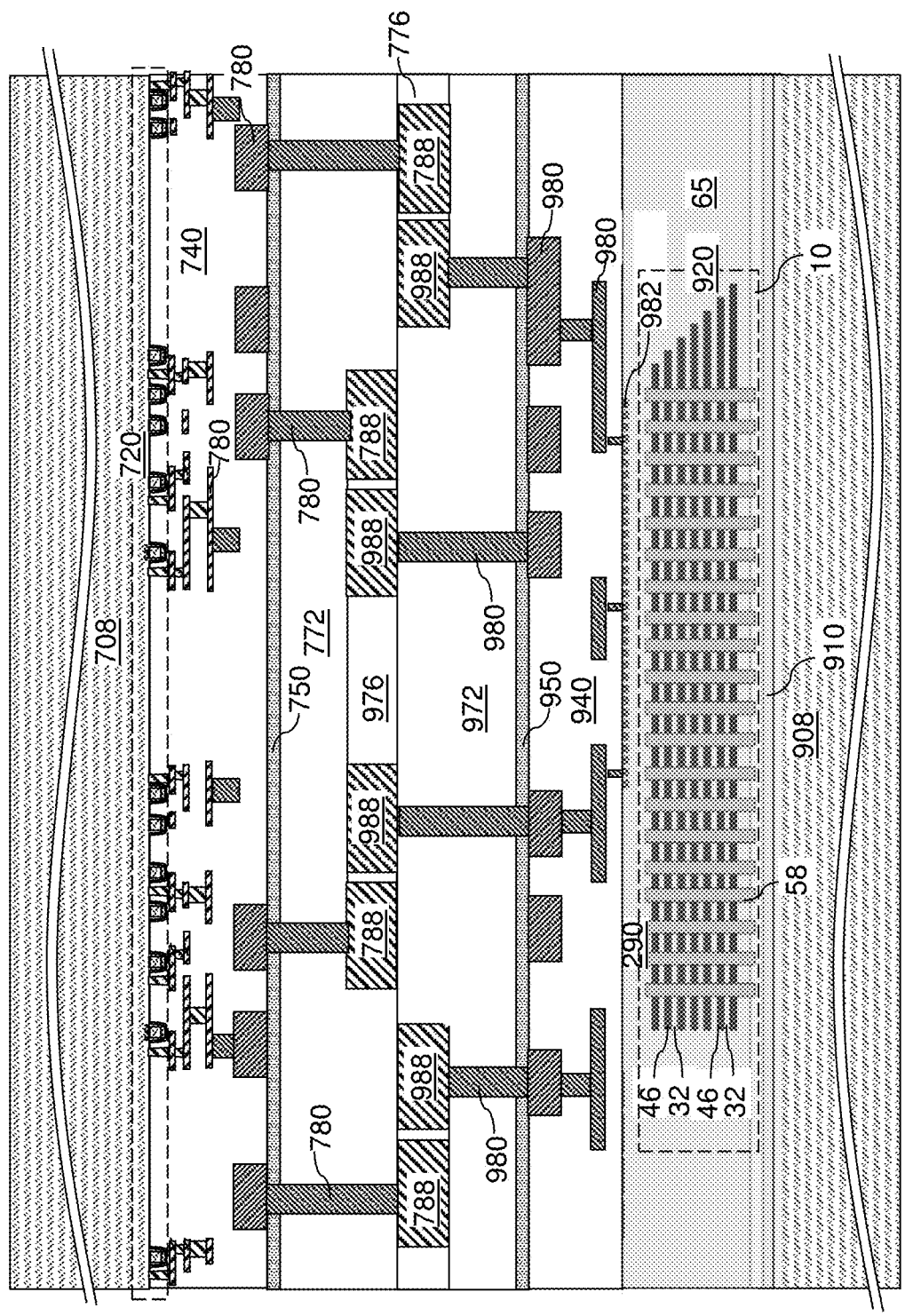

Referring to FIG. 9B, the second semiconductor die 700 and the first semiconductor die 900 are brought into contact such that the first bonding dielectric layers (972, 976) in the first semiconductor die 900 contact the second bonding dielectric layers (772, 776) in the second semiconductor die 700. The first semiconductor die 900 and the second semiconductor die 700 may be laterally aligned such that each second bonding pad 788 has a sidewall that faces a sidewall of a respective one of the first bonding pads 988. The sidewalls of the first bonding pads 988 and the sidewalls of the second bonding pads 788 are positioned such that each pair of a sidewall of a first bonding pad 988 and a sidewall of a second bonding pad 788 to be bonded are laterally spaced from each other by a lateral spacing that is not greater than the sum of the lateral expansion distance of the sidewall of the first bonding pad 988 and the lateral expansion distance of the sidewall of the second bonding pad 788 during a subsequent anneal process to be employed for bonding the first bonding pads 988 to the second bonding pads 788. The lateral expansion distances of sidewalls of the bonding pads (988, 788), i.e., the lateral distance by which the sidewalls of the bonding pads (988, 788) move during an anneal process due to thermal expansion of the metallic material therein, are dependent on the material of the bonding pads (988, 788), and on the geometry and the dimensions of the bonding pads (988, 788). For example, if the lateral expansion distance of the sidewalls of the each bonding pad (988, 788) is in a range from 25 nm to 100 nm, the lateral spacing between each facing pair of a sidewall of a first bonding pad 988 and a sidewall of a second bonding pad 788 can be in a range from 5 nm to 200 nm, such as from 10 nm to 100 nm, and/or from 20 nm to 60 nm.

Figure 9C:
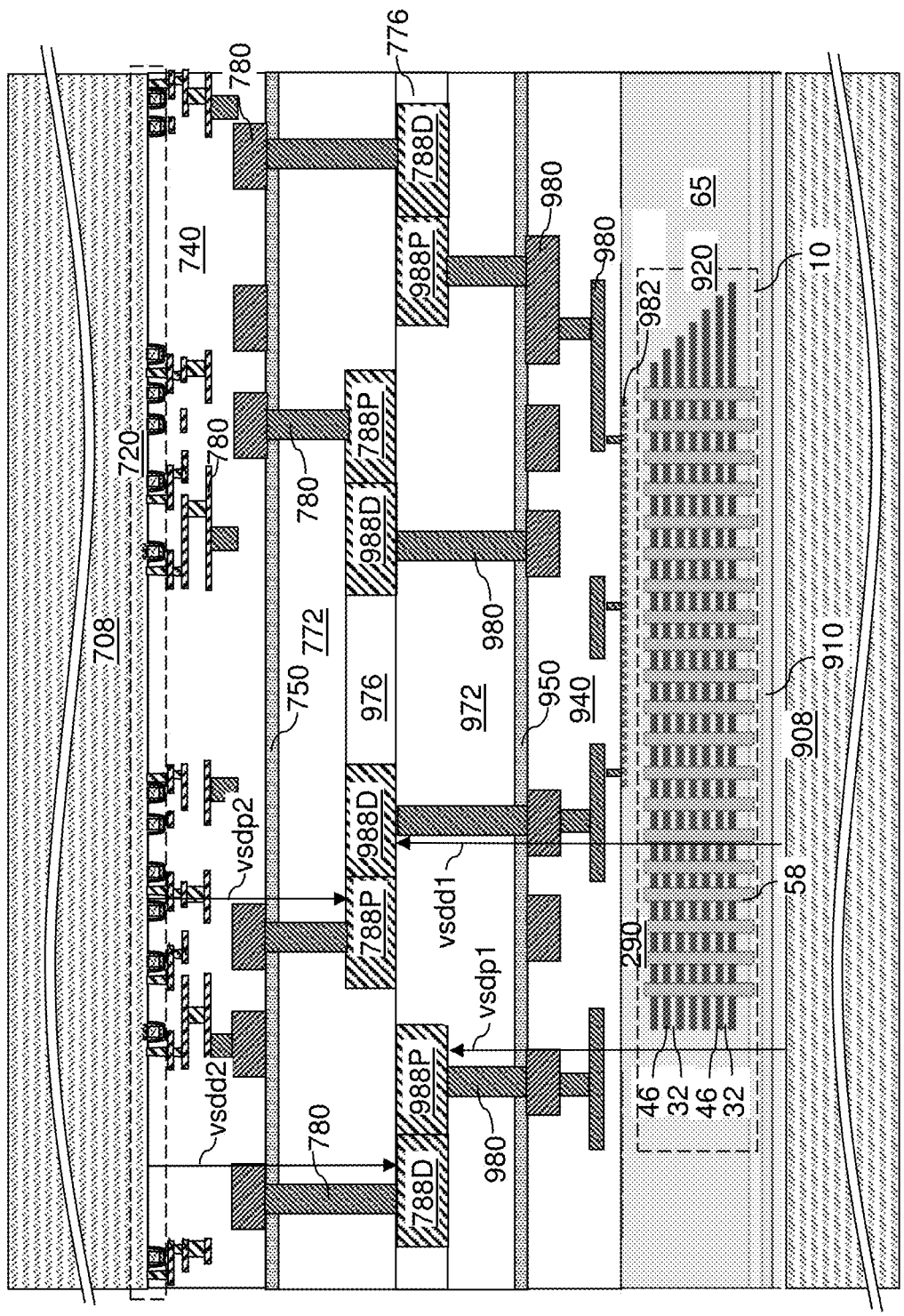

Referring to FIG. 9C, at least one anneal process is performed to induce bonding between the first and the second semiconductor dies. Optionally, dielectric-to-dielectric bonding (e.g., oxide to oxide bonding) between the respective bonding dielectric layers may be performed by annealing the dies at a relatively low temperature, such as 200 degrees Celsius to 300 degrees Celsius. Alternatively, this step may be omitted. Then, an elevated (i.e., higher) temperature anneal is performed to generate metal-to-metal bonding between each mating pair of a first bonding pad 988 and a second bonding pad 788. If the first bonding pads 988 and the second bonding pads 788 include copper, the elevated temperature may be in a range from 300 degrees Celsius to 400 degrees Celsius. The sidewalls of the first bonding pads 988 and the second bonding pads 788 laterally shift outward to contact a respective sidewall of another bonding pad (988, 788). Metal-to-metal bonding is formed between each mating pair of a first bonding pad 988 and a second bonding pad 788 with a bonding interface that is not located within a horizontal plane. In one embodiment, the bonding interfaces between each mating pair of a first bonding pad 988 and a second bonding pad 788 can be vertical. In another embodiment, the bonding interfaces between each mating pair of a first bonding pad 988 and a second bonding pad 788 can have a non-zero taper angle as measured from a vertical direction. The taper angle may be in a range from 0 degrees to 45 degrees, such as from 0 degrees to 10 degrees. Accordingly, the angle between a bonding interface and any horizontal plane can be in a range from 45 degrees to 90 degrees, such as from 80 degrees to 90 degrees. In one embodiment, the metal-to-metal bonding can be copper-to-copper bonding. Each mating pair of a first bonding pad 988 and a second bonding pad 788 remain bonded after the bonding process, i.e., after the anneal process.

In one embodiment, the first proximal bonding pads 988P of the first bonding pads 988 can be embedded in the first proximal bonding dielectric layer 972, and can be vertically spaced from the first substrate 908 by a first proximal vertical separation distance vsdp1. The first distal bonding pads 988D of the first bonding pads 988 can be embedded in the first distal bonding dielectric layer 976, and can be vertically spaced from the first substrate 908 by a first distal vertical separation distance vsdd1. The first distal vertical separation distance vsdd1 is greater than the first proximal vertical separation distance vddp1. In one embodiment, the second proximal bonding pads 788P of the second bonding pads 788 can be embedded in the second proximal bonding dielectric layer 772, and can be vertically spaced from the second substrate 708 by a second proximal vertical separation distance vsdp2. The second distal bonding pads 788D of the second bonding pads 788 can be embedded in the second distal bonding dielectric layer 776, and can be vertically spaced from the second substrate 708 by a second distal vertical separation distance vsdd2. The second distal vertical separation distance vsdd2 is greater than the second proximal vertical separation distance vddp2.

Generally, the second bonding pads 788 can be bonded to a respective one of the first bonding pads 988 at non-horizontal bonding interfaces at which the first sidewalls of the first bonding pads 988 are bonded to a respective one of the second sidewalls of the second bonding pads 788. In one embodiment, the first proximal bonding pads 988P can be bonded to a respective one of the second distal bonding pads 788D, and the first distal bonding pads 988D can be bonded to a respective one of the second proximal bonding pads 788P. In one embodiment, horizontal surfaces of the first proximal bonding pads 988P contact a first horizontal surface of the second proximal bonding dielectric layer 772 that is not vertically recessed, and horizontal surfaces of the first distal bonding pads 988D contact a second horizontal surface of the second proximal bonding dielectric layer 772 that is vertically offset from the first horizontal surface and is vertically recessed toward the second substrate 708.

Figure 10A:
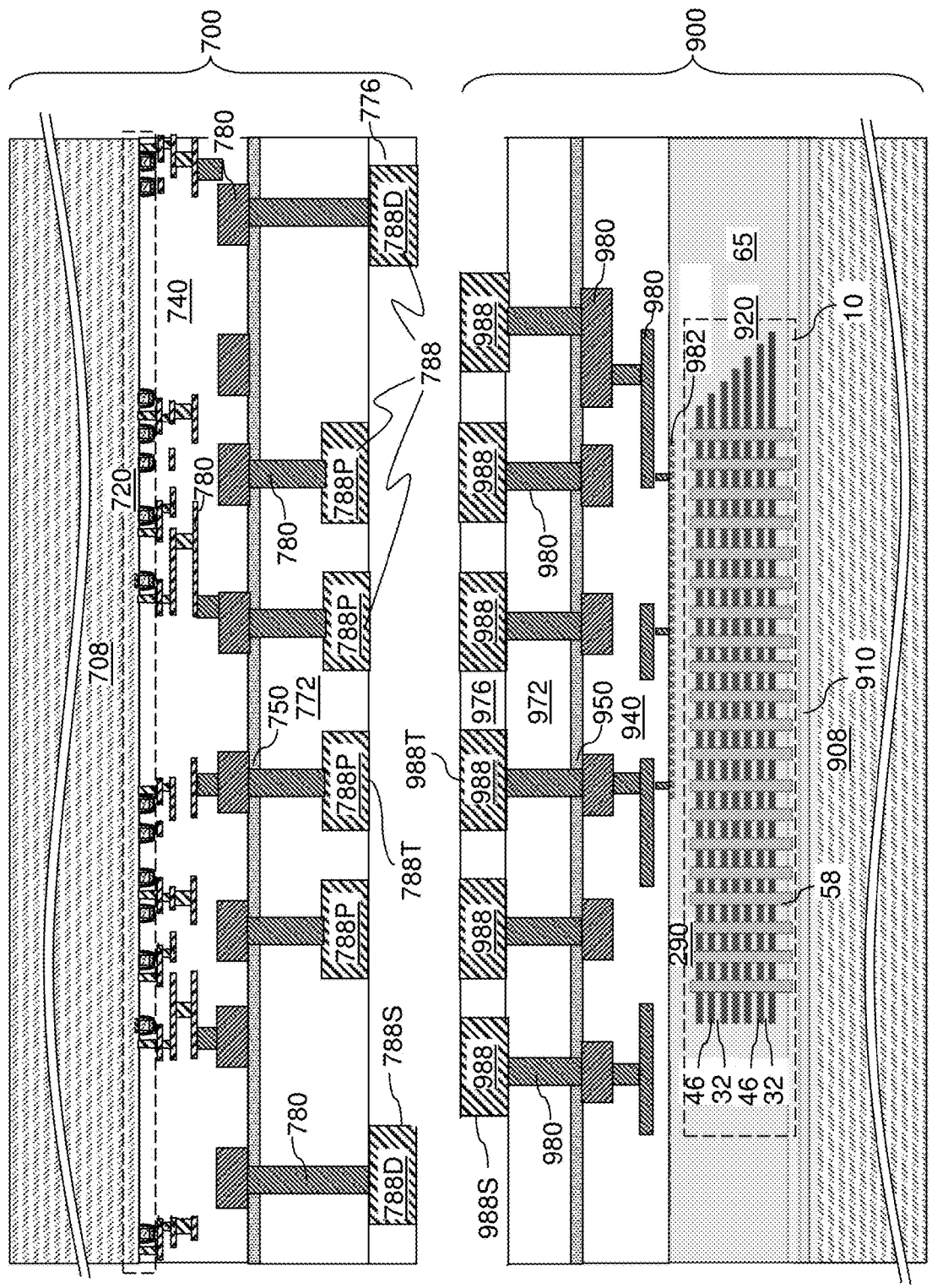
FIGS. 10A-10C are sequential schematic vertical cross-sectional view of a fourth exemplary structure during formation of a bonded assembly according to a fourth embodiment of the present disclosure.

Referring to FIG. 10A, a fourth exemplary structure according to a fourth embodiment of the present disclosure is illustrated, which comprises a first semiconductor die 900 and a second semiconductor die 700. The fourth embodiment differs from the prior embodiments in that both lateral and vertical bonding may be performed between the first and second semiconductor dies.

The first semiconductor die 900 can be derived from the first semiconductor die 900 of FIG. 1A by forming an optional first passivation dielectric layer 950 and a first proximal bonding dielectric layer 972 over the first interconnect-level dielectric layers 940. Via cavities can be formed through the first proximal bonding dielectric layer 972 and the optional first passivation dielectric layer 950. The via cavities can be filled with at least one conductive material to form metal via structures, which are additional first metal interconnect structures 980.

A first distal bonding dielectric layer 976 can be formed over the first proximal bonding dielectric layer 972. Pad cavities are formed in the first distal bonding dielectric layer 976, and are filled with at least one conductive material such as a combination of a metallic nitride liner material (e.g., TiN, TaN, or WN) and a metallic fill material (e.g., copper) to form first bonding pads 988.

A photoresist layer can be applied over the first distal bonding dielectric layer 976, and can be lithographically patterned to cover regions including a respective cluster of first bonding pads 988. The edges of the photoresist layer can coincide with edges of, or overlie, a first subset of the first bonding pads 988 located at a respective peripheral region in each cluster of the first bonding pads 988, and to cover top surfaces of a second subset of the first bonding pads 988 located at a respective center region in each cluster of the first bonding pads 988. An anisotropic etch process can be performed to vertically recess unmasked portions of the first distal bonding dielectric layer 976.

Sidewalls of the first subset of the first bonding pads 988 are physically exposed after the anisotropic etch process. Further, top surfaces of the second subset of the first bonding pads 988 are physically exposed after the anisotropic etch process. The photoresist layer can be subsequently removed, for example, by ashing.

The second semiconductor die 700 can be derived from the second semiconductor die 700 of FIG. 2A by forming pad and via cavities through the second proximal bonding dielectric layer 772 and the optional second passivation dielectric layer 750. The pad and via cavities can be filled with at least one conductive material to form integrated pad and via structures, each of which includes at least one metal via structure and a second proximal bonding pad 788P. Each metal via structure is an additional second metal interconnect structure 780, and each second proximal pad structure 788P is a subset of second bonding pads 788.

Via cavities can be formed through the second proximal bonding dielectric layer 772 and the optional second passivation dielectric layer 750. The via cavities can be filled with at least one conductive material to form metal via structures, which are additional second metal interconnect structures 980.

A second distal bonding dielectric layer 776 can be formed over the second proximal bonding dielectric layer 772. Pad cavities are formed in the second distal bonding dielectric layer 776, and are filled with at least one conductive material such as a combination of a metallic nitride liner material (e.g., TiN, TaN, or WN) and a metallic fill material (e.g., copper) to form second distal bonding pads 788D which are a subset of the second bonding pads 788.

A photoresist layer can be applied over the second distal bonding dielectric layer 776, and can be lithographically patterned to cover regions including the second distal bonding pads 788D without covering the second proximal bonding pads 788P. The edges of the photoresist layer can coincide with edges of, or overlie, the second distal bonding pads 788D. An anisotropic etch process can be performed to vertically recess unmasked portions of the second distal bonding dielectric layer 776.

Sidewalls of the second distal bonding pads 788D are physically exposed after the anisotropic etch process. Further, top surfaces of the second proximal bonding pads 788P are physically exposed after the anisotropic etch process. The photoresist layer can be subsequently removed, for example, by ashing.

The first semiconductor die 900 and the second semiconductor die 700 are oriented such that the first bonding dielectric layers (972, 976) face the second bonding dielectric layers (772, 776). The pattern of the first bonding pads 988 and the pattern of the second bonding pads 788, and the thicknesses of the first bonding dielectric layers (972, 976) in the first semiconductor die 900 and the thicknesses of the second bonding dielectric layers (772, 776) in the second semiconductor die 700 can be selected such that each protruding structure of the first semiconductor die 900 can protrude into a respective recessed region of the second semiconductor die 700, and vice versa.

Figure 10B:
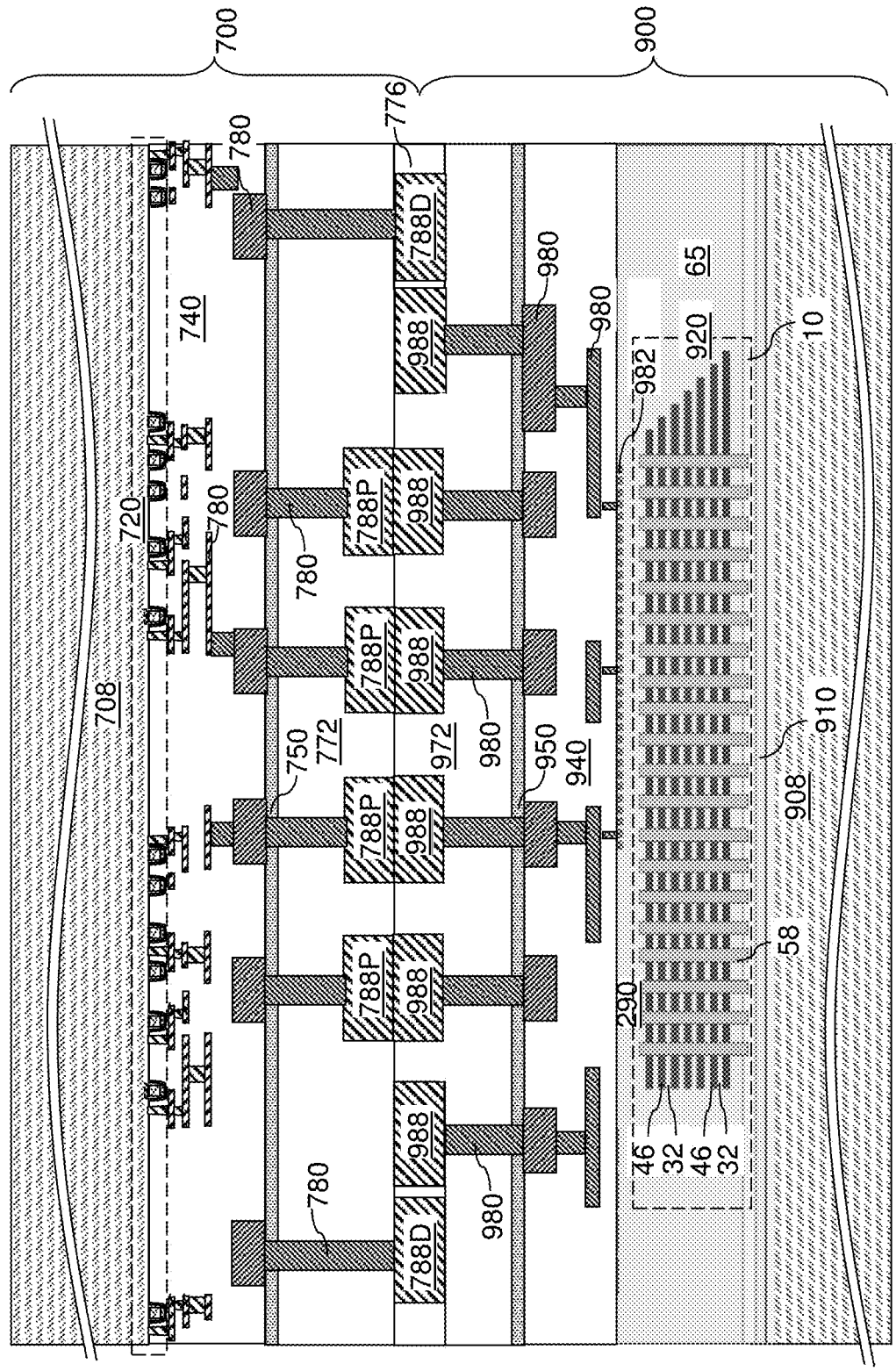

Referring to FIG. 10B, the second semiconductor die 700 and the first semiconductor die 900 are brought into contact such that the first bonding dielectric layers (972, 976) in the first semiconductor die 900 contact the second bonding dielectric layers (772, 776) in the second semiconductor die 700. The first semiconductor die 900 and the second semiconductor die 700 may be laterally aligned such that each second distal bonding pad 788D has a sidewall 788S that faces a sidewall 988S of a respective one of the first subset of the first bonding pads 988, and each second proximal bonding pad 788P has a physically exposed top surface 788T that contacts a physically exposed top surface 988T of a respective one of the second subset of the first bonding pads 988. The sidewalls of the first subset of the first bonding pads 988 and the sidewalls of the second distal bonding pads 788D are positioned such that each pair of a sidewall of the first subset of the first bonding pads 988 and a sidewall of a respective one of the second distal bonding pad 788D to be bonded are laterally spaced from each other by a lateral spacing that is not greater than the sum of the lateral expansion distance of the respective sidewall of the first subset of the first bonding pads 988 and the lateral expansion distance of the respective sidewall of the second bonding pads 788 during a subsequent anneal process to be employed for bonding the first bonding pads 988 to the second bonding pads (788P, 788D). For example, if the lateral expansion distance of the sidewalls of the each bonding pad (988, 788) is in a range from 25 nm to 100 nm, the lateral spacing between each facing pair of a sidewall of the first subset of the first bonding pads 988 and a respective sidewall of the second distal bonding pads 788D can be in a range from 5 nm to 200 nm, such as from 10 nm to 100 nm, and/or from 20 nm to 60 nm. Each mating pair of a second proximal bonding pad 788P and a first bonding pad 988 can contact each other at a horizontal plane that includes an interface between the first proximal bonding dielectric layer 972 and the second proximal bonding dielectric layer 772.

Figure 10C:
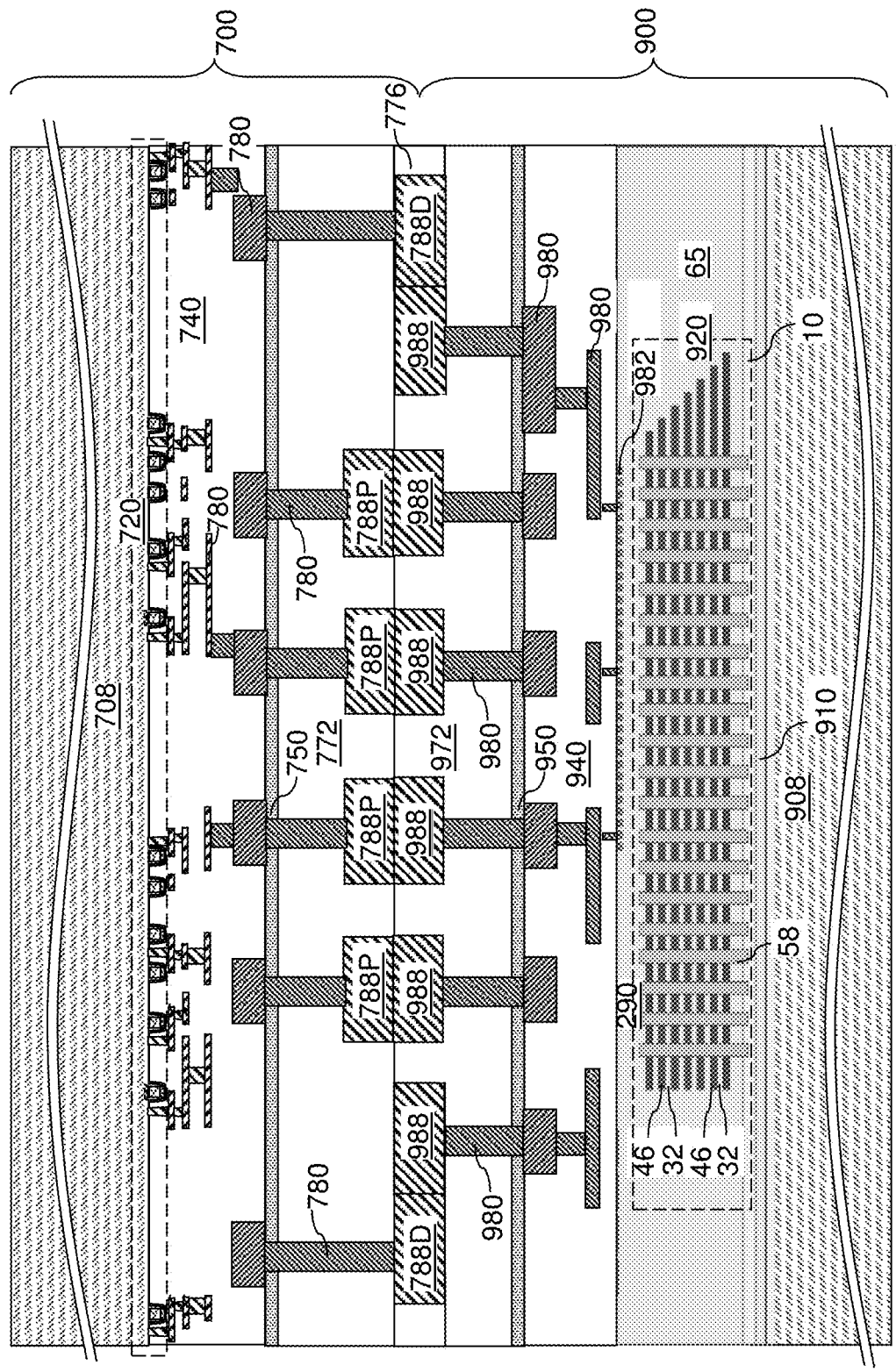

Referring to FIG. 10C, at least one anneal process is performed to induce bonding between the first and the second semiconductor dies. Optionally, dielectric-to-dielectric bonding (e.g., oxide to oxide bonding) between the respective bonding dielectric layers may be performed by annealing the dies at a relatively low temperature, such as 200 degrees Celsius to 300 degrees Celsius. Alternatively, this step may be omitted. Then, an elevated (i.e., higher) temperature anneal is performed to generate metal-to-metal bonding between each mating pair of a first bonding pad 988 and a second bonding pad 788. If the first bonding pads 988 and the second bonding pads 788 include copper, the elevated temperature may be in a range from 300 degrees Celsius to 400 degrees Celsius. The sidewalls of the first bonding pads 988 and the second bonding pads 788 laterally shift outward to contact a respective sidewall of another bonding pad (988, 788). Metal-to-metal bonding is formed between each mating pair of a respective first bonding pad 988 within the first subset of the first bonding pads 988 and a respective one of the second distal bonding pads 788D with a respective bonding interface that is not located within a horizontal plane, which may be vertical or non-vertical. In one embodiment, the bonding interfaces between each mating pair of a respective first bonding pad 988 within the first subset of the first bonding pads 988 and a respective one of the second distal bonding pads 788D can be vertical. In another embodiment, the bonding interfaces between each mating pair of a respective first bonding pad 988 within the first subset of the first bonding pads 988 and a respective one of the second distal bonding pads 788D can have a non-zero taper angle as measured from a vertical direction. The taper angle may be in a range from 0 degrees to 45 degrees, such as from 0 degrees to 10 degrees. Accordingly, the angle between a bonding interface and any horizontal plane can be in a range from 45 degrees to 90 degrees, such as from 80 degrees to 90 degrees.

Metal-to-metal bonding is formed between each mating pair of a respective first bonding pad 988 within the second subset of the first bonding pads 988 and a respective one of the second proximal bonding pads 788P with a respective bonding interface that is located within a horizontal plane, which can be the horizontal plane including the interface between the first proximal bonding layer 972 and the second proximal bonding layer 772. In one embodiment, each metal-to-metal bonding can be copper-to-copper bonding. Each mating pair of a first bonding pad 988 and a second bonding pad 788 remain bonded after the bonding process, i.e., after the anneal process.

Referring to FIG. 11A, a fifth exemplary structure according to a fifth embodiment of the present disclosure is illustrated. In this embodiment, at least one interface between the first and second semiconductor dies may be tapered at an angle that is greater than zero and less than ninety degrees from a horizontal direction (i.e., a non-vertical and non-horizontal interface may be present). The structure of the fifth embodiment includes a first semiconductor die 900 and a plurality of second semiconductor dies 700. The first semiconductor die 900 can have a plurality of recess regions on the side containing first bonding dielectric layers 970, which can include layers such as a first proximal bonding dielectric layer 972, an optional first proximal dielectric cover layer 973, one or more optional first middle bonding dielectric layers 974, one or more optional first middle dielectric cover layer 975, a first distal bonding dielectric layer 976, and an optional first distal dielectric cover layer 977 that are described above. First bonding pads 988 can be formed in more than one of the first bonding dielectric layers 970 over multiple levels. The recess regions can be formed by a masked etch process, which may employ an anisotropic etch process or an isotropic etch process. The recess regions may have tapered or vertical sidewalls at which sidewalls of the first subset of the first bonding pads 988 are physically exposed. Top surfaces of a second subset of the first bonding pads 988 can be physically exposed at the recessed surfaces of the recess regions.

Each second semiconductor die 700 can be formed with a pattern that fits into a respective one of the recess regions in the second semiconductor die 700. Each second semiconductor die 800 can be formed with second bonding dielectric layers 770, which can include layers such as a second proximal bonding dielectric layer 772, an optional second proximal dielectric cover layer 773, one or more optional second middle bonding dielectric layers 774, one or more optional second middle dielectric cover layer 775, a second distal bonding dielectric layer 776, and an optional second distal dielectric cover layer 777 that are described above. Second bonding pads 788 can be formed in more than one of the second bonding dielectric layers 770 over multiple levels. The second bonding dielectric layers 770 can be patterned, for example, by an etch process employing a patterned etch mask layer. The periphery of each second semiconductor die 700 may have tapered or vertical sidewalls at which sidewalls of a first subset of the second bonding pads 788 are physically exposed. Top surfaces of a second subset of the second bonding pads 788 can be physically exposed at the topmost surface of the second bonding dielectric layers 770.

The physically exposed sidewalls of the first bonding pads 988 and the second bonding pads 788 can be tapered or vertical. If tapered, the taper angle of the physically exposed sidewalls of the first bonding pads 988 and the second bonding pads 788 may be in a range between 0 degree and 45 degrees, although a greater taper angle may also be employed. The taper angles of the physically exposed sidewalls of the first bonding pads 988 and the second bonding pads 788 may be tuned by optimizing the etch chemistry that etches the materials of the first bonding dielectric layers 970 and the second bonding dielectric layers 770 and collaterally etches the materials of the first bonding pads 988 and the second bonding pads.

Figure 11B:
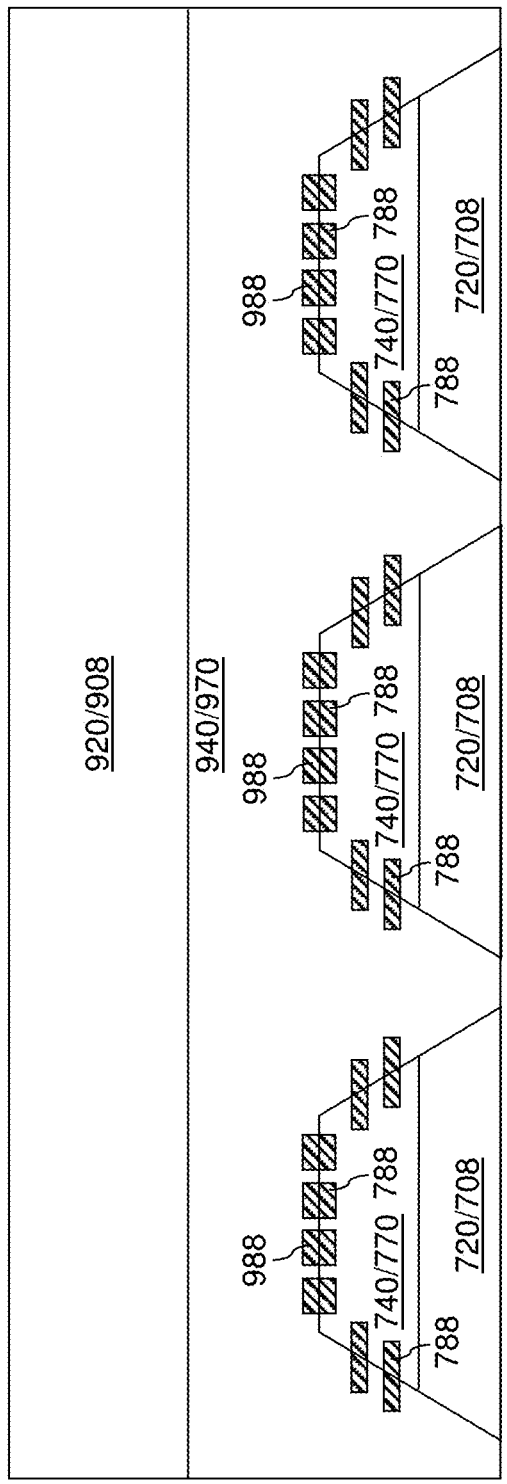

Referring to FIG. 11B, each second semiconductor die 700 can be disposed into a respective recess region in the first semiconductor die 900. Each second semiconductor die 700 can be aligned to the first semiconductor die 900 such that each mating pair of a first bonding pad 988 and a second bonding pad 788 contacts each other, or is disposed in proximity to each other. An anneal process is performed to induce metal-to-metal bonding between each mating pair of a first bonding pad 988 and a second bonding pad 788.

Metal-to-metal bonding is formed between each mating pair of a respective first bonding pad 988 and a respective second bonding pad 788D. If a sidewall of a first bonding pad 988 is bonded to a sidewall of a second bonding pad

788, a resulting non-horizontal bonding interface may be vertical or non-vertical. In one embodiment, the bonding interfaces between a mating pair of a first bonding pad 988 and a second bonding pad 788P can be vertical. In another embodiment, the bonding interfaces between a mating pair of a first bonding pad 988 and a second bonding pad 788D can have a non-zero taper angle as measured from a vertical direction. The taper angle may be in a range from 0 degrees to 45 degrees, such as from 0 degrees to 10 degrees. Accordingly, the angle between a bonding interface and any horizontal plane can be in a range from 45 degrees to 90 degrees, such as from 80 degrees to 90 degrees.

If a horizontal surface of a first bonding pad 988 is bonded to a horizontal surface of a second bonding pad 788, a resulting horizontal bonding interface can be parallel to a top surface of the first semiconductor die 900 and top surfaces of the second semiconductor dies 700 (i.e., major substrate surfaces 908T, 708T). In one embodiment, each metal-to-metal bonding can be copper-to-copper bonding. Each mating pair of a first bonding pad 988 and a second bonding pad 788 remain bonded after the bonding process, i.e., after the anneal process. Thus, the sidewalls 788S of the distal second bonding pads 788D are bonded to sidewalls 988S of the respective first bonding pads 988, while the top surfaces 788T of the proximal second bonding pads 788P are bonded to top surfaces 988T of additional respective first bonding pads 988.

Referring to all drawings and according to various embodiments of the present disclosure, a bonded assembly includes a first semiconductor die 900 comprising first semiconductor devices 920 and first bonding pads 988 having a top surface 988T facing away from the first semiconductor devices 920, a bottom surface 988B facing the first semiconductor devices and at least one sidewall 988S between the top surface and the bottom surface, as shown in FIG. 1I. The bonded assembly also includes a second semiconductor die 700 comprising second semiconductor devices 720 and second bonding pads 788 having a top surface 788T facing away from the second semiconductor devices 720, a bottom surface 788B facing the second semiconductor devices 720 and at least one sidewall 788S between the top surface and the bottom surface, as shown in FIG. 2F. The sidewalls 788S of the second bonding pads 788 are bonded to the respective sidewalls 988S of the first bonding pads 988.

In one embodiment, the first semiconductor die 900 also includes a first substrate 908 having a first major surface 908T, and first metal interconnect structures 980 embedded in first dielectric material layers 940 that laterally extend along horizontal directions parallel to the first major surface 908T. The first bonding pads 988 are electrically connected to a respective node of the first semiconductor devices 920 through a respective subset of the first metal interconnect structures 980. The second semiconductor die 700 also includes a second substrate 708 having a second major surface 708T, and second metal interconnect structures 780 embedded in second dielectric material layers 740 that laterally extend along the horizontal directions parallel to the second major surface 708T. The second bonding pads 788 are electrically connected to a respective node of the second semiconductor devices 720 through a respective subset of the second metal interconnect structures 780. The second bonding pads 788 are bonded to a respective one of the first bonding pads 988 at a respective non-horizontal bonding interface that is at an angle greater than zero degrees relative to a horizontal plane including the horizontal directions.

In one embodiment, non-horizontal bonding interfaces between bonded pairs of a respective first bonding pad 988 and a respective second bonding pad 788 are located at multiple levels having different vertical separation distances (such as a first proximal vertical separation distance the vsdp1, a first middle vertical separation distance vsdm1, and a first distal vertical separation distance vsdd1) from the first substrate.

In one embodiment, the first bonding pads 988 comprise first proximal bonding pads 988P that are vertically spaced from the first substrate 908 by a first proximal vertical separation distance vsdp1 and first distal bonding pads 988D that are vertically spaced from the first substrate 908 by a first distal vertical separation distance vsdd1 that is greater than the first proximal vertical separation distance vsdp1; the second bonding pads 788 comprise second proximal bonding pads 788P that are vertically spaced from the second substrate 708 by a second proximal vertical separation distance vsdp2 and second distal bonding pads 788D that are vertically spaced from the second substrate 708 by a second distal vertical separation distance vsdd2 that is greater than the second proximal vertical separation distance vsdp2; the first proximal bonding pads 988P are bonded to a respective one of the second distal bonding pads 788D; and the first distal bonding pads 988D are bonded to a respective one of the second proximal bonding pads 788P.

In one embodiment, a difference between the first distal vertical separation distance vsdd1 and the first proximal vertical separation distance vsdp1 is at least a thickness of the first proximal bonding pads 988P.

In one embodiment, each of the first bonding pads 988 has a respective distal horizontal surface that faces the second substrate 708 and contacting a horizontal surface of a respective first dielectric cover liner (973, 975, 977); and each of the second bonding pads 788 has a respective distal horizontal surface that faces the first substrate 908 and contacting a horizontal surface of a respective second dielectric cover liner (773, 775, 777).

In one embodiment, one of the first proximal bonding pads 988P has an areal overlap with one of the second bonding pads 788, and is vertical spaced from the one of the second bonding pads 788 by a stack of one of the first dielectric cover liners (973, 975, 977) and one of the second dielectric cover liners (773, 885, 777). In one embodiment, each of the first dielectric cover liners (973, 975, 977) and the second dielectric cover liners (773, 885, 777) has a thickness that is less than one half of a minimum thickness of the first bonding pads 988 and is less than one half of a minimum thickness of the second bonding pads 788.

In one embodiment, each of the first bonding pads 988 is vertically spaced from the second semiconductor die 700 by a vertical separation distance that is the same as a thickness of a respective one of the first dielectric cover liners (973, 975, 977) as illustrated in FIG. 3C.

In one embodiment, the first proximal bonding pads 988P are vertically spaced from the second semiconductor die 700 by a first bonding dielectric layer (such as a first middle bonding dielectric layer 974) that overlies the first proximal boding pads 988P and underlies a subset of the first bonding pads 988 (such as the first distal bonding pads 988D) that are more distal from the first substrate 908 than the first proximal bonding pads 988P are from the first substrate 908 as illustrated in FIG. 6C.

In one embodiment, each of the first dielectric material layers (972, 976) that contact sidewalls of the first bonding pads 988 comprises a horizontal surface that contacts a horizontal surface of a respective one of the second dielectric material layers (772, 776) as illustrated in FIG. 9C.

In one embodiment, the first proximal bonding pads 988P are embedded in a first proximal bonding dielectric layer 972; the first distal bonding pads 988D are embedded in a first distal bonding dielectric layer 976; the second proximal bonding pads 788P are embedded in a second proximal bonding dielectric layer 772 that contacts the first distal bonding dielectric layer 976; and the second distal bonding pads 778D are embedded in a second distal bonding dielectric layer 776 that contacts the first proximal bonding dielectric layer 972 as illustrated in FIG. 9C.

In one embodiment, each bonded pair of a respective first bonding pad 988 and a respective second bonding pad 788 is bonded to each other by metal-to-metal bonding. Additional first bonding pads 988 embedded in a first bonding dielectric layer (972, 974, 976, 970) can be located within the first semiconductor die 900. Additional second bonding pads 788 embedded in a second bonding dielectric layer (772, 774, 776, 770) can be located within the second semiconductor die 700, and can be bonded to a respective one of the additional first bonding pads 988 at a respective horizontal bonding interface including the horizontal directions as illustrated in FIGS. 10C and 11B.

In the fourth and fifth embodiments, the sidewalls 788S of a first set of second bonding pads 788 are bonded to sidewalls 988S of the respective first bonding pads 988, and the top surfaces 788T of the second set of second bonding pads 788 are bonded to top surfaces 988T of additional respective first bonding pads 988. Thus, the second bonding pads 788 are bonded to the respective first bonding pads in three dimensions (i.e., along x, y and z directions).

In one embodiment, the first semiconductor devices 920 comprise three-dimensional memory devices, such as three-dimensional NAND memory devices, and the second semiconductor devices 720 comprise driver circuit devices for the three-dimensional memory devices 920.

The various embodiments of the present disclosure can provide reliable metal bonding employing non-horizontal bonding interfaces. The total number of bonded structures and/or the total area of bonding interfaces can be increased over prior art structures by employing non-horizontal (i.e., lateral) bonding interfaces. The non-horizontal bonding interfaces of embodiments of the present disclosure can be employed in conjunction with horizontal bonding interfaces to provide enhanced bonding between two semiconductor dies or between three or more semiconductor dies.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
a first semiconductor die comprising first semiconductor devices and first bonding pads having a top surface facing away from the first semiconductor devices, a bottom surface facing the first semiconductor devices and at least one sidewall between the top surface and the bottom surface; and
a second semiconductor die comprising second semiconductor devices and second bonding pads having a top surface facing away from the second semiconductor devices, a bottom surface facing the second semiconductor devices and at least one sidewall between the top surface and the bottom surface;
wherein the sidewalls of the second bonding pads are bonded to the respective sidewalls of the first bonding pads.

2. The bonded assembly of claim 1, wherein:
the first semiconductor die further comprises a first substrate having a first major surface, and first metal interconnect structures embedded in first dielectric material layers that laterally extend along horizontal directions parallel to the first major surface, wherein the first bonding pads are electrically connected to a respective node of the first semiconductor devices through a respective subset of the first metal interconnect structures;
the second semiconductor die further comprises a second substrate having a second major surface, and second metal interconnect structures embedded in second dielectric material layers that laterally extend along the horizontal directions parallel to the second major surface, wherein the second bonding pads are electrically connected to a respective node of the second semiconductor devices through a respective subset of the second metal interconnect structures; and
the second bonding pads are bonded to a respective one of the first bonding pads at a respective non-horizontal bonding interface that is at an angle greater than zero degrees relative to a horizontal plane including the horizontal directions.

3. The bonded assembly of claim 2, wherein:
non-horizontal bonding interfaces between bonded pairs of a respective first bonding pad and a respective second bonding pad are located at multiple levels having different vertical separation distances from the first substrate;
the first bonding pads comprise first proximal bonding pads that are vertically spaced from the first substrate by a first proximal vertical separation distance and first distal bonding pads that are vertically spaced from the first substrate by a first distal vertical separation distance that is greater than the first proximal vertical separation distance;
the second bonding pads comprise second proximal bonding pads that are vertically spaced from the second substrate by a second proximal vertical separation distance and second distal bonding pads that are vertically spaced from the second substrate by a second distal vertical separation distance that is greater than the second proximal vertical separation distance;
the first proximal bonding pads are bonded to a respective one of the second distal bonding pads; and
the first distal bonding pads are bonded to a respective one of the second proximal bonding pads.

4. The bonded assembly of claim 3, wherein a difference between the first distal vertical separation distance and the first proximal vertical separation distance is at least a thickness of the first proximal bonding pads.

5. The bonded assembly of claim 3, wherein:
each of the first bonding pads has a respective distal horizontal surface that faces the second substrate and contacting a horizontal surface of a respective first dielectric cover liner; and
each of the second bonding pads has a respective distal horizontal surface that faces the first substrate and contacting a horizontal surface of a respective second dielectric cover liner.

6. The bonded assembly of claim 5, wherein one of the first proximal bonding pads has an areal overlap with one of the second bonding pads, and is vertical spaced from the one of the second bonding pads by a stack of one of the first dielectric cover liners and one of the second dielectric cover liners.

7. The bonded assembly of claim 5, wherein each of the first dielectric cover liners and the second dielectric cover liners has a thickness that is less than one half of a minimum thickness of the first bonding pads and is less than one half of a minimum thickness of the second bonding pads.

8. The bonded assembly of claim 5, wherein:
each of the first bonding pads is vertically spaced from the second semiconductor die by a vertical separation distance that is the same as a thickness of a respective one of the first dielectric cover liners; and
the first proximal bonding pads are vertically spaced from the second semiconductor die by a first bonding dielectric layer that overlies the first proximal boding pads and underlies a subset of the first bonding pads that are more distal from the first substrate than the first proximal bonding pads are from the first substrate.

9. The bonded assembly of claim 3, wherein each of the first dielectric material layers that contacts sidewalls of the first bonding pads comprises a horizontal surface that contacts a horizontal surface of a respective one of the second dielectric material layers.

10. The bonded assembly of claim 3, wherein:
the first proximal bonding pads are embedded in a first proximal bonding dielectric layer;
the first distal bonding pads are embedded in a first distal bonding dielectric layer;
the second proximal bonding pads are embedded in a second proximal bonding dielectric layer that contacts the first distal bonding dielectric layer; and
the second distal bonding pads are embedded in a second distal bonding dielectric layer that contacts the first proximal bonding dielectric layer.

11. The bonded assembly of claim 1, wherein the sidewalls of a first set of second bonding pads are bonded to sidewalls of the respective first bonding pads, and the top surfaces of a second set of second bonding pads are bonded to top surfaces of additional respective first bonding pads, such that the second bonding pads are bonded to the respective first bonding pads in three dimensions.

12. The bonded assembly of claim 1, wherein the first semiconductor devices comprise three-dimensional memory devices, and the second semiconductor devices comprise driver circuit devices for the three-dimensional memory devices.

13. A method of forming a bonded assembly, comprising:
providing a first semiconductor die comprising first semiconductor devices and first bonding pads having a top surface facing away from the first semiconductor devices, a bottom surface facing the first semiconductor devices and at least one exposed sidewall between the top surface and the bottom surface;
a second semiconductor die comprising second semiconductor devices and second bonding pads having a top surface facing away from the second semiconductor devices, a bottom surface facing the second semiconductor devices and at least one exposed sidewall between the top surface and the bottom surface; and
bonding the exposed sidewalls of the second bonding pads to the respective exposed sidewalls of the first bonding pads.

14. The method of claim 13, wherein:
the first semiconductor die further comprises a first substrate having a first major surface, and first metal interconnect structures embedded in first dielectric material layers that laterally extend along horizontal directions parallel to the first major surface, wherein the first bonding pads are electrically connected to a respective node of the first semiconductor devices through a respective subset of the first metal interconnect structures;
the second semiconductor die further comprises a second substrate having a second major surface, and second metal interconnect structures embedded in second dielectric material layers that laterally extend along the horizontal directions parallel to the second major surface, wherein the second bonding pads are electrically connected to a respective node of the second semiconductor devices through a respective subset of the second metal interconnect structures; and
the second bonding pads are bonded to a respective one of the first bonding pads at a respective non-horizontal bonding interface that is at an angle greater than zero degrees relative to a horizontal plane including the horizontal directions.

15. The method of claim 14, wherein:
the first bonding pads are formed at multiple levels having different vertical separation distances from the first substrate; and
the second bonding pads are formed at multiple levels having different vertical separation distances from the second substrate.

16. The method of claim 14, further comprising:
forming first proximal bonding pads embedded in a first proximal bonding dielectric layer over the first dielectric material layers;
forming first distal bonding pads embedded in a first distal bonding dielectric layer that overlies the first proximal bonding dielectric layer and the first proximal bonding pads, wherein the first bonding pads comprise the first proximal bonding pads and the first distal bonding pads;
physically exposing sidewalls of the first distal bonding pads by patterning the first distal bonding dielectric layer; and
physically exposing sidewalls of the first proximal bonding pads by patterning the first proximal bonding dielectric layer.

17. The method of claim 16, further comprising:
forming second proximal bonding pads embedded in a second proximal bonding dielectric layer over the second dielectric material layers;
forming second distal bonding pads embedded in a second distal bonding dielectric layer that overlies the second proximal bonding dielectric layer, wherein the second bonding pads comprise the second proximal bonding pads and the second distal bonding pads;

physically exposing sidewalls of the second distal bonding pads by patterning the second distal bonding dielectric layer; and physically exposing sidewalls of the second proximal bonding pads by patterning the second proximal bonding dielectric layer, the first proximal bonding pads are bonded to a respective one of the second distal bonding pads; and the first distal bonding pads are bonded to a respective one of the second proximal bonding pads.

18. The method of claim 16, further comprising:

forming a first proximal dielectric cover liner on a top surface of the first proximal bonding dielectric layer and on the first proximal bonding pads, wherein the first distal bonding dielectric layer and the first distal bonding pads are formed over the first proximal cover layer; and forming a first distal dielectric cover liner on a top surface of the first distal bonding dielectric layer and on the first distal bonding pads;

wherein:

the first proximal bonding pads are vertically spaced from the second substrate by the first proximal dielectric cover liner; and the first distal bonding pads are vertically spaced from the second substrate by the first distal dielectric cover liner.

19. The method of claim 18, further comprising:

forming a first intermediate bonding dielectric layer over the first proximal dielectric cover liner, wherein the first distal bonding dielectric layer is formed over the first intermediate bonding dielectric layer;

patterning the first intermediate bonding dielectric layer such that a remaining portion of the first intermediate bonding dielectric layer overlies one of the first proximal bonding pads, wherein the one of the first proximal bonding pads is vertically spaced from the second semiconductor die by the remaining portion of the first intermediate bonding dielectric layer after the second bonding pads are bonded to the first bonding pads.

20. The method of claim 16, wherein:

horizontal surfaces of the first proximal bonding pads contact a first horizontal surface of the second proximal bonding dielectric layer; and horizontal surfaces of the first distal bonding pads contact a second horizontal surface of the second proximal bonding dielectric layer that is vertically offset from the first horizontal surface.

* * * * *